United States Patent
Kang et al.

(10) Patent No.: US 10,153,284 B2
(45) Date of Patent: Dec. 11, 2018

(54) SEMICONDUCTOR DEVICE HAVING BURIED GATE STRUCTURE AND METHOD FOR MANUFACTURING THE SAME, MEMORY CELL HAVING THE SAME AND ELECTRONIC DEVICE HAVING THE SAME

(71) Applicant: SK hynix Inc., Gyeonggi-do (KR)

(72) Inventors: Dong-Kyun Kang, Gyeonggi-do (KR); Ho-Jin Cho, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 16/021,959

(22) Filed: Jun. 28, 2018

(65) Prior Publication Data

US 2018/0308850 A1    Oct. 25, 2018

Related U.S. Application Data

(60) Continuation of application No. 15/914,599, filed on Mar. 7, 2018, now Pat. No. 10,037,997, which is a
(Continued)

(30) Foreign Application Priority Data

Apr. 22, 2015   (KR) .................. 10-2015-0056595

(51) Int. Cl.
| | |
|---|---|
| *H01L 27/108* | (2006.01) |
| *H01L 21/8234* | (2006.01) |
| *H01L 29/51* | (2006.01) |
| *H01L 29/66* | (2006.01) |
| *H01L 29/49* | (2006.01) |

(Continued)

(52) U.S. Cl.
CPC .. *H01L 27/10823* (2013.01); *H01L 21/02164* (2013.01); *H01L 21/823418* (2013.01); *H01L 27/10814* (2013.01); *H01L 27/10876* (2013.01); *H01L 27/10891* (2013.01); *H01L 29/41783* (2013.01); *H01L 29/4236* (2013.01); *H01L 29/4958* (2013.01); *H01L 29/4966* (2013.01); *H01L 29/511* (2013.01); *H01L 29/513* (2013.01); *H01L 29/517* (2013.01); *H01L 29/66621* (2013.01); *H01L 29/66628* (2013.01); *H01L 21/02175* (2013.01);
(Continued)

(58) Field of Classification Search
None
See application file for complete search history.

(56) References Cited

U.S. PATENT DOCUMENTS 8,901,630 B2 * 12/2014 Huh ............... H01L 29/7827
257/296
9,306,022 B1 * 4/2016 Oh .................. H01L 29/4941
(Continued)

*Primary Examiner* — Telly Green
(74) *Attorney, Agent, or Firm* — IP & T Group LLP

(57) ABSTRACT

A semiconductor device includes a substrate comprising a trench; a gate dielectric layer formed over a surface of the trench; a gate electrode positioned at a level lower than a top surface of the substrate, and comprising a lower buried portion embedded in a lower portion of the trench over the gate dielectric layer and an upper buried portion positioned over the lower buried portion; and a dielectric work function adjusting liner positioned between the lower buried portion and the gate dielectric layer; and a dipole formed between the dielectric work function adjusting liner and the gate dielectric layer.

10 Claims, 23 Drawing Sheets

Related U.S. Application Data continuation of application No. 15/456,119, filed on Mar. 10, 2017, now Pat. No. 9,947,667, which is a division of application No. 14/937,056, filed on Nov. 10, 2015, now Pat. No. 9,634,011.

(51) Int. Cl.
*H01L 29/417* (2006.01)
*H01L 21/02* (2006.01)
*H01L 29/423* (2006.01)

(52) U.S. Cl.
CPC .. *H01L 21/02178* (2013.01); *H01L 21/02181* (2013.01); *H01L 21/02186* (2013.01); *H01L 21/02189* (2013.01)

(56) References Cited

U.S. PATENT DOCUMENTS

| | | | |
|---|---|---|---|
| 9,704,988 B2 * | 7/2017 | Oh | H01L 29/7827 |
| 2015/0214313 A1 * | 7/2015 | Oh | H01L 27/10876 257/2 |
| 2015/0214362 A1 * | 7/2015 | Oh | H01L 29/7827 257/330 |
| 2015/0349073 A1 * | 12/2015 | Kang | H01L 29/4236 257/330 |
| 2016/0172488 A1 * | 6/2016 | Oh | H01L 29/7827 257/330 |

* cited by examiner

SEMICONDUCTOR DEVICE HAVING BURIED GATE STRUCTURE AND METHOD FOR MANUFACTURING THE SAME, MEMORY CELL HAVING THE SAME AND ELECTRONIC DEVICE HAVING THE SAME

CROSS-REFERENCE TO RELATED APPLICATIONS

This application is a continuation of U.S. patent application Ser. No. 15/914,599 filed on Mar. 7, 2018, titled "SEMICONDUCTOR DEVICE HAVING BURIED GATE STRUCTURE AND METHOD FOR MANUFACTURING THE SAME, MEMORY CELL HAVING THE SAME AND ELECTRONIC DEVICE HAVING THE SAME", which is a continuation of U.S. patent application Ser. No. 15/456,119 filed on Mar. 10, 2017, and now U.S. Pat. No. 9,947,667 issued on Apr. 17, 2018, which is a division of U.S. patent application Ser. No. 14/937,056 filed on Nov. 10, 2015, and now U.S. Pat. No. 9,634,011 issued on Apr. 25, 2017, which claims priority of Korean Patent Application No. 10-2015-0056595, filed on Apr. 22, 2015. The disclosure of each of the foregoing applications is incorporated herein by reference in its entirety.

BACKGROUND

1. Field

Exemplary embodiments of the present invention relate to a semiconductor device, and more particularly, to a semiconductor device having a buried metal gate structure, a method for manufacturing the same, a memory cell having the same, and an electronic device having the same.

2. Description of the Related Art

A metal gate electrode is used to improve transistor performance. In particular, in a buried gate type transistor, adjusting the threshold voltage is required to carry out high performance operations. Moreover, gate induced drain leakage (GIDL) exerts a substantial influence on the performance of the buried gate type transistor.

SUMMARY

An embodiment of the present invention is directed to a buried gate structure capable of shifting a threshold voltage and a method for manufacturing the same.

Another embodiment of the present invention is directed to a semiconductor device capable of improving gate induced drain leakage (GIDL) and a method for manufacturing the same.

Still another embodiment of the present invention is directed to a memory cell capable of improving refresh characteristics.

Yet another embodiment of the present invention is directed to an electronic device with improved performance.

In accordance with an embodiment of the present invention, a semiconductor device may include a substrate comprising a trench; a gate dielectric layer formed over a surface of the trench; a gate electrode positioned at a level lower than a top surface of the substrate, and comprising a lower buried portion embedded in a lower portion of the trench over the gate dielectric layer and an upper buried portion positioned over the lower buried portion; a dielectric work function adjusting liner positioned between the lower buried portion and the gate dielectric layer; and a dipole formed between the dielectric work function adjusting liner and the gate dielectric layer. The upper buried portion has a first work function, and the dipole formed by the dielectric work function adjusting liner induces a second work function higher than the first work function. The lower buried portion has a first high work function higher than that of the upper buried portion, and the dipole formed by the dielectric work function adjusting liner induces a second high work function higher than the first high work function. The upper buried portion may include N-type impurity-doped polysilicon. The dielectric work function adjusting liner may include a high oxygen containing-metal oxide which has oxygen content per unit volume greater than that of the gate dielectric layer. The gate dielectric layer may include silicon oxide ($SiO_2$), and the work function adjusting liner may include one or more of aluminum oxide ($Al2O_3$), titanium oxide ($TiO_2$), hafnium oxide ($HfO_2$), zirconium oxide ($ZrO_2$) and magnesium oxide (MgO). The lower buried portion may include a material which has a resistivity lower than that of the upper buried portion. The lower buried portion may include one or more of a metal material which is non-reactive with the upper buried portion and a metal material which is reactive with the upper buried portion. The semiconductor device may further include an intermediate barrier between the lower buried portion and the upper buried portion, wherein the lower buried portion may include a metal material which is reactive with the upper buried portion. The semiconductor device may further include an intermediate barrier between the lower buried portion and the upper buried portion; and a lower barrier between the lower buried portion and the dielectric work function adjusting liner, wherein the lower buried portion may include a metal material that is reactive with the upper buried portion and does not contain fluorine. The semiconductor device may further include a fin formed in the substrate under the lower buried portion, with the gate dielectric layer interposed therebetween. The semiconductor device may further include a first impurity region and a second impurity region formed in the substrate on both sides of the gate electrode, wherein the first impurity region and the second impurity region have a depth overlapping the upper buried portion.

In accordance with another embodiment of the present invention, a semiconductor device may include a substrate comprising a trench; a gate dielectric layer formed over a surface of the trench; a gate electrode positioned at a level lower than a top surface of the substrate, and including a lower buried portion embedded in a lower portion of the trench over the gate dielectric layer and an upper buried portion positioned over the lower buried portion; a dielectric work function adjusting liner positioned between the lower buried portion and the gate dielectric layer; a conductive work function liner positioned between the upper buried portion and the gate dielectric layer; and a dipole formed between the dielectric work function adjusting liner and the gate dielectric layer. The work function liner has a first work function, and wherein the dipole formed by the dielectric work function adjusting liner induces a second work function higher than the first work function. The lower buried portion has a first high work function higher than that of the work function liner, and wherein the dipole formed by the dielectric work function adjusting liner induces a second high work function higher than the first high work function. The dielectric work function adjusting liner may include a high oxygen containing-metal oxide which has oxygen content per unit volume greater than that of the gate dielectric layer. The gate dielectric layer may include silicon oxide ($SiO_2$), and wherein the dielectric work function adjusting liner may include aluminum oxide ($Al_2O_3$). The gate dielectric layer may include silicon oxide ($SiO_2$), and wherein the dielectric work function adjusting liner may include one or more of titanium oxide ($TiO_2$), hafnium oxide ($HfO_2$), zirconium oxide ($ZrO_2$) and magnesium oxide (MgO). The work function liner may include N-type doped polysilicon. The lower buried portion and the upper buried portion may include a material which has a resistivity lower than that of the work function liner. The semiconductor device may further include an upper barrier between the upper buried portion and the work function liner; and a lower barrier between the lower buried portion and the dielectric work function adjusting liner, wherein the upper barrier extends between the lower buried portion and the upper buried portion. The semiconductor device may further include a lower barrier between the lower buried portion and the dielectric work function adjusting liner, wherein the lower buried portion does not contact the work function liner by the lower barrier. The semiconductor device may further include an upper barrier between the upper buried portion and the work function liner, wherein the lower buried portion is formed of a metal material which is non-reactive with the work function liner. The semiconductor device may further include a fin formed in the substrate under the lower buried portion, with the gate dielectric layer interposed therebetween. The work function liner extends between the lower buried portion and the upper buried portion. The semiconductor device may further include an intermediate barrier between the work function liner and the lower buried portion. The semiconductor device may further include an upper barrier between the upper buried portion and the work function liner. The semiconductor device may further include a lower barrier between the lower buried portion and the dielectric work function adjusting liner. The semiconductor device may further include a first impurity region and a second impurity region formed in the substrate on both sides of the gate electrode, wherein the first impurity region and the second impurity region have a depth overlapping the work function liner. The semiconductor device may further include a fin formed in the substrate under the lower buried portion, with the gate dielectric layer interposed therebetween.

In accordance with yet another embodiment of the present invention, a semiconductor device may include a substrate comprising a trench; a gate dielectric layer formed over a surface of the trench; a gate electrode positioned at a level lower than a top surface of the substrate, and including a lower buried portion embedded in a lower portion of the trench over the gate dielectric layer and an upper buried portion positioned over the lower buried portion; a first dielectric work function adjusting liner positioned between the lower buried portion and the gate dielectric layer; a second dielectric work function adjusting liner positioned between the upper buried portion and the gate dielectric layer; a first dipole formed between the first dielectric work function adjusting liner and the gate dielectric layer; and a second dipole formed between the second dielectric work function adjusting liner and the gate dielectric layer. The first dipole may include a dipole in a direction in which a high work function is induced, and wherein the first dielectric work function adjusting liner has oxygen content different from that of the gate dielectric layer thereby forming the first dipole. The second dipole may include a dipole in a direction in which a low work function is induced, and wherein the second dielectric work function adjusting liner has oxygen content different from that of the gate dielectric layer thereby forming the second dipole. The first dielectric work function adjusting liner may include a high oxygen containing-metal oxide which has oxygen content per unit volume greater than that of the gate dielectric layer. The gate dielectric layer may include silicon oxide ($SiO_2$), and the first dielectric work function adjusting liner may include one or more of aluminum oxide ($Al_2O_3$), titanium oxide ($TiO_2$), hafnium oxide ($HfO_2$), zirconium oxide ($ZrO_2$) and magnesium oxide (MgO). The second dielectric work function adjusting liner may include a low oxygen containing-metal oxide which has oxygen content per unit volume lower than that of the gate dielectric layer. The gate dielectric layer may include silicon oxide ($SiO_2$), and The second work function adjusting liner may include one or more of yttrium oxide ($Y_2O_3$), lanthanum oxide ($La_2O_3$), germanium oxide ($GeO_2$), lutetium oxide ($Lu_2O_3$) and strontium oxide (SrO). The semiconductor device may further include a first impurity region and a second impurity region formed in the substrate on both sides of the gate electrode, wherein the first impurity region and the second impurity region have a depth overlapping the second dielectric work function adjusting liner. The semiconductor device may further include a fin formed in the substrate under the lower buried portion, with the gate dielectric layer interposed therebetween.

In accordance with yet another embodiment of the present invention, a semiconductor device may include a substrate comprising a trench; a gate dielectric layer formed over a surface of the trench; a single gate electrode positioned at a level lower than a top surface of the substrate, and embedded in the trench over the gate dielectric layer; a dielectric work function adjusting liner positioned at a first interface between the single gate electrode and the gate dielectric layer, and forming a dipole inducing a high work function at the first interface; and a conductive low work function liner positioned at a second interface between the single gate electrode and the gate dielectric layer; and a dipole formed between the dielectric work function adjusting liner and the gate dielectric layer, wherein the second interface is adjacent to a top portion of the trench, and wherein the first interface is at a level lower than the second interface, and adjacent to a lower portion and a bottom portion of the trench. The dielectric work function adjusting liner may include a high oxygen containing-metal oxide which has oxygen content per unit volume greater than that of the gate dielectric layer. The the gate dielectric layer may include silicon oxide ($SiO_2$), and wherein the dielectric work function adjusting liner may include one or more of aluminum oxide ($Al_2O_3$), titanium oxide ($TiO_2$), hafnium oxide ($HfO_2$), zirconium oxide ($ZrO_2$) and magnesium oxide (MgO). The conductive low work function liner may include N-type doped polysilicon. The semiconductor device may further include a first impurity region and a second impurity region formed in the substrate on both sides of the single gate electrode, wherein the first impurity region and the second impurity region have a depth overlapping the conductive low work function liner. The semiconductor device may further include a fin formed in the substrate under the single gate electrode, with the gate dielectric layer interposed therebetween.

In accordance with another embodiment of the present invention, a semiconductor device may include a substrate comprising a trench; a gate dielectric layer formed over a surface of the trench; a single gate electrode positioned at a level lower than a top surface of the substrate, and embedded in the trench over the gate dielectric layer; a first dielectric work function adjusting liner positioned at a first interface between the single gate electrode and the gate dielectric layer; a second dielectric work function adjusting liner positioned at a second interface between the single gate electrode and the gate dielectric layer; a first dipole inducing a high work function at the first interface; and a second dipole inducing a low work function at the second interface, wherein the second interface is adjacent to a top portion of the trench, wherein the first interface is at a level lower than the second interface and adjacent to a lower portion and a bottom portion of the trench. The first dielectric work function adjusting liner may include a high oxygen containing-metal oxide which has oxygen content per unit volume greater than that of the gate dielectric layer. The gate dielectric layer may include silicon oxide ($SiO_2$), and wherein the first dielectric work function adjusting liner may include one or more of aluminum oxide ($Al_2O_3$), titanium oxide ($TiO_2$), hafnium oxide ($HfO_2$), zirconium oxide ($ZrO_2$) and magnesium oxide (MgO). The second dielectric work function adjusting liner may include a low oxygen containing-metal oxide which has oxygen content per unit volume lower than that of the gate dielectric layer. The gate dielectric layer may include comprises silicon oxide ($SiO_2$), and wherein the second dielectric work function adjusting liner comprises one or more of yttrium oxide ($Y_2O_3$), lanthanum oxide ($La_2O_3$), germanium oxide ($GeO_2$), lutetium oxide ($Lu_2O_3$) and strontium oxide (SrO). The semiconductor device may further include a first impurity region and a second impurity region which are formed in the substrate on both sides of the single gate electrode, wherein the first impurity region and the second impurity region have a depth overlapping the second dielectric work function adjusting liner. The semiconductor device may further include a fin formed in the substrate under the single gate electrode, with the gate dielectric layer interposed therebetween.

In accordance with still yet another embodiment of the present invention, a method for manufacturing a semiconductor device may include forming a trench in a substrate; forming a buried gate structure, which is embedded in the trench and comprises a gate dielectric layer, a gate electrode over the gate dielectric layer and a capping layer over the gate electrode; and forming a first impurity region and a second impurity region in the substrate on both sides of the buried gate structure, wherein the forming of the buried gate structure may include forming a dielectric work function adjusting liner, which does not overlap with the first and second impurity regions. The dielectric work function adjusting liner is formed of a high oxygen containing-metal oxide which has oxygen content per unit volume greater than that of the gate dielectric layer. The gate dielectric layer may include silicon oxide ($SiO_2$), and the dielectric work function adjusting liner may include one or more of aluminum oxide ($Al_2O_3$), titanium oxide ($TiO_2$), hafnium oxide ($HfO_2$), zirconium oxide ($ZrO_2$) and magnesium oxide (MgO). The forming of the buried gate structure may include forming the gate dielectric layer over a surface of the trench; forming a dielectric work function adjusting liner layer over the gate dielectric layer; forming a first conductive layer over the dielectric work function adjusting liner layer to fill the trench; and recessing the first conductive layer and the dielectric work function adjusting liner layer to form a lower buried portion and the dielectric work function adjusting liner. The forming of the buried gate structure may include forming a conductive work function layer over the lower buried portion and the dielectric work function adjusting liner; recessing the conductive work function layer to form an upper buried portion which overlaps with the first impurity region and the second impurity region; and forming a capping layer which fills the trench over the upper buried portion. The forming of the buried gate structure may include forming a conductive work function layer conformally over the lower buried portion and the dielectric work function adjusting liner; recessing the conductive work function layer to form a conductive work function liner which overlaps with the first impurity region and the second impurity region; forming a second conductive layer over the conductive work function liner and the lower buried portion; recessing the second conductive layer to form an upper buried portion over the lower buried portion; and forming a capping layer over the upper buried portion to fill the trench. The forming of the buried gate structure may include forming a conductive work function layer conformally over the lower buried portion and the dielectric work function adjusting liner; forming a second conductive layer over the conductive work function; recessing the conductive work function layer and the second conductive layer to form a conductive work function liner and an upper buried portion which overlap with the first impurity region and the second impurity region; and forming a capping layer over the upper buried portion and the conductive work function liner to fill the trench. The conductive work function layer is formed of a material which has a low work function lower than a mid-gap work function of silicon. The conductive work function layer is formed of N-type doped polysilicon. The method for manufacturing the semiconductor device may further include forming a fin under the trench after the forming of the trench.

In accordance with still yet another embodiment of the present invention, a method for manufacturing a semiconductor device may include forming a trench in a substrate; forming a buried gate structure, which is embedded in the trench and comprises a gate dielectric layer, a gate electrode over the gate dielectric layer, and a capping layer over the gate electrode; and forming a first impurity region and a second impurity region in the substrate on both sides of the buried gate structure, wherein the forming of the buried gate structure may include forming a first dielectric work function adjusting liner between the gate electrode and the gate dielectric layer that does not overlap with the first and second impurity regions; and forming a second dielectric work function adjusting liner at an interface with gate dielectric layer that overlaps with the first and second impurity regions. The first dielectric work function adjusting liner is formed of a high oxygen containing-metal oxide which has oxygen content per unit volume greater than that of the gate dielectric layer. The gate dielectric layer may include silicon oxide ($SiO_2$), and wherein the dielectric work function adjusting liner may include one or more of aluminum oxide ($Al_2O_3$), titanium oxide ($TiO_2$), hafnium oxide ($HfO_2$), zirconium oxide ($ZrO_2$) and magnesium oxide (MgO). The second dielectric work function adjusting liner is formed of a low oxygen containing-metal oxide which has oxygen content per unit volume lower than that of the gate dielectric layer. The gate dielectric layer may include silicon oxide ($SiO_2$), and wherein the second dielectric work function adjusting liner may include one or more of yttrium oxide ($Y_2O_3$), lanthanum oxide ($La_2O_3$), germanium oxide ($GeO_2$), lutetium oxide ($Lu_2O_3$) and strontium oxide (SrO). The method for manufacturing the semiconductor device may further include forming a fin under the trench after forming the trench.

In accordance with still yet another embodiment of the present invention, a semiconductor device may include a substrate including a trench; a gate dielectric layer formed over a surface of the trench; a gate electrode which is positioned at a level lower than a top surface of the substrate and includes a lower buried portion embedded in a lower portion of the trench over the gate dielectric layer and an upper buried portion positioned over the lower buried portion; a first metal oxide liner which is positioned between the lower buried portion and the gate dielectric layer and has oxygen content per unit volume greater than that of the gate dielectric layer; and a second metal oxide liner which is positioned between the upper buried portion and the gate dielectric layer and has oxygen content per unit volume lower than that of the gate dielectric layer.

In accordance with still yet another embodiment of the present invention, a transistor circuit may include a substrate including a first region having a source region and a drain region which are spaced from each other by a trench; a non-planar type transistor including a buried gate structure embedded in the trench; and a planar type transistor including a planar gate structure formed over a second region of the substrate, wherein the buried gate structure may include a work function adjusting liner which does not overlap with the source region and the drain region and forms a dipole inducing a high work function at an interface with the gate dielectric layer; and N-type doped polysilicon overlapping with the source region and the drain region. Moreover, the buried gate structure of the transistor circuit in accordance with the embodiment may include a first dielectric work function adjusting liner which does not overlap with the source region and the drain region and generates a dipole inducing a high work function at an interface with the gate dielectric layer; and a second dielectric work function liner which overlaps with the source region and the drain region and generates a dipole inducing a low work function at an interface with the gate dielectric layer.

In accordance with still yet another embodiment of the present invention, a memory cell may include a substrate including a first impurity region and a second impurity region spaced from each other by a trench; a buried word line structure in the trench positioned at a level lower than a top surface of the substrate; a bit line electrically coupled to the first impurity region; and a memory element electrically coupled to the second impurity region, wherein the buried word line structure may include a work function adjusting liner which does not overlap with the first impurity region and the second impurity region and generates a dipole inducing a high work function at an interface with the gate dielectric layer; and an N-type doped polysilicon overlapping with the first impurity region and the second impurity region. Moreover, the buried word line structure of the memory cell in accordance with the embodiment may include a first dielectric work function adjusting liner which does not overlap with the first impurity region and the second impurity region and generates a high work function at an interface with the gate dielectric layer; and a second dielectric work function liner which overlaps with the first impurity region and the second impurity region and generates a dipole inducing a low work function at an interface with the gate dielectric layer.

In accordance with still yet another embodiment of the present invention, an electronic device may include one or more non-planar type transistors including a substrate including a first impurity region and a second impurity region spaced from each other by a trench, and a buried gate structure in the trench positioned at a level lower than a top surface of the substrate, wherein the buried gate structure may include a work function adjusting liner which does not overlap with the source region and the drain region and forms a dipole inducing a high work function at an interface with the gate dielectric layer; and an N-type doped polysilicon overlapping with the source region and the drain region. Moreover, the buried gate structure of the electronic device in accordance with the embodiment may include a first dielectric work function adjusting liner which does not overlap with the source region and the drain region and generates a dipole inducing a high work function at an interface with the gate dielectric layer; and a second dielectric work function liner which overlaps with the source region and the drain region and generates a dipole inducing a low work function at an interface with the gate dielectric layer.

DETAILED DESCRIPTION

Figure 1:
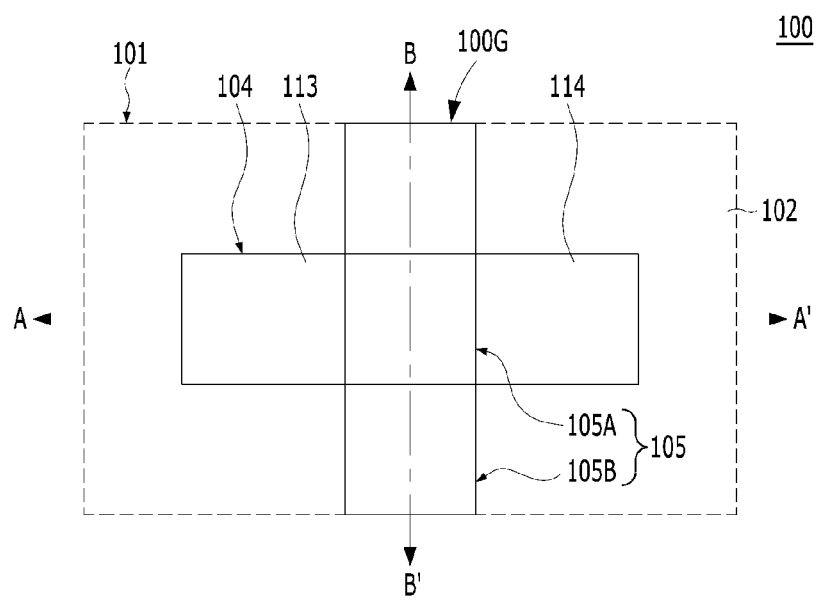
FIG. 1 is a plan view illustrating a semiconductor device in accordance with a first embodiment.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to where the first layer is formed directly on the second layer or the substrate but to where a third layer exists between the first layer and the second layer or the substrate.

In the embodiments, the work function adjusting liner plays a role different than the work function liner. The work function adjusting liner forms a dipole with adjacent material to change the work function, while the work function liner has a fixed value work function. For example, the dipole formed by the work function adjusting liner causes an energy band change resulting in a higher work function. The work function liner may have a low work function.

FIG. 1 is a plan view illustrating a semiconductor device 100 in accordance with the embodiments.

Referring to FIG. 1, the semiconductor device 100 may include a buried gate structure 100G, a first impurity region 113 and a second impurity region 114. An isolation layer 102 and an active region 104 may be formed in a substrate 101. The first impurity region 113 and the second impurity region 114 may be disposed in the active region 104. A gate trench 105 across the active region 104 and the isolation layer 102 may be formed. The buried gate structure 100G may be formed in the gate trench 105. A channel 115 may be formed between the first impurity region 113 and the second impurity region 114 by the gate trench 105.

The semiconductor device 100 may include a transistor. Hereinafter, embodiments and modifications thereof may be applied to a non-planar transistor, for example, a buried gate type transistor.

The semiconductor device 100 in accordance with the first embodiment will be described below in detail.

Figure 2A:
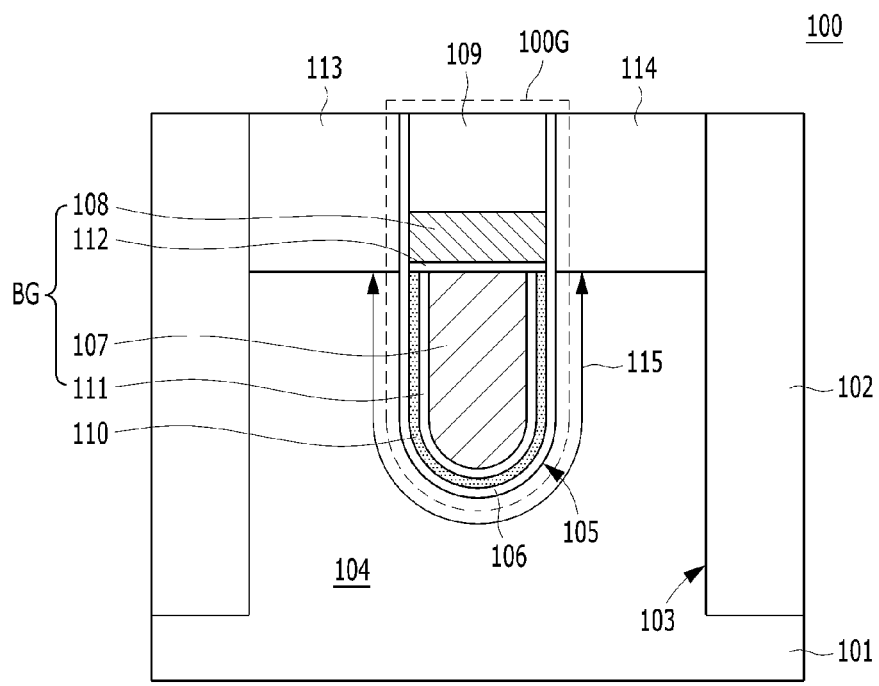
FIG. 2A is a cross-sectional view taken along the line A-A' of FIG. 1.
Figure 2B:
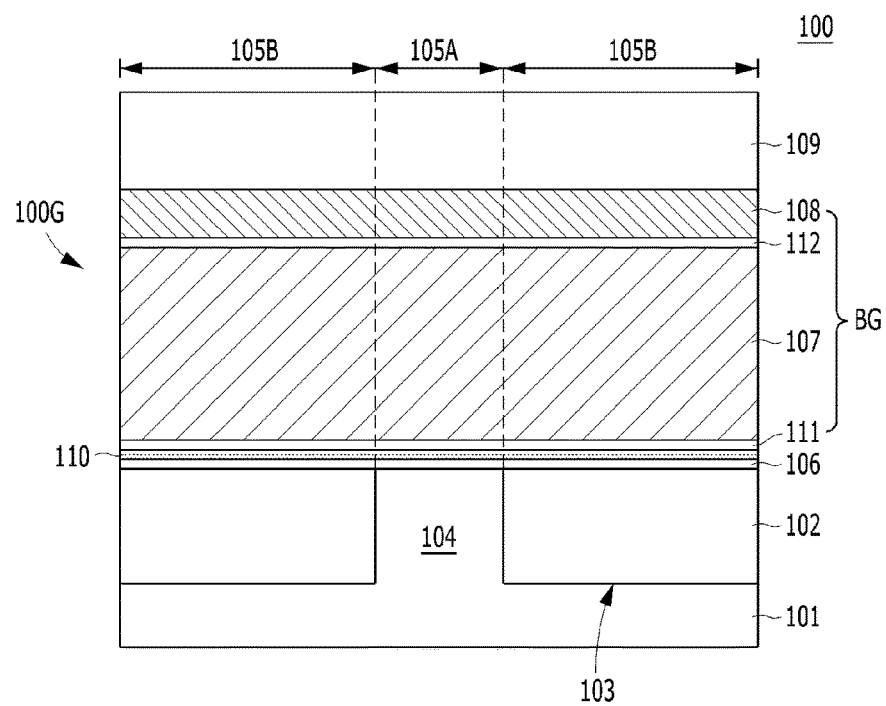
FIG. 2B is a cross-sectional view taken along the line B-B' of FIG. 1.

FIG. 2A and FIG. 2B are cross-sectional views of the semiconductor device in accordance with the first embodiment. FIG. 2A is a cross-sectional view taken along the line A-A' of FIG. 1. FIG. 2B is a cross-sectional view taken along the line B-B' of FIG. 1.

The semiconductor device 100 may be formed in the substrate 101. The substrate 101 may be a material suitable for semiconductor processing. The substrate 101 may include a semiconductor substrate. The substrate 101 may be formed of a silicon-containing material. The substrate 101 may include one or more of silicon, monocrystalline silicon, polysilicon, amorphous silicon, silicon germanium, monocrystalline silicon germanium, polycrystalline silicon germanium, carbon-doped silicon, a combination thereof, and a multi-layer thereof. The substrate 101 may include another semiconductor material such as germanium. Also, the substrate 101 may include a III-V group semiconductor, for example, a compound semiconductor substrate such as GaAs. Further, the substrate 101 may include a silicon-on-insulator (SOI) substrate.

The isolation layer 102 and the active region 104 may be formed in the substrate 101. The active region 104 may be defined by the isolation layer 102. The isolation layer 102 may be a shallow trench isolation (STI) region which is formed by trench etching. The isolation layer 102 may be formed by filling a dielectric material in a shallow trench, for example, an isolation trench 103.

The gate trench 105 may be formed in the substrate 101. When viewed on the plan view, the gate trench 105 may form a line extending in any one direction. The gate trench 105 may extend across the active region 104 and the isolation layer 102. The gate trench 105 may have a depth shallower than that of the isolation trench 103. The gate trench 105 may include a first trench 105A and a second trench 105B. The first trench 105A may be formed in the active region 104. The second trench 105B may be formed in the isolation layer 102. The second trench 105B may continuously extend from the first trench 105A. The bottom surfaces of the first trench 105A and the second trench 105B may be positioned at the same level. The lower portion of the gate trench 105 may be curved. The gate trench 105 may include a channel 115.

The first impurity region 113 and the second impurity region 114 may be formed in the active region 104. The first impurity region 113 and the second impurity region 114 may be doped with a conductivity type impurity. For example, the conductivity type impurity may include one or more of phosphorus (P), arsenic (As), antimony (Sb) and born (B). The first impurity region 113 and the second impurity region 114 may be doped with the same conductivity type impurity. The first impurity region 113 and the second impurity region 114 may be positioned in the active region 104 on both sides of the gate trench 105. The first impurity region 113 and the second impurity region 114 may respectively correspond to a source region and a drain region. The bottom surfaces of the first impurity region 113 and the second impurity region 114 may be positioned at a predetermined depth from the top surface of the active region 104. The first impurity region 113 and the second impurity region 114 may contact the sidewalls of the gate trench 105. The bottom surfaces of the first impurity region 113 and the second impurity region 114 may be at a level higher than the bottom surface of the gate trench 105.

The gate structure 100G may be embedded in the gate trench 105. The buried gate structure 100G may be disposed in the active region 104 between the first impurity region 113 and the second impurity region 114, and extend to the isolation layer 102. The bottom surface of a portion of the gate structure 100G, which is disposed in the active region 104, and the bottom surface of a portion of the gate structure 100G, which is disposed in the isolation layer 102, may be positioned at the same level.

The buried gate structure 100G may include a gate dielectric layer 106, a gate electrode BG, a capping layer 109, and a work function adjusting liner 110. The gate electrode BG may be positioned at a level lower than the top surface of the active region 104. The gate electrode BG may partially fill the gate trench 105. Therefore, the gate electrode BG may be a buried gate electrode. The capping layer 109 may be positioned on the gate electrode BG. The gate dielectric layer 106 may be formed on the bottom surface and the sidewalls of the gate trench 105. The work function adjusting liner 110 may be disposed between the gate electrode BG and the gate dielectric layer 106.

The gate dielectric layer 106 may include one or more of silicon oxide, silicon nitride, silicon oxynitride, a high-k material and a combination thereof. The high-k material may include a material with a dielectric constant greater than the dielectric constant of silicon oxide. For example, the high-k material may include a material which has a dielectric constant greater than 3.9. For another example, the high-k material may include a material which has a dielectric constant greater than 10. For still another example, the high-k material may include a material which has a dielectric constant ranging from approximately 10 to approximately 30. The high-k material may include one or more metallic elements. The high-k material may include a hafnium-containing material. The hafnium-containing material may include one or more of hafnium oxide, hafnium silicon oxide, hafnium silicon oxynitride and a combination thereof. In another embodiment, the high-k material may include one or more of lanthanum oxide, lanthanum aluminum oxide, zirconium oxide, zirconium silicon oxide, zirconium silicon oxynitride, aluminum oxide and a combination thereof. As the high-k material, other high-k materials known in the art may be selectively used. The gate dielectric layer 106 may be formed of a suitable material depending on the work function adjusting liner 110. For example, the gate dielectric layer 106 may be formed of a material having oxygen content per unit volume lower than that of the work function adjusting liner 110.

The channel 115 may be formed along the gate electrode BG between the first impurity region 113 and the second impurity region 114. The channel 115 may have a channel length longer than that of a general planar type transistor. Thus, it is possible to prevent short channel effects.

The gate electrode BG may include a lower buried portion 107 and an upper buried portion 108. The upper buried portion 108 may be positioned on the lower buried portion 107, and the upper buried portion 108 may overlap with the first impurity region 113 and the second impurity region 114. The upper buried portion 108 may partially fill the gate trench 105 on the lower buried portion 107. The top surface of the upper buried portion 108 may be lower than the top surface of the substrate 101. The upper buried portion 108 may overlap with the first and second impurity regions 113 and 114, and the gate dielectric layer 106 may be interposed therebetween. That is, the first and second impurity regions 113 and 114 may have a depth overlapping with the upper buried portion 108.

The capping layer 109 may be formed over the upper buried portion 108. The capping layer 109 may protect the gate electrode BG. The capping layer 109 may include a dielectric material. The capping layer 109 may include one or more of silicon nitride, silicon oxynitride, and a combination thereof. In another example, the capping layer 109 may include a combination of silicon nitride and silicon oxide. For example, in order to form the capping layer 109, a spin-on-dielectric (SOD) may be filled after lining silicon nitride.

The gate electrode BG and the work function adjusting liner 110 will be described below in detail.

The work function adjusting liner 110 may be a material for adjusting a work function, for example, the material for adjusting an effective work function of the lower buried portion 107. The work function adjusting liner 110 may be formed between the lower buried portion 107 and the gate dielectric layer 106. The increased work function, that is, a high work function of the lower buried portion 107 may be exhibited by the work function adjusting liner 110. The high work function may be greater than the mid-gap work function of silicon. The low work function may be lower than the mid-gap work function of silicon. That is, the high work function material may be greater than 4.5 eV, and the low work function material may be lower than 4.5 eV. The work function adjusting liner 110 and the gate dielectric layer 106 may include a material generating a dipole, and inducing a high work function due to an energy band change. The dipole may be formed between the gate dielectric layer 106 and the work function adjusting liner 110. The dipole may be used to increase the effective work function of the lower buried portion 107. The work function adjusting liner 110 may be different than the gate dielectric layer 106 in oxygen content. The work function adjusting liner 110 and the gate dielectric layer 106 may be referred to as a dipole-forming layer. The work function adjusting liner 110 may be formed of a high oxygen containing-metal oxide which has oxygen content per unit volume greater than that of the gate dielectric layer 106. If the gate dielectric layer 106 is formed of $SiO_2$, the work function adjusting liner 110 may include one or more of aluminum oxide ($Al_2O_3$), titanium oxide ($TiO_2$), hafnium oxide ($HfO_2$), zirconium oxide ($ZrO_2$) and magnesium oxide (MgO). In the embodiments, the work function adjusting liner 110 may include aluminum oxide ($Al_2O_3$). The aluminum oxide has oxygen content greater than that of other high oxygen containing-metal oxides. Therefore, its threshold voltage is shifted more. As the work function adjusting liner 110 is formed of aluminum oxide ($Al_2O_3$), an interface with the gate dielectric layer 106 may remain stable. The work function adjusting liner 110 may be thin. As such, the volume of the lower buried portion 107 in the gate trench 105 may increase so that the resistivity of the gate electrode BG may be significantly reduced.

The lower buried portion 107 and the upper buried portion 108 of the gate electrode BG may be discontinuous. For example, the lower buried portion 107 and the upper buried portion 108 may be formed of different materials. The upper buried portion 108 of the gate electrode BG may have a first work function. Here, the first work function may be lower than the mid-gap work function of silicon. For example, the first work function may be lower than 4.5 eV. The upper buried portion 108 may include a non-metal material. The upper buried portion 108 may include a silicon-containing material having an N-type dopant. In the embodiments, the upper buried portion 108 may include polysilicon which is doped with an N-type dopant (hereinafter, N-type doped polysilicon). The N-type doped polysilicon may have a low work function. The N-type dopant may include one or more of phosphorous (Ph) and arsenic (As). The upper buried portion 108 may overlap with the first impurity region 113 and the second impurity region 114. For example, the upper buried portion 108 may horizontally overlap with the first impurity region 113 and the second impurity region 114. A second work function of the lower buried portion 107 greater than the first work function of the upper buried portion 108 may be induced by the dipole. For example, the second work function may be a high work function. In another example, if the lower buried portion 107 is formed of a material having a first high work function, a second high work function greater than the first high work function may be induced by the dipole.

The lower buried portion 107 of the gate electrode BG may include a low resistivity metal to reduce the resistivity of the gate electrode BG. The lower buried portion 107 may include a material having a resistivity lower than that of the upper buried portion 108. In the first embodiment, the lower buried portion 107 may be formed of a reactive material with respect to the upper buried portion 108. That is, the lower buried portion 107 may be formed of a material which is likely to react with the upper buried portion 108. For example, the lower buried portion 107 may be formed of tungsten (W). Tungsten in the lower buried portion 107 may react with silicon in the upper buried portion 108 to form tungsten silicide. Tungsten silicide may cause an increase in resistivity. Therefore, in order to prevent the formation of such silicide, an intermediate barrier 112 may be formed between the lower buried portion 107 and the upper buried portion 108.

As such, the lower buried portion 107 may be formed of a low resistivity metal, which has a resistivity lower than that of the upper buried portion 108 and is reactive with the upper buried portion 108. If the lower buried portion 107 is formed of tungsten, the gate dielectric layer 106 may be attacked. For example, when tungsten is deposited through tungsten hexafluoride ($WF_6$), the gate dielectric layer 106 may be attacked by fluorine. Therefore, in order to prevent such fluorine attack, a lower barrier 111 may be formed between the lower buried portion 107 and the gate dielectric layer 106. The lower barrier 111 may be positioned between the lower buried portion 107 and the work function adjusting liner 110. The lower barrier 111 may be formed of a material which has a low resistivity. In some examples, when tungsten is deposited through a tungsten source which does not contain fluorine, the lower barrier 111 may be omitted.

The first impurity region 113, the second impurity region 114 and the buried gate structure 100G may form a transistor. For example, the transistor may be referred to as a buried gate type transistor. The channel 115 may be defined along the surface of the gate trench 105 between the first impurity region 113 and the second impurity region 114. In some examples, the channel 115 may include a dopant.

According to the first embodiment, the work function adjusting liner 110 may induce a high work function, and the upper buried portion 108 may have a low work function.

A threshold voltage Vt may be adjusted by the work function adjusting liner 110. For example, the threshold voltage may be shifted by the work function adjusting liner 110. The dipole may be formed at an interface of the work function adjusting liner 110 and the gate dielectric layer 106 by the work function adjusting liner 110. The dipole may be generated by the difference in oxygen content between the work function adjusting liner 110 and the gate dielectric layer 106. The dipole may be used to increase the work function of the lower buried portion 107 and thus, may shift the threshold voltage. As a result, the dose of the channel 115 may be decreased by the work function adjusting liner 110. A work function of the gate electrode BG may be adjusted by controlling a polarity direction of the dipole. In this way, a work function of the lower buried portion 107 of the gate electrode BG may be increased or decreased. For example, when the work function adjusting liner 110 is formed of a material which has oxygen content per unit volume greater than that of the gate dielectric layer 106, a dipole in a direction for changing a work function into a high work function may be generated. When the work function adjusting liner 110 is formed of a material having oxygen content per unit volume lower than that of the gate dielectric layer 106, a dipole in a direction for changing a work function into a low work function may be generated. In the embodiments, since the work function adjusting liner 110 may be formed of a material having oxygen content per unit volume greater than the gate dielectric layer 106, a dipole in a direction for changing a work function into a high work function at an interface with the gate dielectric layer 106 may be generated. When the gate dielectric layer 106 is formed of $SiO_2$, a material having oxygen content per unit volume greater than that of $SiO_2$ may include one or more of aluminum oxide ($Al_2O_3$), titanium oxide ($TiO_2$), hafnium oxide ($HfO_2$), zirconium oxide ($ZrO_2$) and magnesium oxide (MgO). A material having oxygen content per unit volume lower than that of $SiO_2$ may include one or more of yttrium oxide ($Y_2O_3$), lanthanum oxide ($La_2O_3$), germanium oxide ($GeO_2$), lutetium oxide ($Lu_2O_3$) and strontium oxide (SrO). For example, the ratio of the oxygen content per unit volume of $Al_2O_3$ to the oxygen content per unit volume of $SiO_2$ $$\left(\frac{\sigma_{Al_2O_3}}{\sigma_{SiO_2}}\right)$$

may be 1.21. For example, the ratio of the oxygen content per unit volume of $La_2O_3$ to the oxygen content per unit volume or $SiO_2$ $$\left(\frac{\sigma_{La_2O_3}}{\sigma_{SiO_2}}\right)$$

may be 0.77. For example, the ratio of the oxygen content per unit volume of $HfO_2$ to the oxygen content per unit volume of $SiO_2$ may be 1.05. When the work function adjusting liner 110 is formed of aluminum oxide ($Al_2O_3$), the threshold voltage may be shifted more in comparison with hafnium oxide ($HfO_2$). For example, when using aluminum oxide ($Al_2O_3$), a threshold voltage shift of about +0.57V may occur. When using hafnium oxide ($HfO_2$), a threshold voltage shift of about +0.31V may occur.

Since the gate trench 105 has a high aspect ratio, it is difficult to dope the bottom portion of the gate trench 105 using conventional methods. Therefore, additional channel doping may be locally performed on the bottom portion of the gate trench 105 after an initial channel doping, and this is referred to as local channel doping. If implantation is applied by the local channel doping, it is referred to as local channel implantation (LCI).

Since a channel dose may be decreased by the work function adjusting liner 110, the dose of the local channel doping may decrease or the local channel doping may be omitted. As a result, in the embodiments, since the channel dose is decreased, junction leakage may be improved.

Moreover, in the first embodiment, since the upper buried portion 108 has a low work function, gate induced drain leakage (GIDL) in the first impurity region 113 and the second impurity region 114 may be suppressed. If the work function adjusting liner 110 overlaps with the first impurity region 113 and the second impurity region 114, gate induced drain leakage may increase by inducing a high work function. Therefore, the work function adjusting liner 110 may be adjusted in height not to overlap with the first impurity region 113 and the second impurity region 114.

While the resistivity of the upper buried portion 108 may be higher than those of other metal materials, the influence exerted on the resistivity of the gate electrode BG may be minimized by decreasing the rate, that is, the thickness of the upper buried portion 108 in the gate electrode BG.

In a comparative example, when the upper buried portion 108 may be formed of a low work function metal material, that is, an N-type work function metal, the N-type work function metal may have a greater work function than n-type doped polysilicon. Therefore, it is difficult to obtain a low work function corresponding to the N-type doped polysilicon through the N-type work function metal. Moreover, when the work function adjusting liner 110 is formed of a conductive material having a high work function such as TiAlN, TiAlN has a resistivity higher than that of the tungsten (W) and thus there is a limit to reduction of the resistivity of the gate electrode BG in comparison with a dielectric work function adjusting liner 110 or $Al_2O_3$. Further, since a dipole density generated through TiAlN is lower than that generated by $Al_2O_3$, the shift of the threshold voltage may not be significant.

The buried gate structure 100G in accordance with the first embodiment may be applied to a buried gate type fin channel transistor.

Figure 3A:
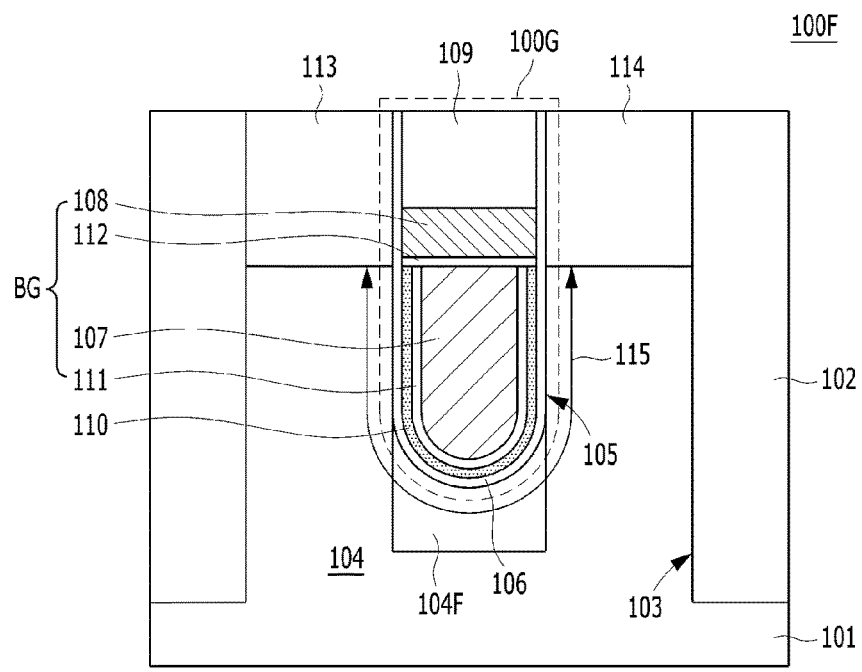
FIGS. 3A and 3B are cross-sectional views illustrating a buried gate type fin channel transistor in accordance with the first embodiment.
Figure 3B:
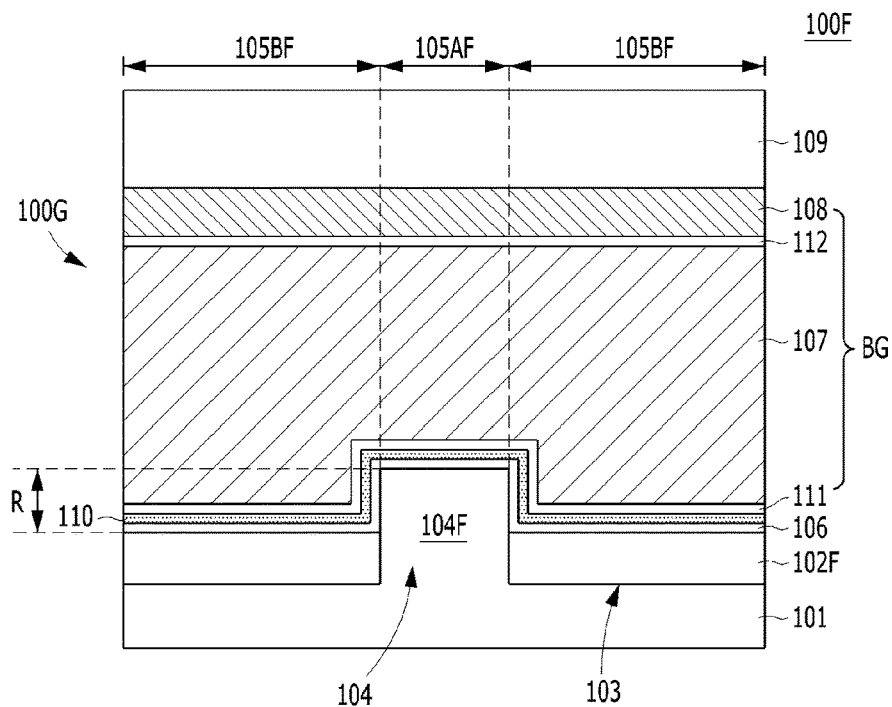

FIGS. 3A and 3B are cross-sectional views illustrating a buried gate type fin channel transistor in accordance with the first embodiment. FIG. 3A is a cross-sectional view taken along the line A-A' of FIG. 1. FIG. 3B is a cross-sectional view taken along the line B-B' of FIG. 1. Some components of the semiconductor device 100F may be the same as those of the semiconductor device 100 in accordance with the first embodiment.

Referring to FIG. 3A and FIG. 3B, a gate trench 105 may include a first trench 105AF and a second trench 105BF. The first trench 105AF may be formed in an active region 104. The second trench 105BF may be formed in an isolation layer 102. The second trench 105BF may continuously extend from the first trench 105AF. In the gate trench 105, the bottom surfaces of the first trench 105AF and the second trench 105BF may be positioned at different levels. For example, the bottom surface of the first trench 105AF may be positioned at a level higher than the bottom surface of the second trench 105BF. The difference in the depths of the first trench 105AF and the second trench 105BF may be induced as the isolation layer 102 is recessed. Accordingly, the second trench 105BF may include a recess region R which has a bottom surface lower than the bottom surface of the first trench 105AF.

A fin region 104F may be formed in the active region 104 due to the difference in the depths of the first trench 105AF and the second trench 105BF. Therefore, the active region 104 may include the fin region 104F.

In this way, the fin region 104F may be formed below the first trench 105AF, and the sidewalls of the fin region 104F may be exposed by the recessed isolation layer 102F. A channel may be formed in the fin region 104F. The fin region 104F may be a saddle fin. By forming the fin region 104F, the channel width may be increased, and electrical characteristics may be improved.

A buried gate structure 100G of the semiconductor device 100F may include a gate dielectric layer 106, a work function adjusting liner 110, a gate electrode BG and a capping layer 109. The gate dielectric layer 106 may be formed on the sidewalls and the top surface of the fin region 104F. The work function adjusting liner 110 and a lower buried portion 107 may cover the sidewalls and the top surfaces of the fin region 104F. The lower buried portion 107 may be formed in the gate trench 105 while filling the recess region R. The cross-sectional area of the lower buried portion 107 may be larger in the isolation layer 102 than in the active region 104. The upper buried portion 108 may not be positioned around the sidewalls of the fin region 104F. The channel dose of the fin region 104F may be influenced by a work function adjusting liner 110.

Figure 4:
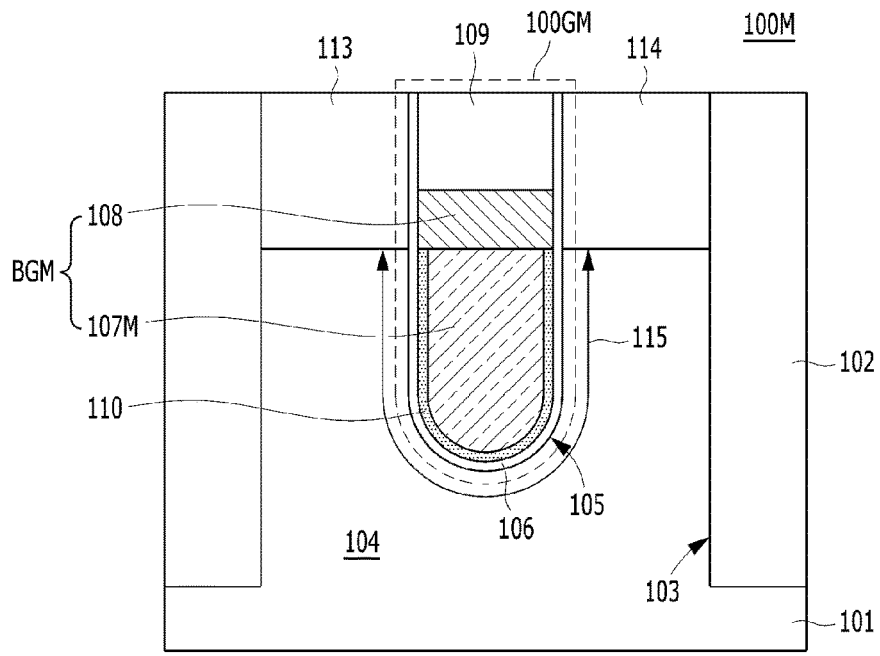
FIG. 4 is a cross-sectional view illustrating a semiconductor device in accordance with a modification of the first embodiment.

FIG. 4 is a cross-sectional view illustrating a semiconductor device in accordance with a modification of the first embodiment. Some components of a semiconductor device 100M may be the same as those of the semiconductor device 100 in accordance with the first embodiment.

A buried gate structure 100GM of the semiconductor device 100M may include a gate dielectric layer 106, a work function adjusting liner 110, a gate electrode BGM and a capping layer 109.

The gate electrode BGM may include a lower buried portion 107M and an upper buried portion 108. The lower buried portion 107M may overlap with a channel 115, and the upper buried portion 108 may overlap with a first impurity region 113 and a second impurity region 114.

The lower buried portion 107M of the gate electrode BGM may include a low resistivity metal in order to decrease the resistivity of the gate electrode BGM. The lower buried portion 107M may include a material having a resistivity lower than that of the upper buried portion 108. The lower buried portion 107M may be formed of a non-reactive material with respect to the upper buried portion 108. That is, the upper buried portion 108 may be formed of a material which is not reactive with the upper buried portion 108. For example, when the lower buried portion 107M is formed of titanium nitride, silicon in the upper buried portion 108 may not react with the lower buried portion 107M. Therefore, an intermediate barrier between the lower buried portion 107M and the upper buried portion 108 may be omitted.

As such, the lower buried portion 107M may be formed of a low resistivity metal, which has a resistivity lower than that of the upper buried portion 108 and is a non-reactive material with respect to the upper buried portion 108.

Moreover, the lower buried portion 107M may be formed of a material which does not attack the gate dielectric layer 106. For example, the lower buried portion 107M may be formed of a material which does not contain impurities such as fluorine. Therefore, a lower barrier between the lower buried portion 107M and the gate dielectric layer 106 may be omitted.

The lower buried portion 107M may include titanium nitride. Since the lower buried portion 107M is formed of a material that is not reactive with the upper buried portion 108 and does not contain fluorine, a gate electrode BGM may not require a barrier and thus it may be referred to as a barrier-less gate electrode.

The buried gate structure 100GM of FIG. 4 may be applied to a buried gate type fin channel transistor such as those of FIGS. 3A and 3B.

Hereinafter, a method for manufacturing the semiconductor device in accordance with the first embodiment will be described.

FIGS. 5A to 5G are cross-sectional views describing a method for manufacturing the semiconductor device in accordance with the first embodiment. FIGS. 5A to 5G are cross-sectional views along the line A-A' of FIG. 1, illustrating processing steps.

Figure 5A:
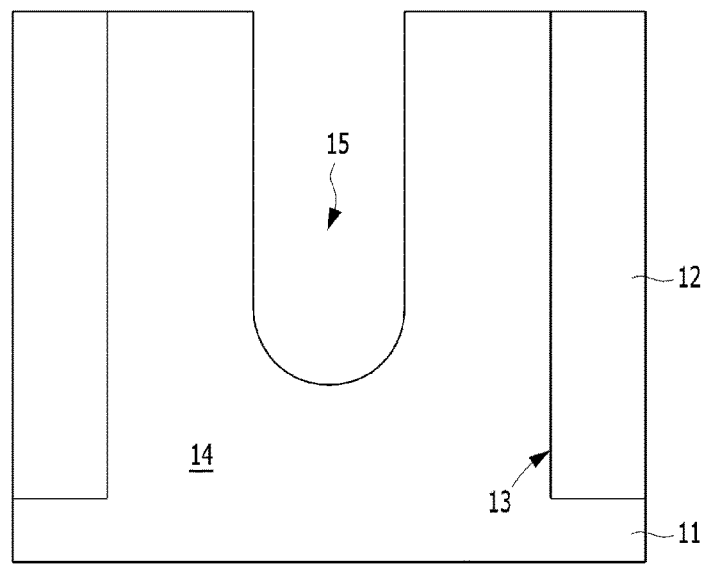
FIGS. 5A to 5G are cross-sectional views describing a method for manufacturing the semiconductor device in accordance with the first embodiment.

As shown in FIG. 5A, an isolation layer 12 may be formed in a substrate 11. An active region 14 may be defined by the isolation layer 12. The isolation layer 12 may be formed by a shallow trench isolation (STI) process. For example, after forming a pad layer (not shown) on the substrate 11, the pad layer and the substrate 11 may be etched through an isolation mask (not shown). As a result, an isolation trench 13 may be formed. The isolation trench 13 may be filled with a dielectric material, and thus, the isolation layer 12 may be formed. The isolation layer 12 may include one or more of silicon oxide, silicon nitride and a combination thereof. A chemical vapor deposition (CVD) process or another deposition process may be performed to fill the isolation trench 13 with a dielectric material. A planarization process such as a chemical-mechanical polishing (CMP) process may be additionally performed.

A gate trench 15 may be formed in the substrate 11. The gate trench 15 may be formed in a line across the active region 14 and the isolation layer 12. The gate trench 15 may be formed by forming a mask pattern (not shown) on the substrate 11 and performing an etching process using the mask pattern as an etch mask. The gate trench 15 may be formed shallower than the isolation trench 13. The gate trench 15 may be deep enough to increase the average cross-sectional area of a gate electrode to be subsequently formed, and thus, the resistivity of the gate electrode may be decreased. The bottom of the gate trench 15 may be curved. By forming the gate trench 15 with a curve, roughness at the bottom of the gate trench 15 may be minimized, and accordingly, filling of the gate electrode may be easily carried out. Furthermore, since the gate trench 15 is curved, angled shapes may be removed at the corners of the bottom of the gate trench 15 so that the concentration of the electric field may be mitigated.

Figure 5B:
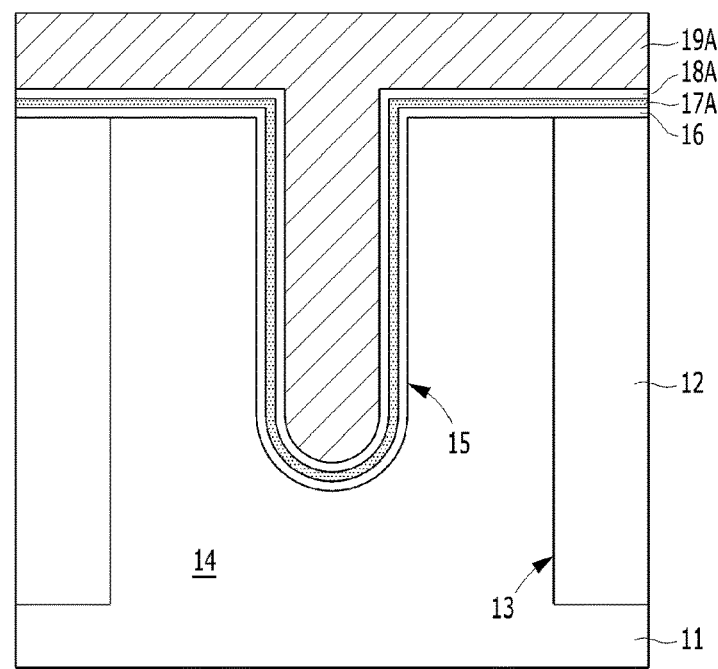

As shown in FIG. 5B, a gate dielectric layer 16 may be formed on the surface of the gate trench 15. Before forming the gate dielectric layer 16, a process may be performed to remedy etching damage to the surface of the gate trench 15. For example, after forming a sacrificial oxide through a thermal oxidation process, the sacrificial oxide may be removed.

The gate dielectric layer 16 may be formed by a thermal oxidation process. In another embodiment, the gate dielectric layer 16 may be formed by a chemical vapor deposition (CVD) process or an atomic layer deposition (ALD) process. The gate dielectric layer 16 may include one or more of a high-k material, oxide, nitride, oxynitride and a combination thereof. The high-k material may include a hafnium-containing material. The hafnium-containing material may include one or more of hafnium oxide, hafnium silicon oxide, hafnium silicon oxynitride and a combination thereof. In another embodiment, the high-k material may include one or more of lanthanum oxide, lanthanum aluminum oxide, zirconium oxide, zirconium silicon oxide, zirconium silicon oxynitride, aluminum oxide and a combination thereof. As the high-k material, other high-k materials known in the art may be used.

A work function adjusting liner layer 17A may be formed on the gate dielectric layer 16. The work function adjusting liner layer 17A may be conformally formed on the surface of the gate dielectric layer 16. The work function adjusting liner layer 17A may adjust a work function. The work function adjusting liner layer 17A may include a material that generates a dipole at an interface with the gate dielectric layer 16 and induces a high work function due to an energy band change. The work function adjusting liner layer 17A may be formed of a material which has oxygen content per unit volume greater than that of $SiO_2$. The work function adjusting liner layer 17A may include one or more of aluminum oxide ($Al_2O_3$), titanium oxide ($TiO_2$), hafnium oxide ($HfO_2$), zirconium oxide ($ZrO_2$) and magnesium oxide (MgO). In the embodiments, the work function adjusting liner layer 17A may include $Al_2O_3$. As the work function adjusting liner layer 17A may be formed of aluminum oxide, it is possible to maintain a stable interface with the gate dielectric layer 16. The work function adjusting liner layer 17A may be formed thin.

A first low resistivity layer 19A may be formed on the work function adjusting liner layer 17A. The first low resistivity layer 19A may fill a gate trench 15. The first low resistivity layer 19A may include a low resistivity metal material. The first low resistivity layer 19A may be formed of a reactive material with respect to a work function liner to be subsequently formed. The first low resistivity layer 19A may include tungsten. When tungsten contains fluorine, a lower barrier layer 18A may be formed before forming the first low resistivity layer 19A. The lower barrier layer 18A may be conformally formed on the surface of the work function adjusting liner layer 17A. The lower barrier layer 18A may be formed of a metal-containing material. The lower barrier layer 18A may include a metal nitride. For example, the lower barrier layer 18A may include titanium nitride. The lower barrier layer 18A may become a lower barrier by a subsequent recessing process. In another example, the first low resistivity layer 19A may be formed of a material which does not contain impurities such as fluorine in order to prevent an attack on the gate dielectric layer 16. Moreover, the first low resistivity layer 19A may be formed of a non-reactive material with respect to a work function liner layer to be subsequently formed. In another example, the first low resistivity layer 19A may be formed of titanium nitride. The first low resistivity layer 19A may be formed by a chemical vapor deposition (CVD) process or an atomic layer deposition (ALD) process.

Figure 5C:
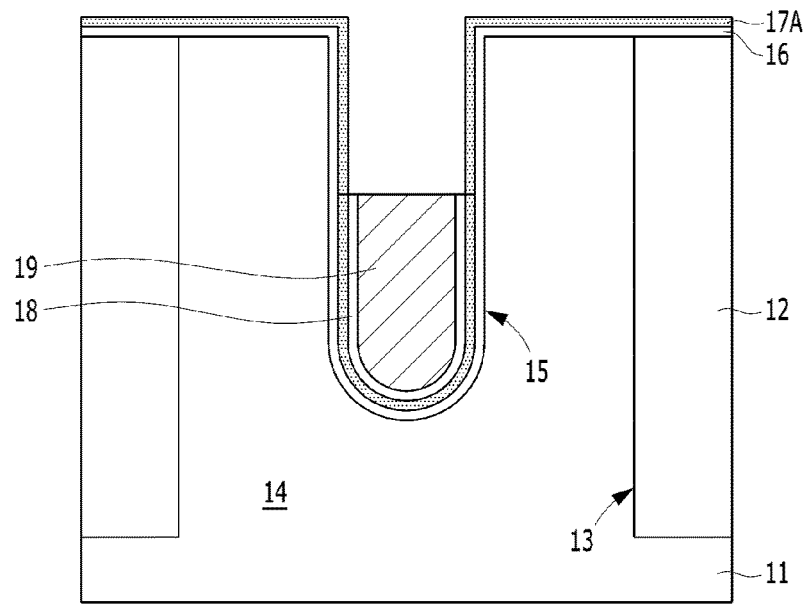

As shown in FIG. 5C, a first recessing process may be performed in such a manner that a lower buried portion 19 remains in the gate trench 15. The first recessing process may be performed by a dry etch process, for example, an etch-back process. A first work function liner 17 may be formed by the etch-back process on the first work function liner layer 17A. The lower buried portion 19 may be formed by the etch-back process on the first low resistivity layer 19A. In another example, the first recessing process may be performed in such a manner that an etch-back process is subsequently performed after a planarization process. A lower barrier layer may be formed by the first recessing process described above. Thus, a lower barrier 18 may be formed. The lower barrier 18 may be disposed between the lower buried portion 19 and the gate dielectric layer 16. The top surface of the lower barrier 18 may be at the same level as the top surface of the lower buried portion 19.

According to the first recessing process described above, the lower buried portion 19 may be formed. The lower buried portion 19 may be recessed to be lower than the top surface of the active region 14.

Figure 5D:
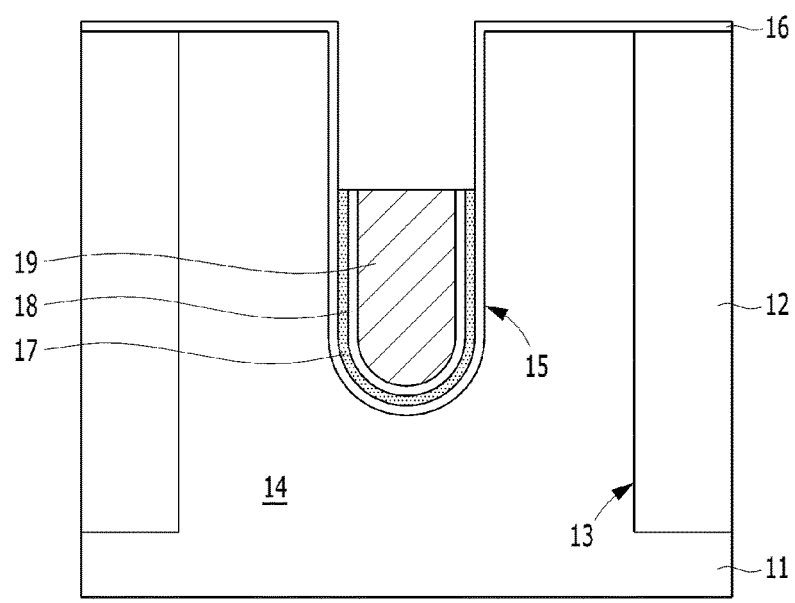

As shown in FIG. 5D, a second recessing process may be performed in such a manner that the work function adjusting liner 17 remains in the gate trench 15. The second recessing process may be performed by a dry etch process or a wet etch process. The work function adjusting liner 17 may be formed by an etch-back process on the work function adjusting liner layer 17A. The second recessing process may be performed without an attack on the gate dielectric layer 16. The work function adjusting liner 17 may be positioned between the lower buried portion 19 and the gate dielectric layer 16. The lower barrier 18 may be positioned between the work function adjusting liner 17 and the lower buried portion 19. The top surfaces of the work function adjusting liner 17, the lower barrier 18 and the lower buried portion 19 may be at the same level.

Figure 5E:
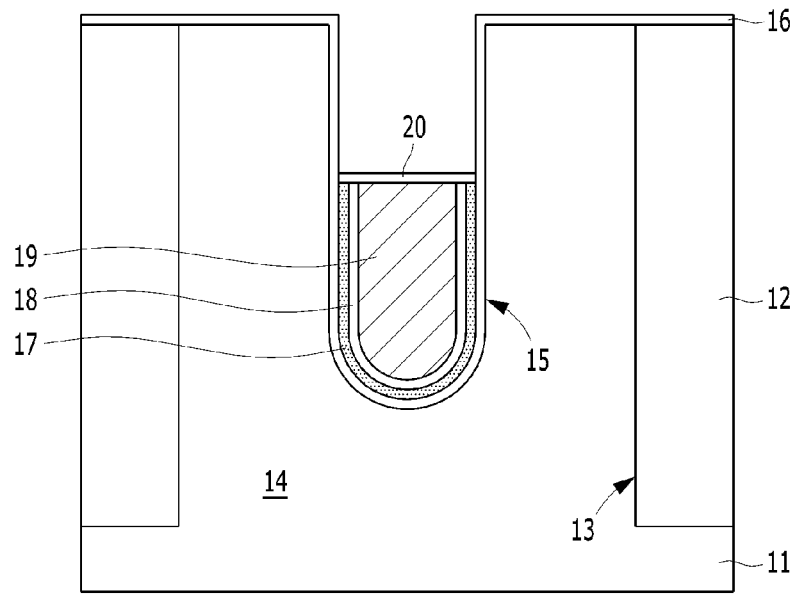

As shown in FIG. 5E, an intermediate barrier 20 may be formed. The intermediate barrier 20 may be formed by forming an intermediate barrier layer (not shown) and then performing a recessing process. The intermediate barrier 20 may be formed of the same material as that of the lower barrier 18. The intermediate barrier 20 may be formed of a metal-containing material. The intermediate barrier 20 may include a metal nitride. For example, the intermediate barrier 20 may include titanium nitride. The top surfaces of the work function adjusting liner 17, the lower barrier 18 and the lower buried portion 19 may be covered by the intermediate barrier 20.

Figure 5F:
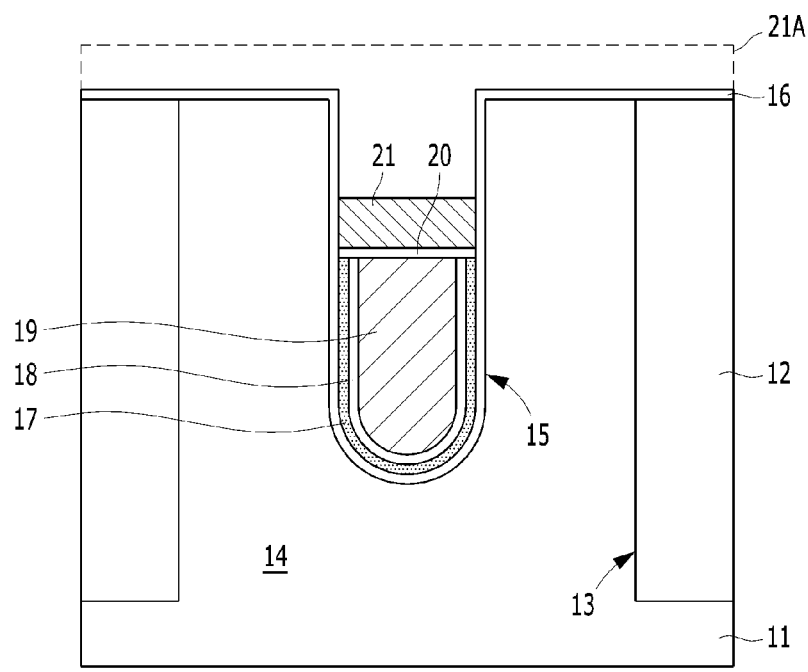

As shown in FIG. 5F, an upper buried portion 21 may be formed. The upper buried portion 21 may be formed by filling the upper part of the intermediate barrier 20 with an upper buried layer 21A and then performing a third recessing process. The upper buried portion 21 may include a material having a low work function. The upper buried portion 21 may be formed of a non-metal material. The upper buried portion 21 may include polysilicon doped with an N-type impurity. The upper buried portion 21 may be at a level lower than the top surfaces of the active region 14.

Figure 5G:
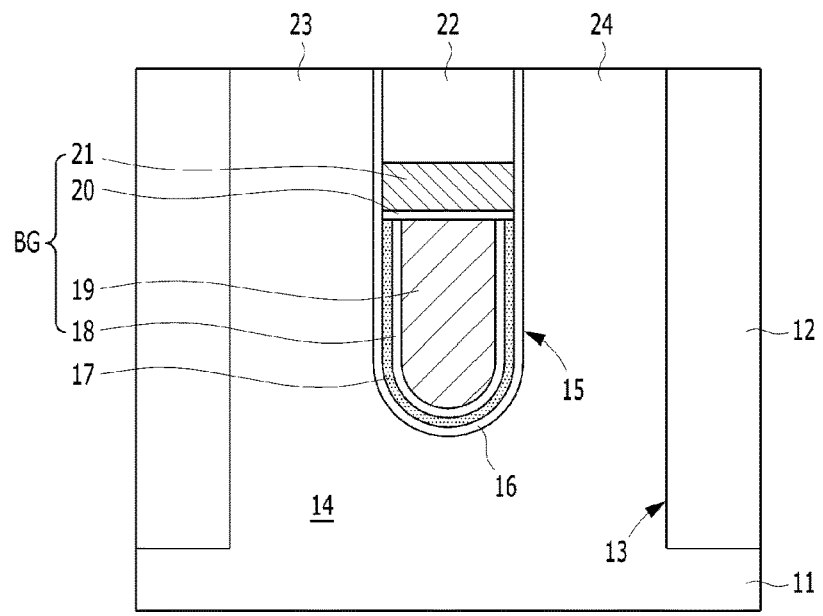

As shown in FIG. 5G, a capping layer 22 may be formed on the upper buried portion 21. The capping layer 22 may include a dielectric material. The capping layer 22 may fill the gate trench 15 on the upper buried portion 21. The capping layer 22 may include silicon nitride. Subsequently, a planarization process on the capping layer 22 may be performed until the top surface of the substrate 11 is exposed. When or after performing the planarization process on the capping layer 22, the gate dielectric layer 16 on the top surface of the substrate 11 may be removed.

According to the above processes, a buried gate structure may be formed. The buried gate structure may include the gate dielectric layer 16, the work function adjusting liner 17, the gate electrode BG and the capping layer 22. The gate electrode BG may include the lower barrier 18, the lower buried portion 19, the intermediate barrier 20 and the upper buried portion 21. The work function adjusting liner 17 may be positioned between the lower buried portion 19 of the gate electrode BG and the gate dielectric layer 16. The top surface of the gate electrode BG may be positioned to be lower than the top surfaces of the substrate 11. Thus, as the top surfaces of the gate electrode BG is recessed to be low, it is possible to secure the distance between the gate electrode BG and other conductive structures such as a contact plug. As a result, insulation internal pressure between the gate electrode BG and other conductive structures may be improved.

After forming the capping layer 22, an impurity doping process may be performed by implantation or another doping technology. Thus, a first impurity region 23 and a second impurity region 24 may be formed in the substrate 11. When performing the impurity doping process, the capping layer 22 may be used as a barrier. The first impurity region 23 and the second impurity region 24 may respectively correspond to a source region and a drain region. The gate dielectric layer 16 on the top surface of the substrate 11 may be removed after the impurity doping process.

The first impurity region 23 and the second impurity region 24 may have a depth that overlaps with the upper buried portion 21. Therefore, the upper buried portion 21 may overlap with the first and second impurity regions 23 and 24.

In another example, the first impurity region 23 and the second impurity region 24 may be formed before forming the gate trench 15. For example, after forming an impurity region by doping an impurity into the active region 14 through an ion implantation mask, the gate trench 15 may be formed. Here, the impurity region may be divided into the first impurity region 23 and the second impurity region 24 by the gate trench.

Figure 6:
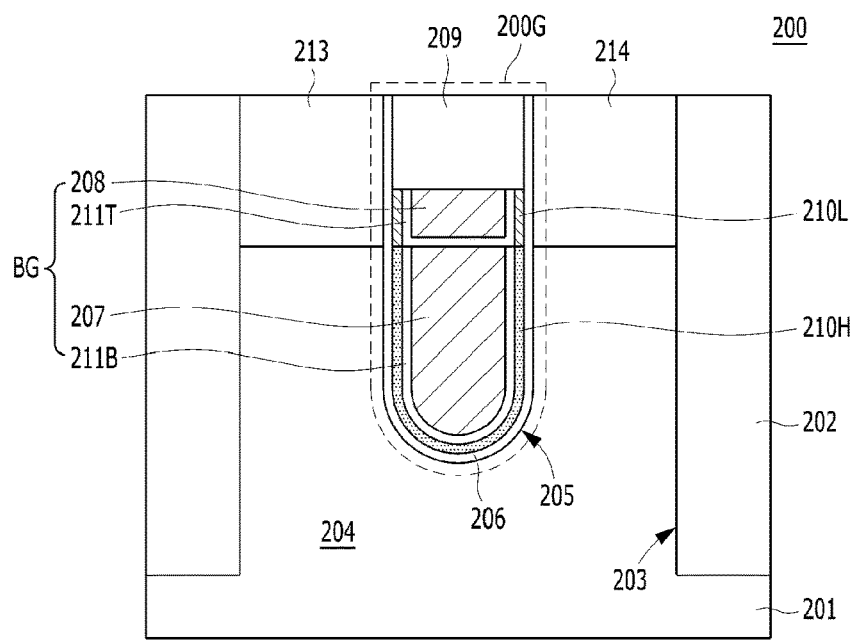
FIG. 6 is a cross-sectional view illustrating a semiconductor device in accordance with a second embodiment.

FIG. 6 is a cross-sectional view illustrating a semiconductor device in accordance with a second embodiment. Some components of a semiconductor device 200 except for a buried gate structure 200G may be the same as those of the semiconductor device 100.

The semiconductor device 200 may be formed in a substrate 201. A buried gate structure 200G of the semiconductor device 200 may be embedded in a gate trench 205. The buried gate structure 200G may be disposed in an active region 204 between a first impurity region 213 and a second impurity region 214, and extend in an isolation layer 202. The isolation layer 202 may be formed by filling an isolation trench 203 with a dielectric material.

The buried gate structure 200G may include a gate dielectric layer 206, a gate electrode BG, a work function adjusting liner 210H, a capping layer 209 and a work function liner 210L. The gate electrode BG may be positioned at a level lower than the top surface of the active region 204. The gate electrode BG may partially fill the gate trench 205. The capping layer 209 may be positioned on the gate electrode BG. The gate dielectric layer 206 may be formed on the bottom surface and the sidewalls of the gate trench 205. A work function adjusting liner 210 may be positioned between the gate electrode BG and the gate dielectric layer 206.

The gate electrode BG may include a lower barrier 211B, a lower buried portion 207, an upper barrier 211T and an upper buried portion 208. The upper buried portion 208 may be positioned on the lower buried portion 207, and the upper buried portion 208 may overlap with the first impurity region 213 and the second impurity region 214. The upper buried portion 208 may partially fill the gate trench 205 on the lower buried portion 207. The top surface of the upper buried portion 208 may be at a level lower than the top surface of the substrate 201. The upper buried portion 208 may overlap with the first and second impurity regions 213 and 214, and the gate dielectric layer 206 may be interposed therebetween. The capping layer 209 may be filled over the upper buried portion 208.

A work function adjusting liner 210H may be formed of the same material as that of the work function adjusting liner 110 in accordance with the first embodiment. That is, the work function adjusting liner 210H may adjust a work function and thus, adjust an effective work function of the lower buried portion 207. By the work function adjusting liner 210H, the lower buried portion 207 may have an increased effective work function, that is, a high work function. The work function adjusting liner 210H may include a material that generates a dipole and induces a high work function due to an energy band change. The work function adjusting liner 210H may be formed of a high oxygen containing-metal oxide which has oxygen content per unit volume greater than that of the gate dielectric layer 206. When the gate dielectric layer 206 is formed of $SiO_2$, the work function adjusting liner 210H may be formed of a high oxygen containing-metal oxide which has oxygen content per unit volume greater than that of $SiO_2$. For example, the work function adjusting liner 210H may include one or more of aluminum oxide ($Al_2O_3$), titanium oxide ($TiO_2$), hafnium oxide ($HfO_2$), zirconium oxide ($ZrO_2$) and magnesium oxide (MgO). In the embodiments, work function adjusting liner 210H may include $Al_2O_3$. As the work function adjusting liner 210H is formed of aluminum oxide, it is possible to maintain a stable interface with the gate dielectric layer 206. The work function adjusting liner 210H may be formed thin. As a result, the volume of the lower buried portion 207 in the gate trench 205 may be increased so that the resistivity of the gate electrode BG may be reduced.

A work function liner 210L may have a first work function. Here, the first work function may be lower than the mid-gap work function of silicon. For example, the first work function may be lower than 4.5 eV. The work function liner 210L may include a non-metal material. The work function liner 210L may include a silicon-containing material which contains an N-type dopant. In the embodiments, the work function liner 210L may include polysilicon doped with an N-type dopant hereinafter, referred to as an N-type doped polysilicon. An N-type doped polysilicon may have a low work function. The N-type dopant may include one or more of phosphorus (P) and arsenic (As). The work function liner 210L may overlap with the first impurity region 213 and the second impurity region 214. For example, the work function liner 210L may horizontally overlap with the first impurity region 213 and the second impurity region 214. The work function liner 210L may have a spacer shape. That is, the work function liner 210L may not be positioned between the upper buried portion 208 and the lower buried portion 207. The work function liner 210L may be positioned between the upper buried portion 208 and the first and second impurity regions 213 and 214. The work function liner 210L may be electrically coupled to the work function adjusting liner 210H. The thickness of the work function liner 210L may be the same or different from that of the work function adjusting liner 210H. By the work function adjusting liner 210H, a second work function of the lower buried portion 207 higher than the first work function of the work function liner 210L may be induced. For example, the second work function may be a high work function. In another example, when the lower buried portion 207 is formed of a first high work function, by the work function adjusting liner 210H, a second high work function higher than the first high work function may be induced.

The lower buried portion 207 and the upper buried portion 208 of the gate electrode BG may include a low resistivity material in order to reduce the resistivity of the gate electrode BG. The lower buried portion 207 and the upper buried portion 208 may include a material having a resistivity lower than that of the work function liner 210L. In the second embodiment, the lower buried portion 207 and the upper buried portion 208 may be formed of a reactive material with respect to the work function liner 210L. That is, the lower buried portion 207 may be formed of a material which is likely to react with the work function liner 210L. For example, the lower buried portion 207 and the upper buried portion 208 may be formed of tungsten (W). Tungsten in the upper buried portion 208 may react with silicon in the work function liner 210L to form tungsten silicide. Tungsten silicide may increase the resistivity. Therefore, in order to prevent the formation of such silicide, an upper barrier 211T may be formed between the upper buried portion 208 and the work function liner 210L. The upper barrier 211T may extend to be positioned between the lower buried portion 207 and the upper buried portion 208.

As such, the lower buried portion 207 and the upper buried portion 208 may be formed of a low resistivity metal, which has a resistivity lower than that of the work function liner 210L and is a reactive material with respect to the work function liner 210L. When the lower buried portion 207 is formed of tungsten, the gate dielectric layer 206 may be attacked. For example, when tungsten is deposited through a source gas such as tungsten hexafluoride ($WF_6$), the gate dielectric layer 206 may be attacked by fluorine. Therefore, to prevent such a fluorine attack, the lower barrier 211B may be formed between the lower buried portion 207 and the gate dielectric layer 206. The lower barrier 211B may be disposed between the lower buried portion 207 and the work function adjusting liner 210H. The lower barrier 211B may be formed of a material which has a low resistivity. In some examples, when depositing a tungsten layer by a fluorine-free tungsten source, the lower barrier 211B may be omitted.

The first impurity region 213, the second impurity region 214 and the buried gate structure 200G may form a buried gate type transistor. A channel may be defined along the surface of the gate trench 205 between the first impurity region 213 and the second impurity region 214.

According to the second embodiment, the work function adjusting liner 210H may be formed of a material inducing a high work function, and the work function liner 210L may be formed of a material having a low work function.

A threshold voltage Vt may be adjusted by the work function adjusting liner 210H. For example, the threshold voltage may be shifted by the work function adjusting liner 210H. By the work function adjusting liner 210H, a dipole may be generated at an interface between the work function adjusting liner 210H and the gate dielectric layer 206. The dipole may be used to increase the work function of the lower buried portion 207, and thus shift the threshold voltage. As a result, the channel dose may be decreased by the work function adjusting liner 210H.

Since the channel dose may be decreased by the work function adjusting liner 210H, the dose of the local channel doping may be decreased or the local channel doping may be omitted. As a result, in the embodiments, since a channel dose is decreased, junction leakage may be improved.

Moreover, in the second embodiment, since the work function liner 210L has a low work function, gate-induced drain leakage (GIDL) in the first impurity region 213 and the second impurity region 214 may be suppressed. When the work function adjusting liner 210H overlaps with the first impurity region 213 and the second impurity region 214, the gate-induced drain leakage may be increased due to inducing a high work function. Therefore, the work function adjusting liner 210H may be adjusted in height not to overlap with the first impurity region 213 and the second impurity region 214.

While the resistivity of the work function liner 210L may be relatively higher than that of the lower buried portion 207 and the upper buried portion 208, an influence exerted on the resistivity of the gate electrode BG may be minimized by decreasing the rate, that is, the thickness of the work function liner 210L in the gate electrode BG. In the first embodiment, the upper buried portion 108 may be formed of a low work function material, while in the second embodiment, the upper buried portion 208 may be formed of a low resistivity metal and the work function liner 210L may be thinly formed.

In a comparative example, when the work function liner 210L is formed of a low work function metal material, that is an N-type work function metal, the N-type work function metal may have a work function higher than that of N-type doped polysilicon. Therefore, it is difficult to obtain a low work function corresponding to the N-type doped polysilicon through the N-type work function metal. Moreover, even though the work function adjusting liner 210H may be formed of a conductive material having a high work function such as TiAlN, TiAlN has a resistivity higher than that of the tungsten (W) and thus there is a limit to reducing the resistivity of the gate electrode BG in comparison with using a dielectric $Al_2O_3$. Further, since a dipole density generated through TiAlN is lower than that generated by $Al_2O_3$, the shift of the threshold voltage may not be significant.

The buried gate structure 200G in accordance with the second embodiment may be applied to a buried gate type fin channel transistor.

Figure 7A:
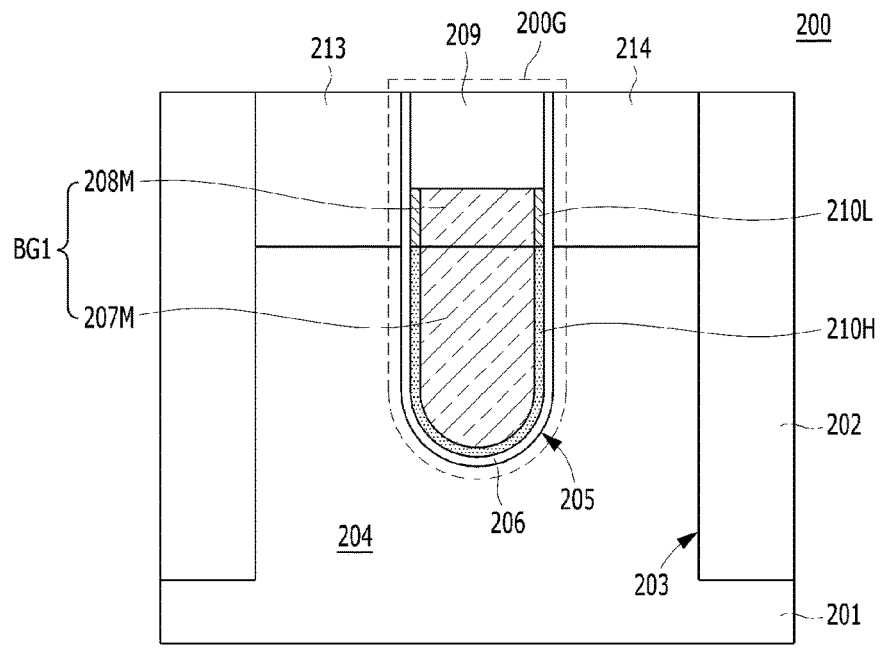
FIGS. 7A to 7C are cross-sectional views illustrating modifications of the second embodiment.
Figure 7B:
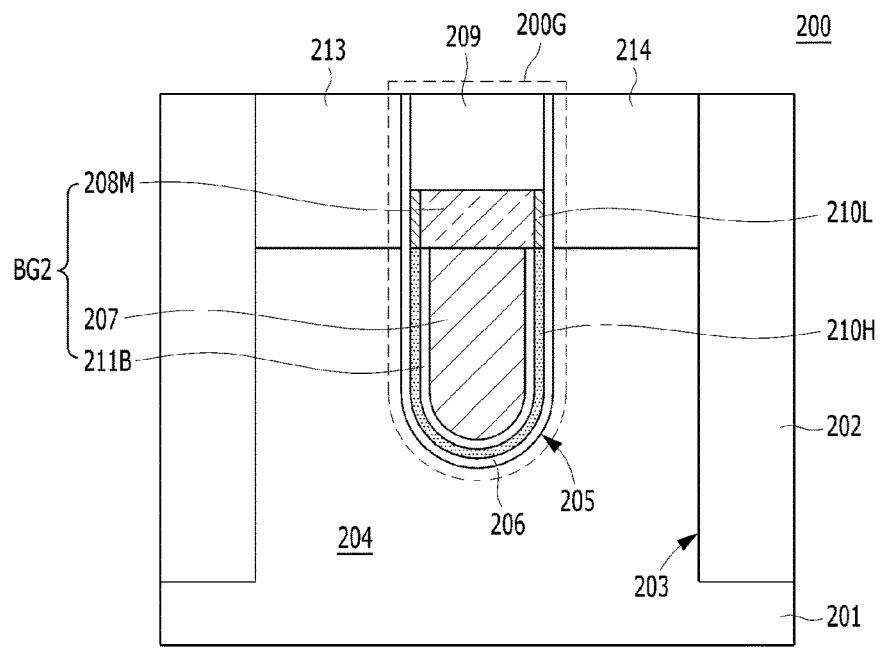
Figure 7C:
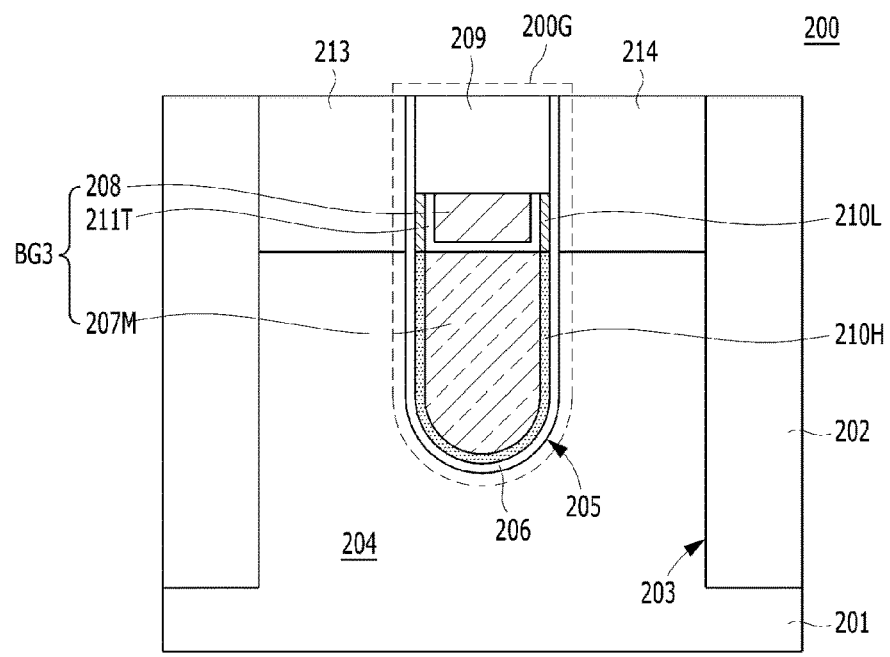

FIGS. 7A to 7C are cross-sectional views illustrating modifications of the second embodiment. Some components of the semiconductor device 200 in accordance with the modifications of the second embodiment may be the same as those of the semiconductor device 200 in accordance with the second embodiment. The remaining components except for gate electrodes BG1, BG2 and BG3 may be the same as those of the second embodiment.

Referring to FIG. 7A, a gate structure 200G of the semiconductor device 200 in accordance with a first modification may include a gate dielectric layer 206, a work function adjusting liner 210H, a gate electrode BG1, a work function liner 210L and a capping layer 209. The gate electrode BG1 may include a lower buried portion 207M and an upper buried portion 208M.

The lower buried portion 207M and the upper buried portion 208M of the gate electrode BG1 may include a low resistivity metal in order to decrease the resistivity of the gate electrode BG1. The lower buried portion 207M and the upper buried portion 208M may include a material which has a resistivity lower than that of the work function liner 210L. The lower buried portion 207M and the upper buried portion 208M may be formed of a non-reactive material with respect to the work function liner 210L. The lower buried portion 207M and the upper buried portion 208M may include titanium nitride. When the upper buried portion 208M is formed of titanium nitride, the upper buried portion 208M may not react with the work function liner 210L. Therefore, an upper barrier between the upper buried portion 208M and the work function liner 210L may be omitted. Moreover, the lower buried portion 207M may be formed of a material which does not attack the gate dielectric layer 206. For example, the lower buried portion 207M may be formed of a material which does not contain impurities such as fluorine. Therefore, a lower barrier between the lower buried portion 207M and the gate dielectric layer 206 may be omitted. The lower buried portion 207M may include titanium nitride.

As such, since the lower buried portion 207M and the upper buried portion 208M may not react with the work function liner 210L and may not contain fluorine, the gate electrode BG1 may become a barrier-less gate electrode.

Referring to FIG. 7B, the gate structure 200G of the semiconductor device 200 in accordance with a second modification may include a gate dielectric layer 206, a work function adjusting liner 210H, a gate electrode BG2, a work function liner 210L and a capping layer 209. The gate electrode BG2 may include a lower buried portion 207 and an upper buried portion 208M.

The lower buried portion 207 and the upper buried portion 208M of the gate electrode BG2 may include a low resistivity metal in order to reduce the resistivity of the gate electrode BG2. The lower buried portion 207 and the upper buried portion 208M may include a material which has a resistivity lower than that of the work function liner 210L. The lower buried portion 207 may be formed of a reactive material with respect to the work function liner 210L. The upper buried portion 208M may be formed of a material which is not reactive with the work function liner 210L. The lower buried portion 207 may include tungsten, and the upper buried portion 208M may include titanium nitride. When the upper buried portion 208M is formed of titanium nitride, the upper buried portion 208M may not react with the work function liner 210L. Therefore, an upper barrier between the upper buried portion 208M and the work function liner 210L may be omitted. When the lower buried portion 207 includes tungsten, a lower barrier 211B may be needed to prevent a fluorine attack on the gate dielectric layer 206. The lower barrier 211B may include titanium nitride.

Referring to FIG. 7C, the gate structure 200G of the semiconductor device 200 in accordance with the third modification may include a gate dielectric layer 206, a work function adjusting liner 210H, a gate electrode BG3, a work function liner 210L and a capping layer 209. The gate electrode BG3 may include a lower buried portion 207M and an upper buried portion 208.

The lower buried portion 207M and the upper buried portion 208 of the gate electrode BG3 may include a low resistivity metal in order to reduce the resistivity of the gate electrode BG3. The lower buried portion 207M and the upper buried portion 208 may include a material which has a resistivity lower than that of the work function liner 210L. The lower buried portion 207M may be formed of a material which is not reactive with the work function liner 210L. The upper buried portion 208 may be formed of a reactive material with respect to the work function liner 210L. The lower buried portion 207M may include titanium nitride, and the upper buried portion 208 may include tungsten. When the upper buried portion 208 is formed of tungsten, the upper buried portion 208 may react with the work function liner 210L. Therefore, an upper barrier 211T may be formed between the upper buried portion 208 and the work function liner 210L. When the lower buried portion 207M includes titanium nitride, the lower barrier may be omitted due to absence of a fluorine attack on the gate dielectric layer 206. The upper barrier 211T may include titanium nitride.

The above described modifications may be applied to a buried gate type fin channel transistor.

Hereinafter, a method for manufacturing the semiconductor device in accordance with the second embodiment will be described.

FIGS. 8A to 8G are cross-sectional views describing an example of a method for manufacturing the semiconductor device in accordance with the second embodiment.

Figure 8A:
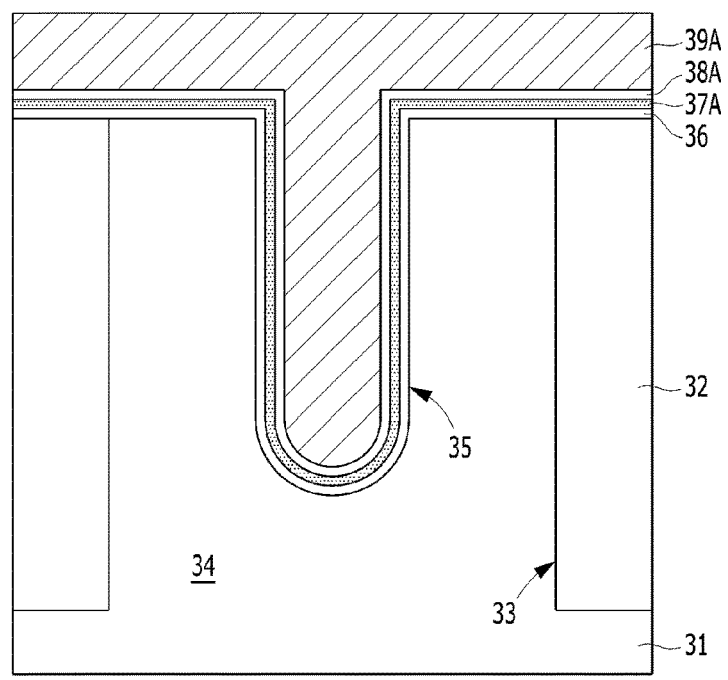
FIGS. 8A to 8G are cross-sectional views describing an example of a method for manufacturing the semiconductor device in accordance with the second embodiment.

As shown in FIG. 8A, an isolation layer 32 may be formed in a substrate 31. An active region 34 may be defined by an isolation layer 32.

A gate trench 35 may be formed in the substrate 31.

A gate dielectric layer 36 may be formed on the surface of the gate trench 35.

A work function adjusting liner layer 37A may be formed on the gate dielectric layer 36. The work function adjusting liner layer 37A may be conformally formed on the surface of the gate dielectric layer 36. The work function adjusting liner layer 37A may include a material that generates a dipole at an interface with the gate dielectric layer 16 and induces a high work function due to an energy band change. The work function adjusting liner layer 37A may include a material which has oxygen content per unit volume greater than that of $SiO_2$. For example, the work function adjusting liner layer 37A may include one or more of aluminum oxide ($Al_2O_3$), titanium oxide ($TiO_2$), hafnium oxide ($HfO_2$), zirconium oxide ($ZrO_2$) and magnesium oxide (MgO). In the embodiments, the work function adjusting liner layer 37A may include $Al_2O_3$. As the work function adjusting liner layer 37A may be formed of aluminum oxide, it is possible to maintain a stable interface with the gate dielectric layer 36. The work function adjusting liner layer 37A may be formed thin.

A first low resistivity layer 39A may be formed on the work function adjusting liner layer 37A. The first low resistivity layer 39A may fill the gate trench 35. The first low resistivity layer 39A may include a low resistivity metal material. The first low resistivity layer 39A may be formed of a reactive material with respect to a work function liner layer to be subsequently formed. The first low resistivity layer 39A may include tungsten. When tungsten contains fluorine, a lower barrier layer 38A may be formed before forming the first low resistivity layer 39A. The lower barrier layer 38A may be conformally formed on the surface of the work function adjusting liner layer 37A.

The lower barrier layer 38A may be formed of a metal-containing material. The lower barrier layer 38A may include a metal nitride. For example, the lower barrier layer 38A may include titanium nitride. The lower barrier layer 38A may become a lower barrier by a subsequent recessing process. In another example, the first low resistivity layer 39A may be formed of a material which does not contain an impurity such as fluorine in order to prevent an attack on the gate dielectric layer 36. Moreover, the first low resistivity layer 39A may be formed of a material which is not reactive with a subsequent work function liner layer. In another example, the first low resistivity layer 39A may be formed of titanium nitride. The first low resistivity layer 39A may be formed by a chemical vapor deposition (CVD) process or an atomic layer deposition (ALD) process.

Figure 8B:
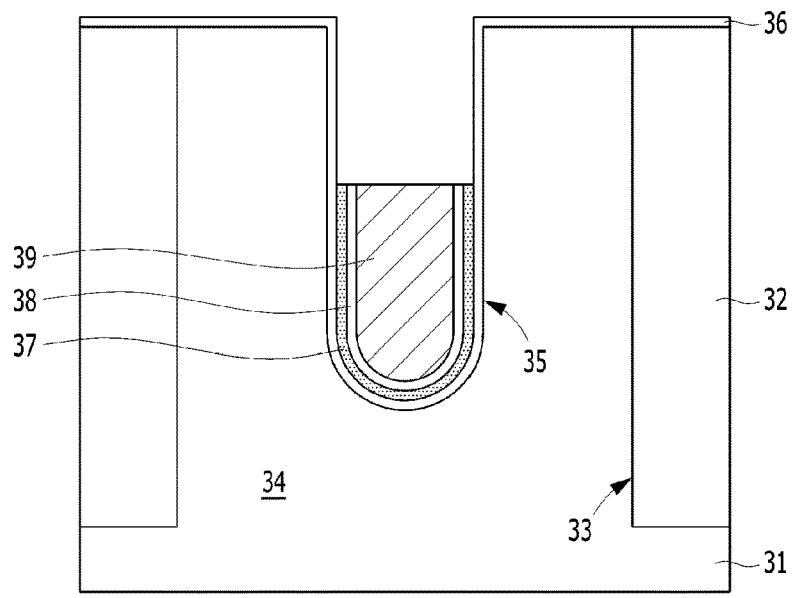

As shown in FIG. 8B, a recessing process may be performed in such a manner that a lower buried portion 39 and a work function adjusting liner 37 remain in the gate trench 35. The work function adjusting liner 37 may be formed by an etch-back process on the work function adjusting liner layer 37A. The lower buried portion 39 may be formed by an etch-back process on the first low resistivity layer 39A. By the recessing process, the lower barrier layer 38A may also be recessed. As a result, a lower barrier 38 may be formed. The lower barrier 38 may be disposed between the lower buried portion 39 and the gate dielectric layer 36. The top surfaces of the work function adjusting liner 37, the lower barrier 38 and the lower buried portion 39 may be at the same level. The work function adjusting liner 37, the lower barrier 38 and the lower buried portion 39 may be recessed to be lower than the top surface of the active region 34.

Figure 8C:
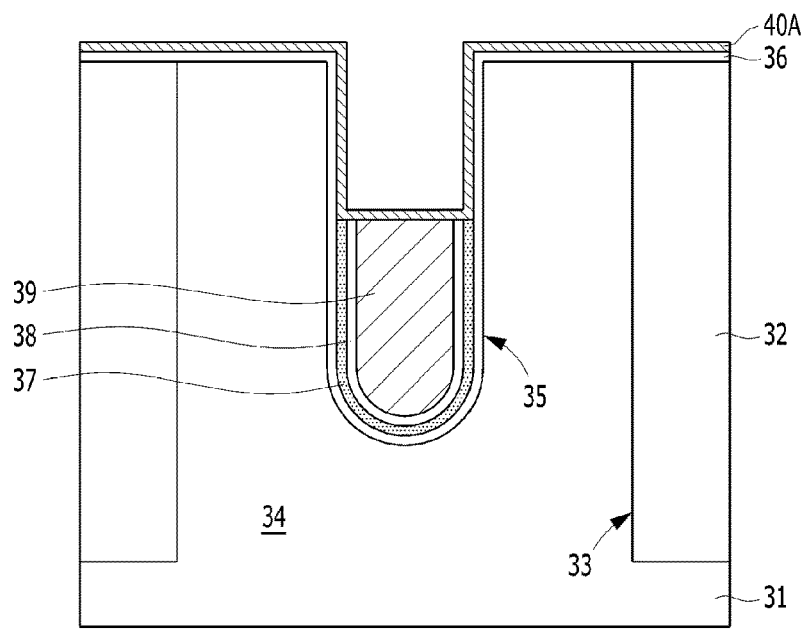

As shown in FIG. 8C, a work function liner layer 40A may be formed. The work function liner layer 40A may include a material having a low work function. The work function liner layer 40A may be formed of a non-metal material. The work function liner layer 40A may include N-type impurity-doped polysilicon.

Figure 8D:
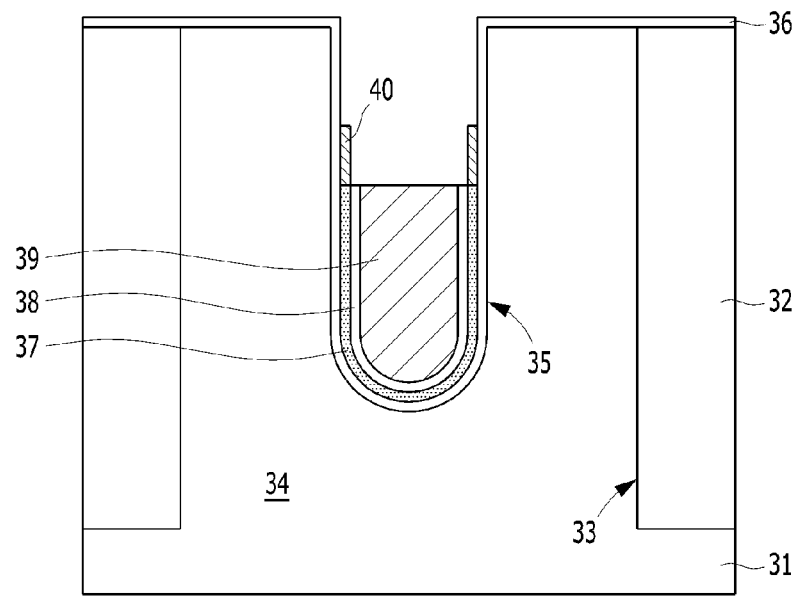
Figure 8E:
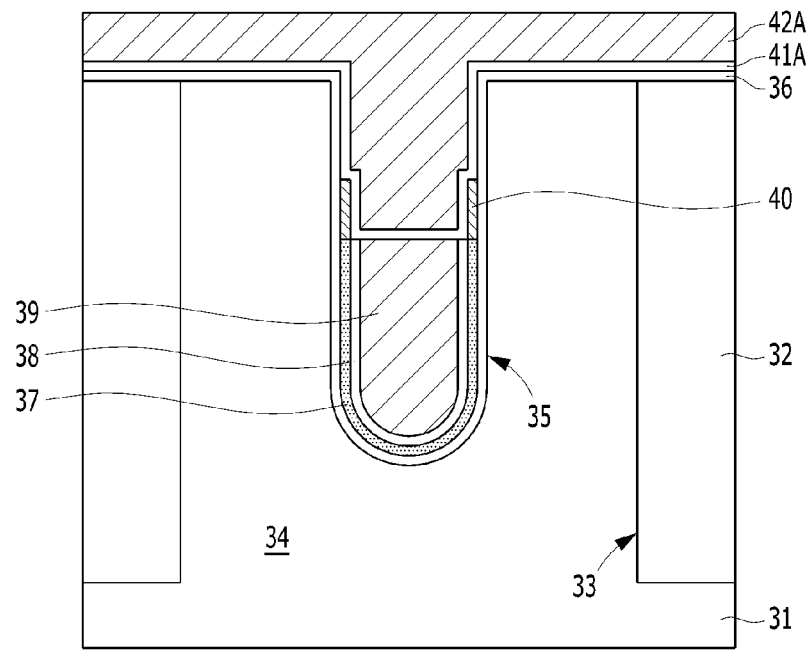

As shown in FIG. 8D, a work function liner 40 may be formed. The work function liner 40 may be formed by an etch-back process on the work function liner layer 40A. The work function liner 40 may be recessed to be lower than the top surface of the substrate 31. The work function liner 40 may contact the work function adjusting liner 37. The top surfaces of the lower buried portion 39 and the lower barrier 38 may be exposed by the work function liner 40.

As shown in 8E, a second low resistivity layer 42A may fill the gate trench 35. The second low resistivity layer 42A may include a low resistivity metal material. The second low resistivity layer 42A may be formed of a reactive material with respect to the work function liner 40. The second low resistivity layer 42A may include tungsten. Before forming the second low resistivity layer 42A, an upper barrier layer 41A may be formed. The upper barrier layer 41A may be conformally formed on the surface of the work function liner 40. The upper barrier layer 41A may be formed of a metal-containing material. The upper barrier layer 41A may include a metal nitride. For example, the upper barrier layer 41A may include titanium nitride. The upper barrier layer 41A may become an upper barrier by a subsequent recessing process. In another example, the second low resistivity layer 42A may be formed of a material which is not reactive with the work function liner 40. In another example, the second low resistivity layer 42A may be formed of titanium nitride. When the second low resistivity layer 42A is formed of titanium nitride, an upper barrier layer may be omitted. The second low resistivity layer 42A may be formed by a chemical vapor deposition (CVD) process or an atomic layer deposition (ALD) process.

Figure 8F:
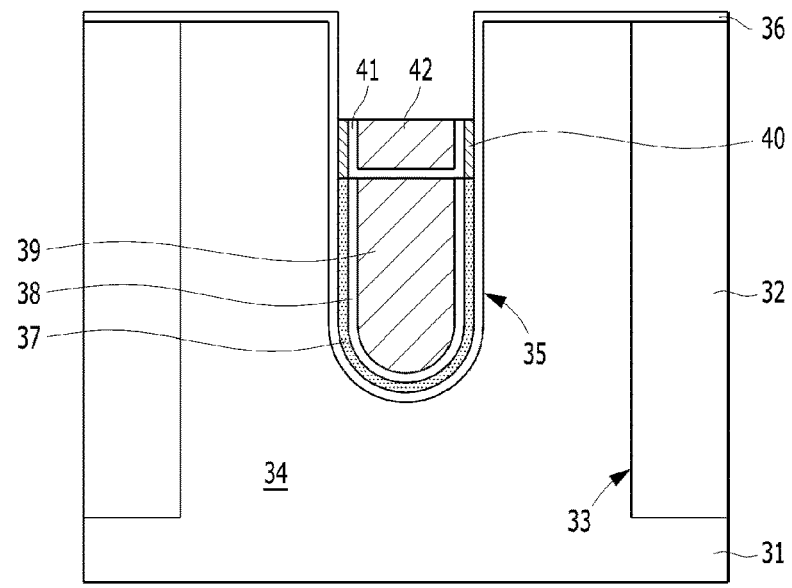

As shown in FIG. 8F, a recessing process may be performed in such a manner that an upper buried portion 42 and an upper barrier 41 remain in the gate trench 35. The upper buried portion 42 may be formed by an etch-back process on the second low resistivity layer 42A. By the recessing process, the upper barrier layer 41A may also be recessed. As a result, the upper barrier 41 may be formed. The upper barrier 41 may be positioned between the upper buried portion 42 and the work function liner 40. The top surfaces of the work function liner 40, the upper barrier 41 and the upper buried portion 42 may be at the same level. The work function liner 40, the upper barrier 41 and the upper buried portion 42 may be recessed to be lower than the top surface of the active region 34.

Figure 8G:
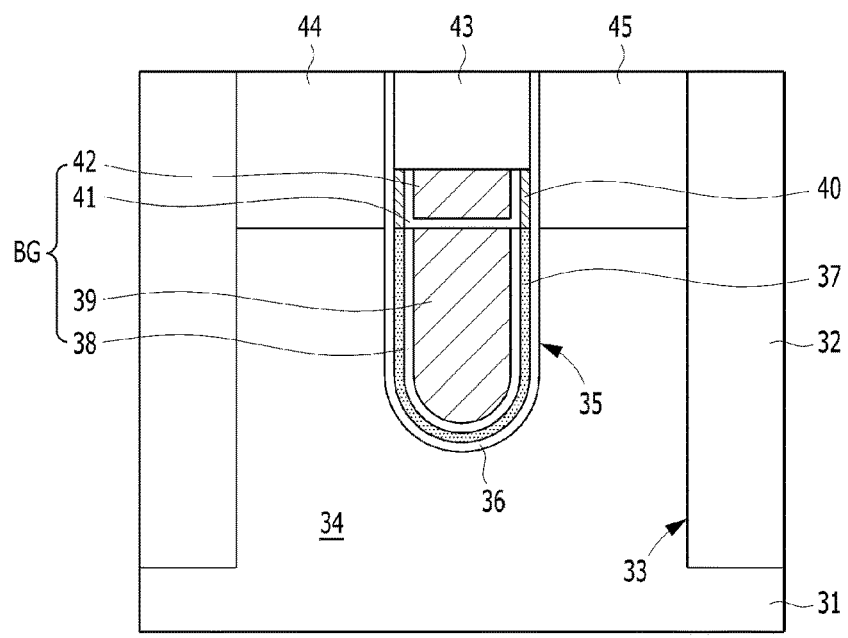

As shown in FIG. 8G, a capping layer 43 may be formed on the upper buried portion 42. The capping layer 43 may include a dielectric material. The capping layer 43 may fill the gate trench 35 on the upper buried portion 42. The capping layer 43 may include silicon nitride. Subsequently, a planarization process on the capping layer 43 may be performed until the top surface of the substrate 31 is exposed. When or after performing the planarization process on the capping layer 43, the gate dielectric layer 36 on the top surface of the substrate 31 may be removed.

According to the above processes, a buried gate structure may be formed. The buried gate structure may include the gate dielectric layer 36, the work function adjusting liner 37, the gate electrode BG and the capping layer 43. The gate electrode BG may include the lower barrier 38, the lower buried portion 39, the upper barrier 41 and the upper buried portion 42. The work function adjusting liner 37 may be positioned between the lower buried portion 39 of the gate electrode BG and the gate dielectric layer 36. The work function liner 40 may be positioned between the upper buried portion 42 of the gate electrode BG and the gate dielectric layer 36. The top surface of the gate electrode BG may be positioned at a level lower than the top surface of the substrate 31. Thus, as the top surface of the gate electrode BG is recessed to be low, it is possible to secure the distance between the gate electrode BG and other conductive structures such as a contact plug. As a result, insulation internal pressure between the gate electrode BG and other conductive structures may be improved.

After forming the capping layer 43, an impurity doping process may be performed by implantation or another doping technology. Thus, a first impurity region 44 and a second impurity region 45 may be formed in the substrate 31. When performing the impurity doping process, the capping layer 43 may be used as a barrier. The first impurity region 44 and the second impurity region 45 may respectively become a source region and a drain region. The gate dielectric layer 36 on the top surface of the substrate 31 may be removed after the impurity doping process.

The first impurity region 44 and the second impurity region 45 may have a depth that overlaps with the work function liner 40. Therefore, the work function liner 40 may overlap with the first and second impurity regions 44 and 45.

In another example, the first impurity region 44 and the second impurity region 45 may be formed before the gate trench 35. For example, after an impurity region is formed by doping an impurity in the active region 34 through ion implantation, the gate trench 35 may be formed. The impurity region may be divided into the first impurity region 44 and the second impurity region 45 by the gate trench 35.

Figure 9:
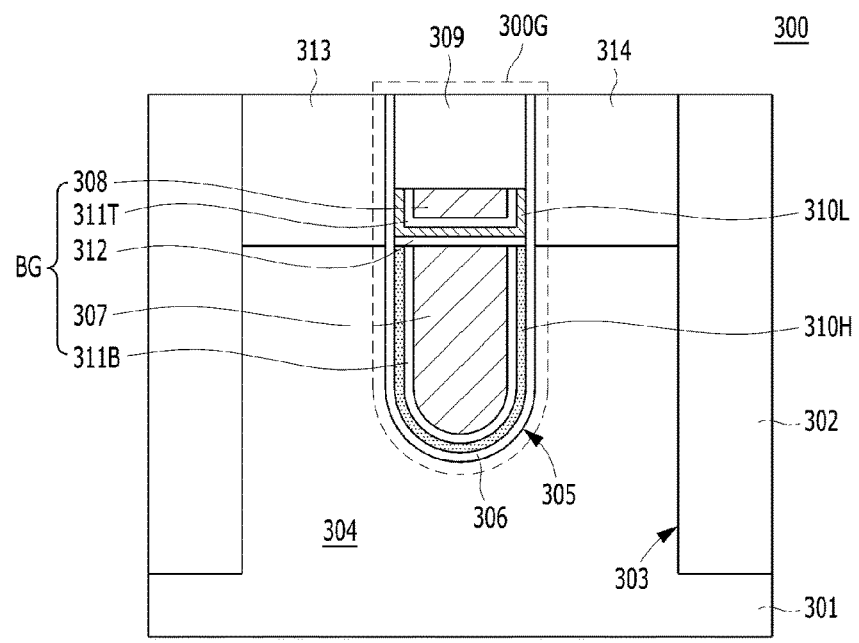
FIG. 9 is a cross-sectional view illustrating a semiconductor device in accordance with a third embodiment.

FIG. 9 is a cross-sectional view illustrating a semiconductor device in accordance with a third embodiment. Some components of the semiconductor device 300 except for a buried gate structure 300G may be the same as those of the semiconductor devices 100 and 200 in accordance with the first and second embodiments, respectively.

The semiconductor device 300 may be formed in a substrate 301. The buried gate structure 300G of the semiconductor device 300 may be embedded in a gate trench 305. The buried gate structure 300G may be disposed in an active region 304 between a first impurity region 313 and a second impurity region 314, and extend in an isolation layer 302. The isolation layer 302 may be formed by filling an isolation trench 303 with a dielectric material.

The buried gate structure 300G may include a gate dielectric layer 306, a gate electrode BG, a work function adjusting liner 310H, a capping layer 309 and a work function liner 310L. The gate electrode BG may positioned at a level lower than the top surface of the active region 304. The gate electrode BG may partially fill the gate trench 305. The capping layer 309 may be positioned on the gate electrode BG. The gate dielectric layer 306 may be formed on the bottom surface and the sidewalls of the gate trench 305. The work function adjusting liner 310H may be positioned between the gate electrode BG and the gate dielectric layer 306.

The gate electrode BG may include a lower barrier 311B, a lower buried portion 307, an intermediate barrier 312, an upper barrier 311T and an upper buried portion 308. The upper buried portion 308 may be positioned on the lower buried portion 307, and the upper buried portion 308 may overlap with the first impurity region 313 and the second impurity region 314. The upper buried portion 308 may partially fill the gate trench 305 on the lower buried portion 307. The top surface of the upper buried portion 308 may be at a level lower than the top surface of the substrate 301. The upper buried portion 308 may overlap with the first and second impurity regions 313 and 314, and the gate dielectric layer 306 may be interposed therebetween. The capping layer 309 may be formed over the upper buried portion 308.

The work function adjusting liner 310H may be formed of the same material as that of the work function adjusting liner 110 in accordance with the first embodiment. The work function adjusting liner 310H may include a material that generates a dipole and induces a high work function due to an energy band change. The work function adjusting liner 310H may be different form the gate dielectric layer 306 in oxygen content. The work function adjusting liner 310H may be formed of a high oxygen containing-metal oxide which has oxygen content per unit volume greater than that of the gate dielectric layer 306. When the gate dielectric layer 106 is formed of $SiO_2$, the work function adjusting liner 310H may include one or more of aluminum oxide ($Al_2O_3$), titanium oxide ($TiO_2$), hafnium oxide ($HfO_2$), zirconium oxide ($ZrO_2$) and magnesium oxide (MgO). In the embodiments, work function adjusting liner 310H may include $Al_2O_3$. As the work function adjusting liner 310H is formed of aluminum oxide, it is possible to maintain a stable interface with the gate dielectric layer 306. The work function adjusting liner 310H may be formed thin. As a result, the volume of the lower buried portion 307 in the gate trench 305 may be increased so that the resistivity of the gate electrode BG may be reduced. In another example, when the lower buried portion 307 is formed of a material having a first high work function, a second high work function higher than the first high work function may be induced by the work function adjusting liner 310H.

The work function liner 310L may have a work function lower than the mid-gap work function of silicon. For example, the work function liner 310L may be lower than 4.5 eV. The work function liner 310L may include a non-metal material. The work function liner 310L may include a silicon-containing material which contains an N-type dopant. In the embodiments, the work function liner 310L may include polysilicon which contains an N-type dopant (hereinafter, referred to as N-type doped polysilicon). The N-type doped polysilicon may have a low work function. The N-type dopant may include one or more of N-phosphorous (Ph) and arsenic (As). The work function liner 310L may overlap with the first impurity region 313 and the second impurity region 314. For example, the work function liner 310L may horizontally overlap with the first impurity region 313 and the second impurity region 314. The work function liner 310L may have a different shape from that of the work function liner 310L in accordance with the second embodiment. That is, the work function liner 310L may be positioned between the upper buried portion 308 and the lower buried portion 307. Thus, an intermediate barrier 312 may be formed in order to prevent the reaction of the work function liner 310L with the lower buried portion 307. The work function liner 310L may be positioned between the upper buried portion 308 and the first and second impurity regions 313 and 314. The work function liner 310L may contact the work function adjusting liner 310H. The thickness of the work function liner 310L may be the same as or different from that of the work function adjusting liner 310H.

The lower buried portion 307 and the upper buried portion 308 of the gate electrode BG may include a low resistivity metal in order to reduce the resistivity of the gate electrode BG. The lower buried portion 307 and the upper buried portion 308 may include a material which has a resistivity lower than that of the work function liner 310L. The lower buried portion 307 and the upper buried portion 308 may be formed of a reactive material with respect to the work function liner 310L. That is, the lower buried portion 307 and the upper buried portion 308 may be formed of a material which is likely to react with the work function liner 310L. For example, the lower buried portion 307 and the upper buried portion 308 may be formed of tungsten (W). In order to prevent the silicide formation reaction of the upper buried portion 308 with the work function liner 310L, an upper barrier 311T may be formed between the upper buried portion 308 and the work function liner 310L.

As such, the lower buried portion 307 and the upper buried portion 308 may be formed of a low resistivity metal, which has a resistivity lower than that of the work function liner 310L and is reactive with the work function liner 310L. Since the lower buried portion 307 is formed of tungsten, the gate dielectric layer 306 may be attacked. For example, when tungsten is deposited through a source gas such as tungsten hexafluoride ($WF_6$), the gate dielectric layer 306 may be attacked by fluorine. Therefore, to prevent such a fluorine attack, a lower barrier 311B may be formed between the lower buried portion 307 and the gate dielectric layer 306. The lower barrier 311B may be positioned between the lower buried portion 307 and the work function adjusting liner 310H. The lower barrier 311B may be formed of a material which has a low resistivity. In some examples, when depositing a tungsten layer through a fluorine-free tungsten source, the lower barrier 311B may be omitted.

The first impurity region 313, the second impurity region 314 and the buried gate structure 300G may form a buried gate type transistor. A channel may be defined along the surface of the gate trench 305 between the first impurity region 313 and the second impurity region 314.

According to the third embodiment, the work function adjusting liner 310H may be formed of a material which induces a high work function, and work function liner 310L may be formed of a material having a low work function.

By the work function adjusting liner 310H, a threshold voltage Vt may be adjusted. For example, the threshold voltage may be shifted by the work function adjusting liner 310H. A dipole may be formed at an interface between the work function adjusting liner 310H and the gate dielectric layer 306 by the work function adjusting liner 310H. The dipole may be used to increase the work function of the lower buried portion 307, and thus shift the threshold voltage. As a result, the channel dose may be decreased by the work function adjusting liner 310H.

Since the channel dose may be decreased by the work function adjusting liner 310H, the dose of the local channel doping may be decreased or the local channel doping may be omitted. As a result, in the embodiments, since a channel dose is decreased, junction leakage may be improved.

Moreover, in the third embodiment, since the work function liner 310L has a low work function, gate induced drain leakage (GIDL) in the first impurity region 313 and the second impurity region 314 may be suppressed. When the work function adjusting liner 310H overlaps with the first impurity region 313 and the second impurity region 314, gate induced drain leakage may be increased due to inducing a high work function. Therefore, the work function adjusting liner 310H may be adjusted in height not to overlap with the first impurity region 313 and the second impurity region 314.

While the resistivity of the work function liner 310L may be higher than those of the lower buried portion 307 and the upper buried portion 308, the influence exerted on the resistivity of the gate electrode BG may be minimized by decreasing the rate, that is, the thickness of the work function liner 310L.

In a comparative example, when the work function liner 310L is formed of a low work function metal material, that is, an N-type work function metal, the N-type work function metal may have a work function greater than that of n-type doped polysilicon. Therefore, it is difficult to obtain a low work function corresponding to the N-type doped polysilicon through the N-type work function metal. Moreover, when the work function adjusting liner 310H is formed as a conductive material having a high work function such as TiAlN, TiAlN has a resistivity higher than that of the tungsten (W) and thus there is a limit to reducing the resistivity of the gate electrode BG in comparison with dielectric $Al_2O_3$. Moreover, since a dipole density generated through TiAlN is lower than that generated by $Al_2O_3$, the shift of the threshold voltage may not be significant.

The buried gate structure 300G in accordance with the third embodiment may be applied to a buried gate type fin channel transistor.

Figure 10A:
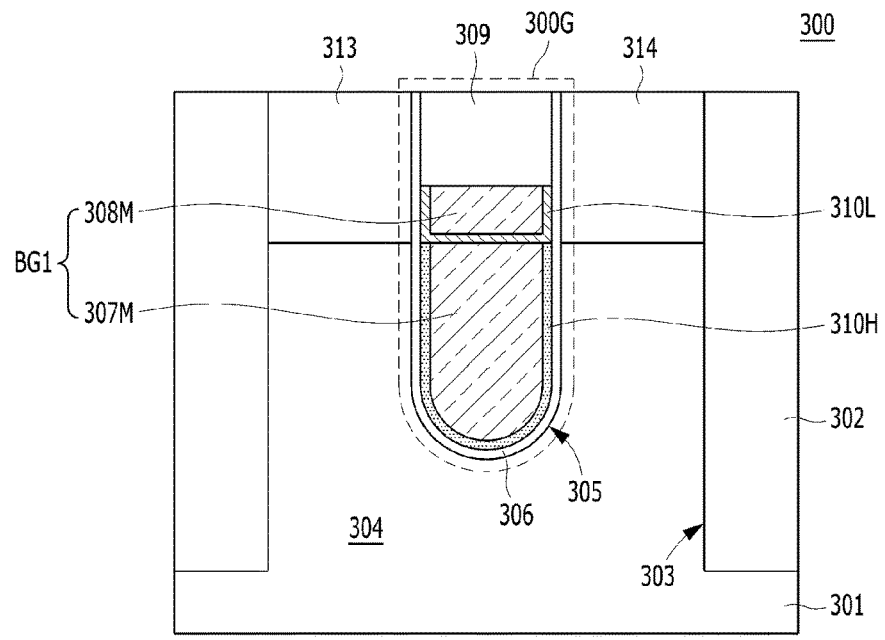
FIGS. 10A to 10C are cross-sectional views illustrating modifications of the third embodiment.
Figure 10B:
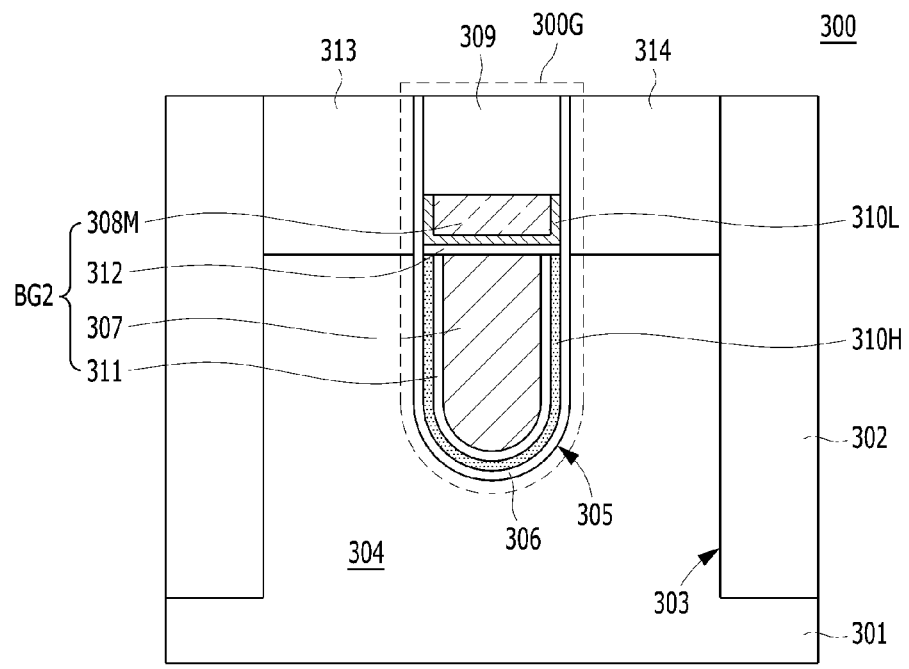
Figure 10C:
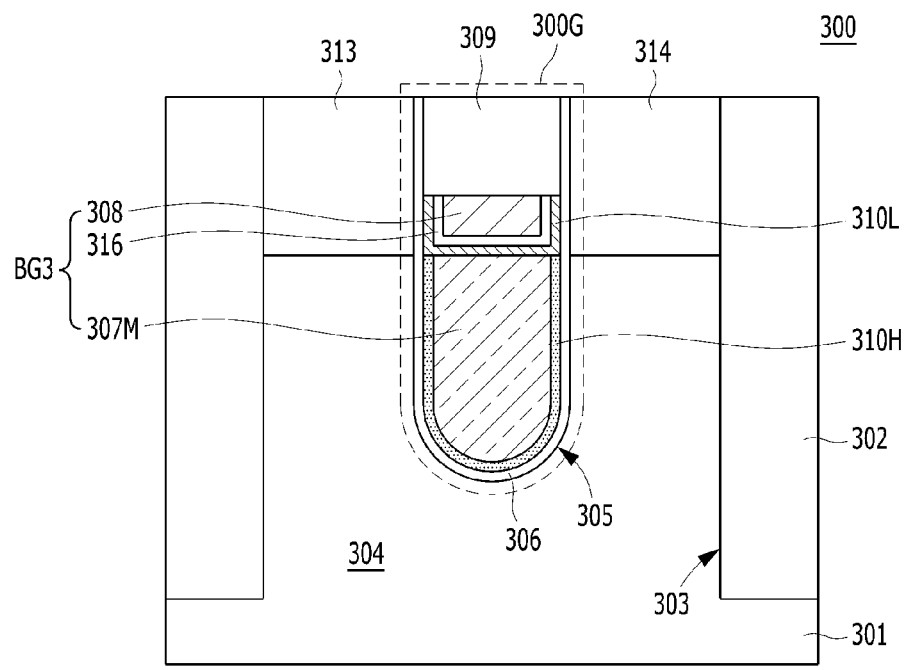

FIGS. 10A to 10C are cross-sectional views illustrating modifications of the third embodiment. Some components of the semiconductor device 300 in accordance with the modifications of the third embodiment may be the same as those of the semiconductor device 300 in accordance with the third embodiment. The remaining components except for gate electrodes BG1, BG2 and BG3 may be the same as those of the third embodiment.

Referring to FIG. 10A, the gate structure 300G of the semiconductor device 300 in accordance with a first modification may include a gate dielectric layer 306, a work function liner 310H, a gate electrode BG1, a work function liner 310L and a capping layer 309. The gate electrode BG1 may include a lower buried portion 307M and an upper buried portion 308M.

The lower buried portion 307M and the upper buried portion 308M of the gate electrode BG1 may include a low resistivity metal in order to reduce the resistivity of the gate electrode BG1. The lower buried portion 307M and the upper buried portion 308M may include a material which has a resistivity lower than that of the work function liner 310L. The lower buried portion 307M and the upper buried portion 308M may be formed of a material which is not reactive with the work function liner 310L. The lower buried portion 307M and the upper buried portion 308M may include titanium nitride. When the upper buried portion 308M is formed of titanium nitride, the upper buried portion 308M may not react with the work function liner 310L. Therefore, an upper barrier between the upper buried portion 308M and the work function liner 310L may be omitted. Moreover, the lower buried portion 307M may be formed of a material which does not attack the gate dielectric layer 306. For example, the lower buried portion 307M may be formed of a material which does not contain an impurity such as fluorine. Therefore, a lower barrier between the lower buried portion 307M and the gate dielectric layer 306 may be omitted. Moreover, an intermediate barrier between the lower buried portion 307M and the work function liner 310L may be omitted. The lower buried portion 307M may include titanium nitride.

As such, since the lower buried portion 307M and the upper buried portion 308M may be formed of a material that is not reactive with the work function liner 310L and does not contain fluorine, the gate electrode BG1 may become a barrier-less gate electrode.

Referring to FIG. 10B, the gate structure 300G of the semiconductor device 300 in accordance with a second modification may include a gate dielectric layer 306, a work function liner 310H, a gate electrode BG2, a work function liner 310L and a capping layer 309. The gate electrode BG2 may include a lower buried portion 307 and an upper buried portion 308M.

The lower buried portion 307 and the upper buried portion 308M of the gate electrode BG2 may include a low resistivity metal in order to reduce the resistivity of the gate electrode BG2. The lower buried portion 307 and the upper buried portion 308M may include a material which has a resistivity lower than that of the work function liner 310L. The lower buried portion 307 may be formed of a reactive material with respect to the work function liner 310L. The upper buried portion 308M may be formed of a material which is not reactive with the work function liner 310L. The lower buried portion 307 may include tungsten, and the upper buried portion 308M may include titanium nitride. When the upper buried portion 308M may be formed of titanium nitride, the upper buried portion 308M does not react with the work function liner 310L. Therefore, an upper barrier between the upper buried portion 308M and the work function liner 310L may be omitted. When the lower buried portion 307 includes tungsten, a lower barrier 311B may be of need in order to prevent a fluorine attack on the gate dielectric layer 306. Moreover, an intermediate barrier 312 may be of need between the work function liner 310L and the lower buried portion 307. The intermediate barrier 312 and the lower barrier 311B may include titanium nitride.

Referring to FIG. 10C, the gate structure 300G of the semiconductor device 300 in accordance with a third modification may include a gate dielectric layer 306, a work function liner 310H, a gate electrode BG3, a work function liner 310L and a capping layer 309. The gate electrode BG3 may include a lower buried portion 307M and an upper buried portion 308.

The lower buried portion 307M and the upper buried portion 308 of the gate electrode BG3 may include a low resistivity metal in order to reduce the resistivity of the gate electrode BG3. The lower buried portion 307M and the upper buried portion 308 may include a material which has a resistivity lower than that of the work function liner 310L. The lower buried portion 307M may be formed of a material which is not reactive with the work function liner 310L. The upper buried portion 308 may be formed of a reactive material with respect to the work function liner 310L. When the lower buried portion 307M includes titanium nitride, the upper buried portion 308 may include tungsten. When the upper buried portion 308 is formed of tungsten, the upper buried portion 308 may react with the work function liner 310L. Therefore, an upper barrier 311T may be formed between the upper buried portion 308 and the work function liner 310L. When the lower buried portion 307M includes titanium nitride, the gate dielectric layer 306 may not be attacked by fluorine and thus a lower barrier may be omitted. Moreover, an intermediate barrier may be omitted between the lower buried portion 307M and the work function liner 310L. The upper barrier 311T may include titanium nitride.

The modifications described above may be applied to a buried gate type fin channel transistor.

Hereinafter, a method for manufacturing the semiconductor in accordance with the third embodiment will be described.

FIGS. 11A to 11F are cross-sectional views describing a method for manufacturing the semiconductor device in accordance with the third embodiment. The method in accordance with the third embodiment may be similar to the method in accordance with the second embodiment.

Figure 11A:
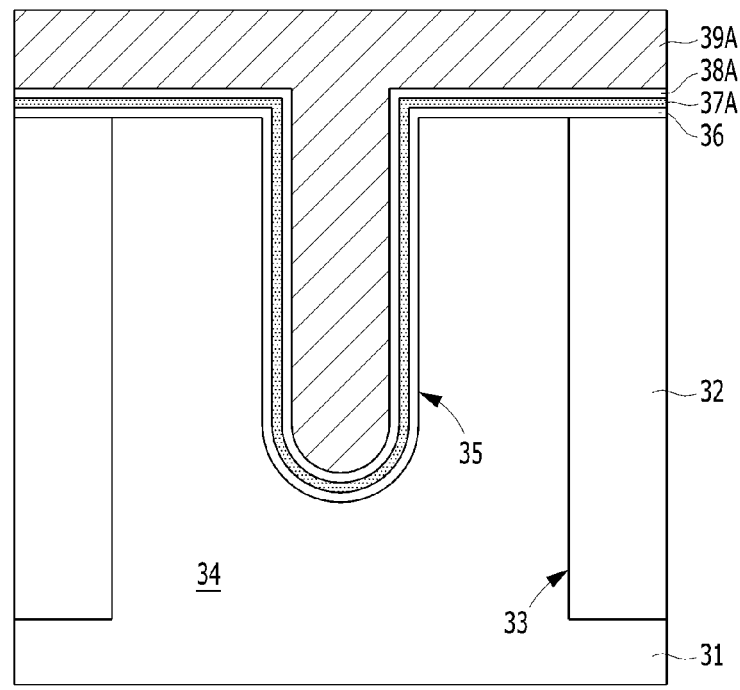
FIGS. 11A to 11F are cross-sectional views describing an example of a method for manufacturing the semiconductor device in accordance with the third embodiment.

As shown in FIG. 11A, an isolation layer 32 may be formed in a substrate 31. An active region 34 may be defined by the isolation layer 32.

A gate trench 35 may be formed in the substrate 31. A gate dielectric layer 36 may be formed on the surface of the gate trench 35. A work function adjusting liner layer 37A may be formed on the gate dielectric layer 36. The work function adjusting liner layer 37A may be conformally formed on the surface of the gate dielectric layer 36. The work function adjusting liner layer 37A may include a material that generates a dipole at an interface with the gate dielectric layer 36 and induces a high work function due to an energy band change. The work function adjusting liner layer 37A may include one or more of aluminum oxide ($Al_2O_3$), titanium oxide ($TiO_2$), hafnium oxide ($HfO_2$), zirconium oxide ($ZrO_2$) and magnesium oxide (MgO). In the embodiments, the work function adjusting liner layer 37A may include $Al_2O_3$. As the work function adjusting liner layer 37A is formed of aluminum oxide, it is possible to maintain a stable interface with the gate dielectric layer 36. The work function adjusting liner layer 37A may be formed thin.

A first low resistivity layer 39A may be formed on the work function adjusting liner layer 37A. The first low resistivity layer 39A may fill the gate trench 35. The first low resistivity layer 39A may include a low resistivity metal material. The first low resistivity layer 39A may be formed of a reactive material with respect to a subsequent work function liner layer. The first low resistivity layer 39A may include tungsten. When tungsten contains fluorine, a lower barrier layer 38A may be formed before forming the first low resistivity layer 39A. The lower barrier layer 38A may be conformally formed on the surface of the work function adjusting liner layer 37A. The lower barrier layer 38A may be formed of a metal-containing material. The lower barrier layer 38A may include a metal nitride. For example, the lower barrier layer 38A may include titanium nitride. The lower barrier layer 38A may become a lower barrier by a subsequent recessing process. In another example, the first low resistivity layer 39A may be formed of a material which does not contain impurities such as fluorine in order to prevent an attack on the gate dielectric layer 36. Moreover, the first low resistivity layer 39A may be formed of a material which is not reactive with a subsequent work function liner layer. In another example, the first low resistivity layer 39A may be formed of titanium nitride. The first low resistivity layer 39A may be formed by a chemical vapor deposition (CVD) process or an atomic layer deposition (ALD) process.

Figure 11B:
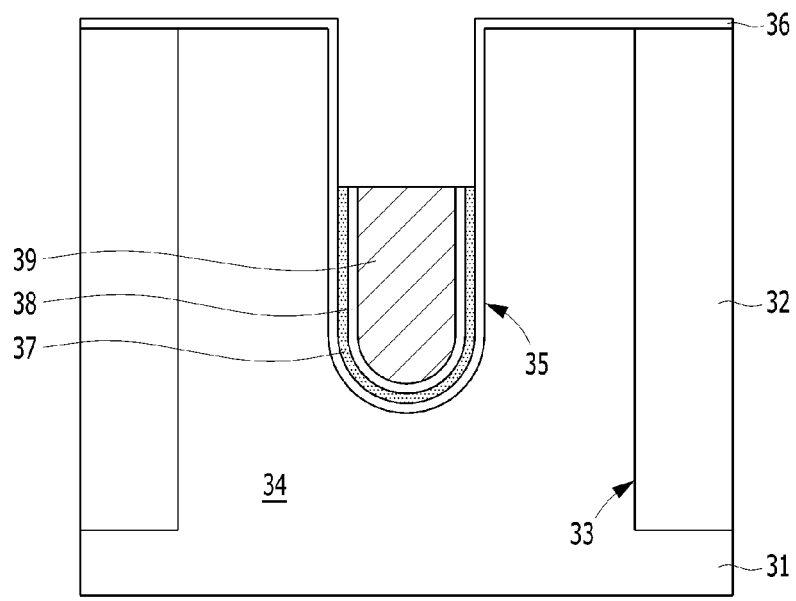

As shown in FIG. 11b, a recessing process may be performed in such a manner that a lower buried portion 39 and a work function adjusting liner 37 remain in the gate trench 35. The work function adjusting liner 37 may be formed by an etch-back process on the work function adjusting liner layer 37A. The lower buried portion 39 may be formed by an etch-back process on the first low resistivity layer 39A. The lower barrier layer 38A may also be recessed by the recessing process. Thus, a lower barrier 38 may be formed. The lower barrier 38 may be positioned between the lower buried portion 39 and the gate dielectric layer 36. The top surfaces of the work function adjusting liner 37, the lower barrier 38 and the lower buried portion 39 may be at the same level. The work function adjusting liner 37, the lower barrier 38 and the lower buried portion 39 may be recessed to be lower than the top surface of the active region 34.

Figure 11C:
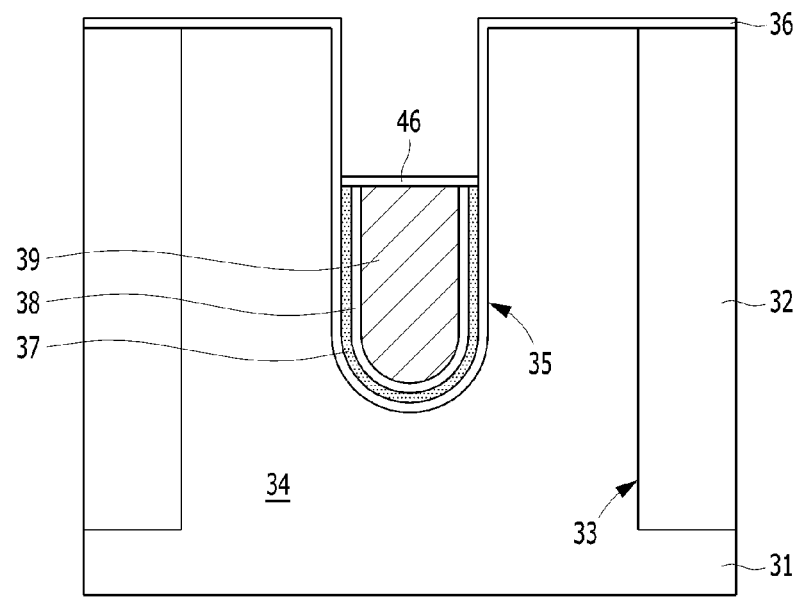

As shown in FIG. 11C, an intermediate barrier 46 may be formed. The intermediate barrier 46 may be formed by forming an intermediate barrier layer (not shown) and then performing a recessing process. The intermediate barrier 46 may be formed of the same material as that of the lower barrier 38. The intermediate barrier 46 may be formed of a metal-containing material. The intermediate barrier 46 may include titanium nitride.

Figure 11D:
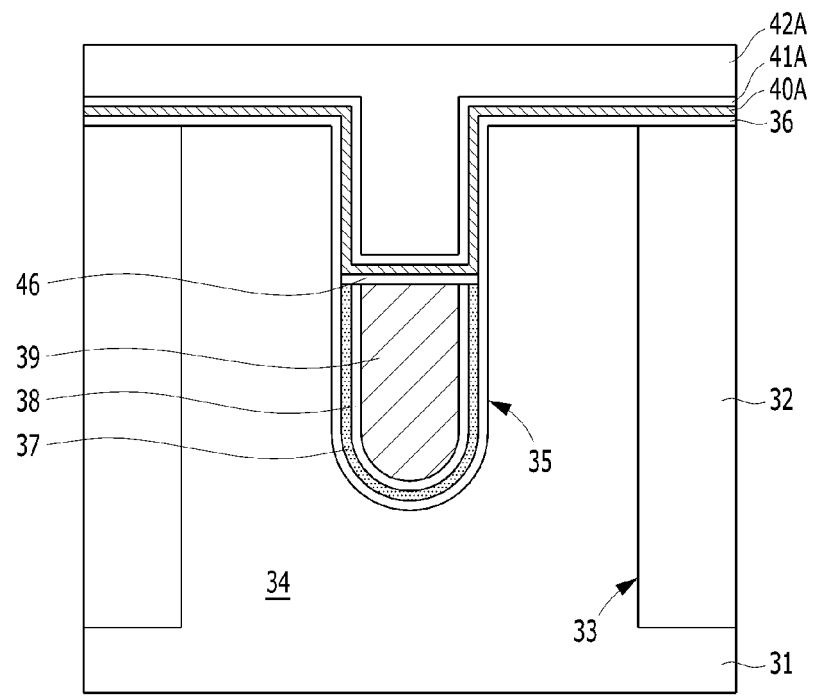

As shown in FIG. 11D, a work function liner layer 40A may be formed. The work function liner layer 40A may include a material having a low work function. The work function liner layer 40A may be formed of a non-metal material. The work function liner layer 40A may include N-type impurity-doped polysilicon.

A second low resistivity layer 42A may be formed on the work function liner layer 40A. The second low resistivity layer 42A may fill the gate trench 35. The second low resistivity layer 42A may include a low resistivity metal material. The second low resistivity layer 42A may be formed of a reactive material with respect to the work function liner layer 40A. The second low resistivity layer 42A may include tungsten. Before forming the second low resistivity layer 42A, an upper barrier layer 41A may be formed. The upper barrier layer 41A may be conformally formed on the surface of the work function liner layer 40A. The upper barrier layer 41A may be formed of a metal-containing material. The upper barrier layer 41A may include a metal nitride. For example, the upper barrier layer 41A may include titanium nitride. The upper barrier layer 41A may become an upper barrier by a subsequent recessing process. In another example, the second low resistivity layer 42A may be formed of a material which is not reactive with the work function liner layer 40A. In another example, the second low resistivity layer 42A may be formed of titanium nitride. When the second low resistivity layer 42A is formed of titanium nitride, an upper barrier layer may be omitted. The second low resistivity layer 42A may be formed by a chemical vapor deposition (CVD) process or an atomic layer deposition (ALD) process.

Figure 11E:
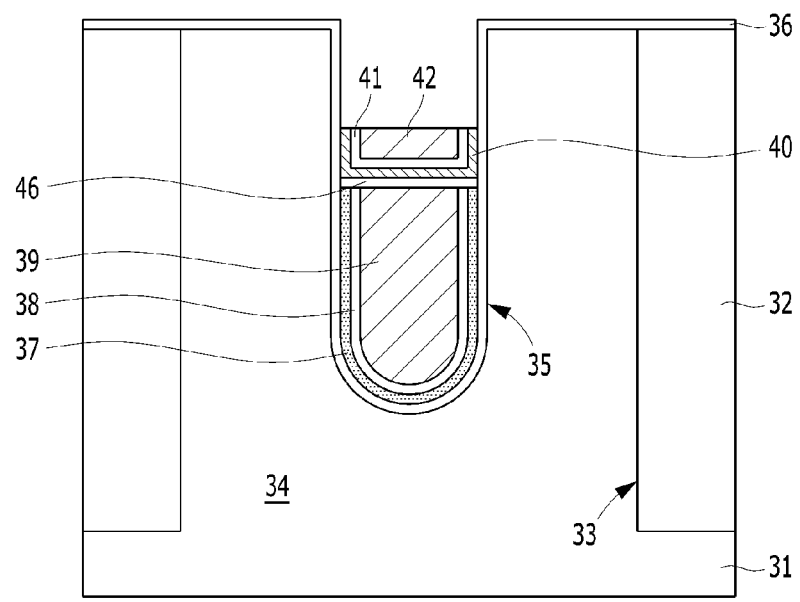

As shown in FIG. 11E, a recessing process may be performed in such a manner that a work function liner 40, an upper buried portion 42 and an upper barrier 41 remain in the gate trench 35. The upper buried portion 42 may be formed by an etch-back process on the second low resistivity layer 42A. The upper barrier layer 41A may be recessed by the recessing process. Thus, the upper barrier 41 may be formed.

Next, a recessing process on the work function liner layer 40A may be performed. The upper barrier 41 may be positioned between the upper buried portion 42 and the work function liner 40. The top surfaces of the work function liner 40, the upper barrier 41 and the upper buried portion 42 may be at the same level. The work function liner 40, the upper barrier 41 and the upper buried portion 42 may be recessed to be lower than the top surface of the active region 34.

Figure 11F:
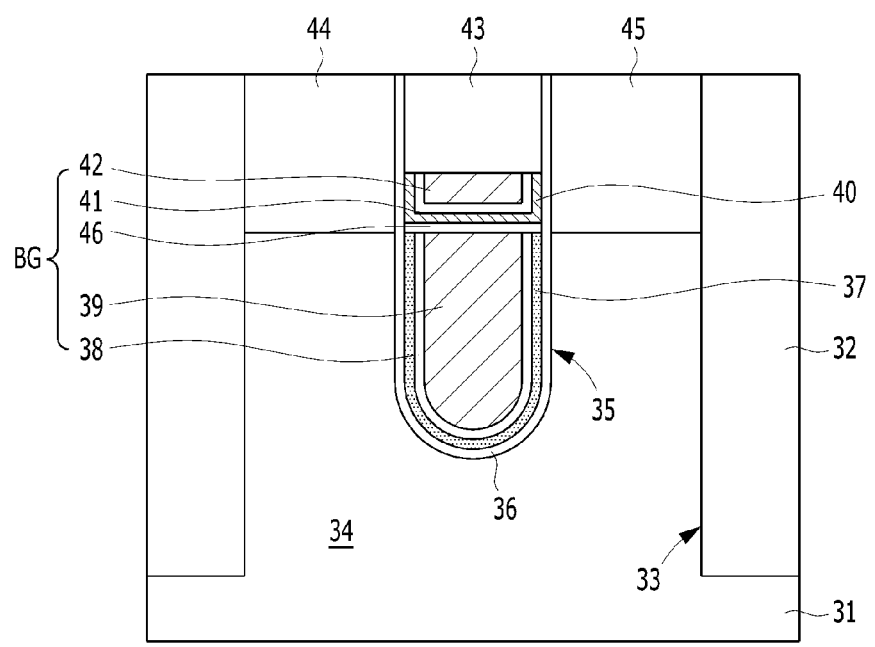

As shown in FIG. 11F, a capping layer 43 may be formed on the upper buried portion 42. The capping layer 43 may include a dielectric material. The capping layer 43 may fill the gate trench 35 on the upper buried portion 42. The capping layer 43 may include silicon nitride. Subsequently, a planarization process on the capping layer 43 may be performed to expose the top surface of the substrate 31. When or after the planarization process on the capping layer 43, the gate dielectric layer 36 on the top surface of the substrate 31 may be removed.

According to the above processes, a buried gate structure may be formed. The buried gate structure may include the gate dielectric layer 36, the work function adjusting liner 37, the gate electrode BG and the capping layer 43. The gate electrode BG may include the lower barrier 38, the lower buried portion 39, the intermediate barrier 46, the upper barrier 41 and the upper buried portion 42. The work function adjusting liner 37 may be positioned between the lower buried portion 39 and the gate dielectric layer 36 of the gate electrode BG. The work function liner 40 may be positioned between the upper buried portion 42 and the gate dielectric layer 36 of the gate electrode BG. Moreover, the work function liner 40 may be positioned between the lower buried portion 39 and the upper buried portion 42, and the intermediate barrier 46 may be interposed therebetween. The top surface of the gate electrode BG may be positioned at a level lower than the top surface of the substrate 31. Thus, as the top surface of the gate electrode BG is recessed, the distance between the gate electrode BG and other conductive structures such as a contact plug may be sufficiently secured. As a result, insulation internal pressure between the gate electrode BG and other conductive structures may be improved.

After forming the capping layer 43, an impurity doping process may be performed by implantation or another doping technology. Thus a first impurity region 44 and a second impurity region 45 may be formed in the substrate 31. When performing the impurity doping process, the capping layer 43 may be used as a barrier. The first impurity region 44 and the second impurity region 45 may become a source region and a drain region, respectively. The gate dielectric layer 36 on the top surface of the substrate 31 may be removed after the impurity doping process.

The bottom surfaces of the first impurity region 44 and the second impurity region 45 may have a depth that overlaps with the work function liner 40. Therefore, the work function liner 40 may overlap with the first and second impurity regions 44 and 45.

In another example, the first impurity region 44 and the second impurity region 45 may be formed before forming the gate trench 35. For example, after forming an impurity region by doping an impurity into the active region 34 through an ion implantation mask, the gate trench 35 may be formed. The impurity region may be divided into the first impurity region 44 and the second impurity region 45 by the gate trench 35.

Figure 12:
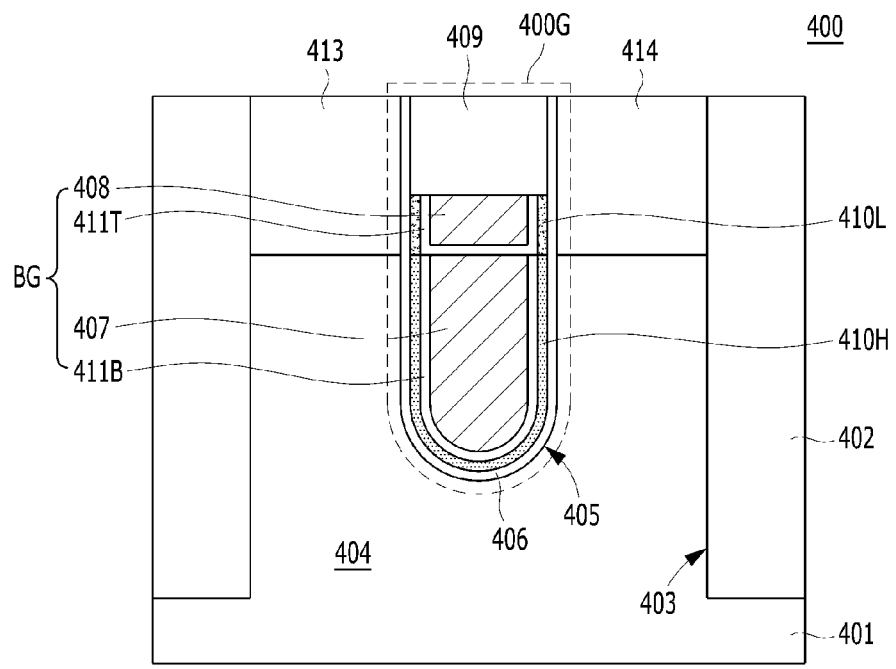
FIG. 12 is a cross-sectional view illustrating a semiconductor device in accordance with a fourth embodiment.

FIG. 12 is a cross-sectional view illustrating a semiconductor device in accordance with a fourth embodiment. Some components of the semiconductor device 400 except for a buried gate structure 400G may be the same as those in accordance with the above embodiments.

The semiconductor device 400 may be formed in a substrate 401. The buried gate structure 400G may be embedded in a gate trench 405 of the semiconductor device 400. The buried gate structure 400G may be disposed in an active region 404 between a first impurity region 413 and a second impurity region 414, and extend in an isolation layer 402. The isolation layer 402 may be formed by filling an isolation layer 403 with a dielectric material.

The buried gate structure 400G may include a gate dielectric layer 406, a gate electrode BG, a first work function adjusting liner 410H, a capping layer 409 and a second work function adjusting liner 410L. The gate electrode BG may be positioned at a level lower than the top surface of the active region 404. The gate electrode BG may partially fill the gate trench 405. The capping layer 409 may be positioned on the gate electrode BG. The gate dielectric layer 406 may be formed on the bottom surface and the sidewalls of the gate trench 405.

The gate electrode BG may include a lower barrier 411B, a lower buried portion 407, an upper barrier 411T and an upper buried portion 408. The upper buried portion 408 may be positioned on the lower buried portion 407, and the upper buried portion 408 may overlap with the first impurity region 413 and the second impurity region 414. The upper buried portion 408 may partially fill the gate trench 405 of the lower buried portion 407. The top surface of the upper buried portion 408 may be at a level lower than the top surface of the substrate 401. The upper buried portion 408 may overlap with the first and second impurity regions 413 and 414, and the gate dielectric layer 406 may be interposed therebetween. The capping layer 409 may be formed over the upper buried portion 408.

The first work function adjusting liner 410H may be formed of the same material as that of the work function adjusting liner 110. That is, the first work function adjusting liner 410H may be formed of a material which may induce a high work function of the lower buried portion 407. The first work function adjusting liner 410H may include a material that generates a first dipole and induces a high work function due to an energy band change. The first work function adjusting liner 410H may be different from the gate dielectric layer 406 in oxygen content. The first work function adjusting liner 410H may be formed of a high oxygen containing-metal oxide which has oxygen content per unit volume greater than that of the gate dielectric layer 406. The high oxygen containing-metal oxide may include one or more of aluminum oxide ($Al_2O_3$), titanium oxide ($TiO_2$), hafnium oxide ($HfO_2$), zirconium oxide ($ZrO_2$) and magnesium oxide (MgO). In the embodiments, the first work function adjusting liner 410H may include $Al_2O_3$. As the first work function adjusting liner 410H is formed of $Al_2O_3$, it is possible to maintain a stable interface with the gate dielectric layer 406. The first work function adjusting liner 410H may be formed thin. As a result, the volume of the lower buried portion 407 in the gate trench 405 may be increased so that the resistivity of the gate electrode BG may be reduced. In another example, when the lower buried portion 407 is formed of a material having a first high work function, a second high work function higher than the first high work function may be induced by the first work function adjusting liner 410H.

The second work function adjusting liner 410L may adjust a work function. The second work function adjusting liner 410L may induce a low work function of the upper buried portion 408. The second work function adjusting liner 410L may include a material that generates a second dipole and induces a low work function due to an energy band change. The second dipole may be used to decrease a work function of the upper buried portion 408. The second work function adjusting liner 410L may be different from the gate dielectric layer 406 in oxygen content. The second work function adjusting liner 410L may be formed of a low oxygen containing-metal oxide which has oxygen content per unit volume lower than that of the gate dielectric layer 406. The low oxygen containing-metal oxide may include one or more of yttrium oxide ($Y_2O_3$), lanthanum oxide ($La_2O_3$), germanium oxide ($GeO_2$), lutetium oxide ($Lu_2O_3$) and strontium oxide (SrO). The second work function adjusting liner 410L may overlap with the first impurity region 413 and the second impurity region 414. For example, the second work function adjusting liner 410L may horizontally overlap with the first impurity region 413 and the second impurity region 414. The second work function adjusting liner 410L may have a spacer shape. That is, the second work function adjusting liner 410L may not be positioned between the upper buried portion 408 and the lower buried portion 407. The second work function adjusting liner 410L may be positioned between the upper buried portion 408 and the first and second impurity regions 413 and 414. The second work function adjusting liner 410L may be electrically coupled to the first work function adjusting liner 410H. The thickness of the second work function adjusting liner 410L may be the same or different from that of the first work function adjusting liner 410H.

The lower buried portion 407 and the upper buried portion 408 of the gate electrode BG may include a low resistivity metal in order to reduce the resistivity of the gate electrode BG. For example, the lower buried portion 407 and the upper buried portion 408 may be formed of tungsten (W). When the upper buried portion 408 and the lower buried portion 407 are formed of tungsten, the gate dielectric layer 406 may be attacked. For example, when tungsten is deposited through tungsten hexafluoride ($WF_6$), the gate dielectric layer 406 may be attacked by fluorine. Therefore, in order to prevent such a fluorine attack, a lower barrier 411B may be formed between the lower buried portion 407 and the gate dielectric layer 406. An upper barrier 411T may be formed between the upper buried portion 407 and the gate dielectric layer 406. The lower barrier 411B may be positioned between the lower buried portion 407 and the first work function adjusting liner 410H. The upper barrier 411T may be positioned between the upper buried portion 408 and the second work function adjusting liner 410L. The lower barrier 411B and the upper barrier 411T may be formed of a material which has a low resistivity. The lower barrier 411B and the upper barrier 411T may be formed of titanium nitride. By the lower barrier 411B and the upper barrier 411T, fluorine attacks on the first work function adjusting liner 410H and the second work function adjusting liner 410L may be prevented, respectively. In some examples, when depositing a tungsten layer by a fluorine-free tungsten source, the lower barrier 411B and the upper barrier 411T may be omitted.

The first impurity region 413, the second impurity region 414 and the buried gate structure 400G may form a buried gate type transistor. A channel may be defined along the gate trench 405 between the first impurity region 413 and the second impurity region 414.

According to the fourth embodiment, the first work function adjusting liner 410H may be formed of a material which induces a high work function, and the second work function adjusting liner 410L may induce a low work function.

A threshold voltage may be adjusted by the first work function adjusting liner 410H. For example, the threshold voltage may be shifted by the first work function adjusting liner 410H. A first dipole may be formed at an interface between the first work function adjusting liner 410H and the gate dielectric layer 406 by the first work function adjusting liner 410H. The first dipole may induce a high work function of the lower buried portion 407, and thus may shift the threshold voltage. As a result, the channel dose may be decreased by the first work function adjusting liner 410H.

Since the channel dose is decreased by the first work function adjusting liner 410H, the local channel doping may be decreased or the local channel doping may be omitted. As a result, in the embodiments, since a channel dose is decreased, junction leakage may be improved.

Moreover, in the fourth embodiment, a second dipole may be formed at an interface between the second work function adjusting liner 410L and the gate dielectric layer 406 by the second work function adjusting liner 410L. The second dipole may induce a low work function of the upper buried portion 408, and thus may suppress gate induced drain leakage (GIDL) in the first impurity region 413 and the second impurity region 414. When the first work function adjusting liner 410H overlaps with the first impurity region 413 and the second impurity region 414, gate induced drain leakage may be increased due to inducing a high work function. Therefore, the first work function adjusting liner 410H may be adjusted in height not to overlap with the first impurity region 413 and the second impurity region 414.

Moreover, in the fourth embodiment, since the first work function adjusting liner 410H and the second work function adjusting liner 410L are formed of a dielectric material, the resistivity of the gate electrode BG may further be reduced.

The buried gate structure 400G in accordance with the fourth embodiment may be applied to a buried gate type fin channel transistor.

Figure 13A:
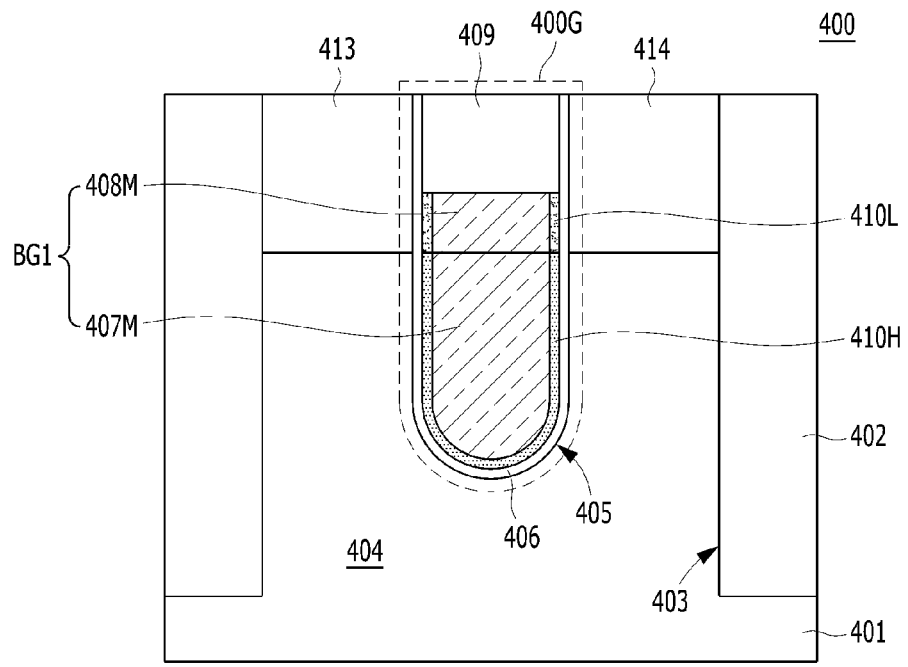
FIGS. 13A to 13C are cross-sectional views illustrating modifications of the fourth embodiment.
Figure 13B:
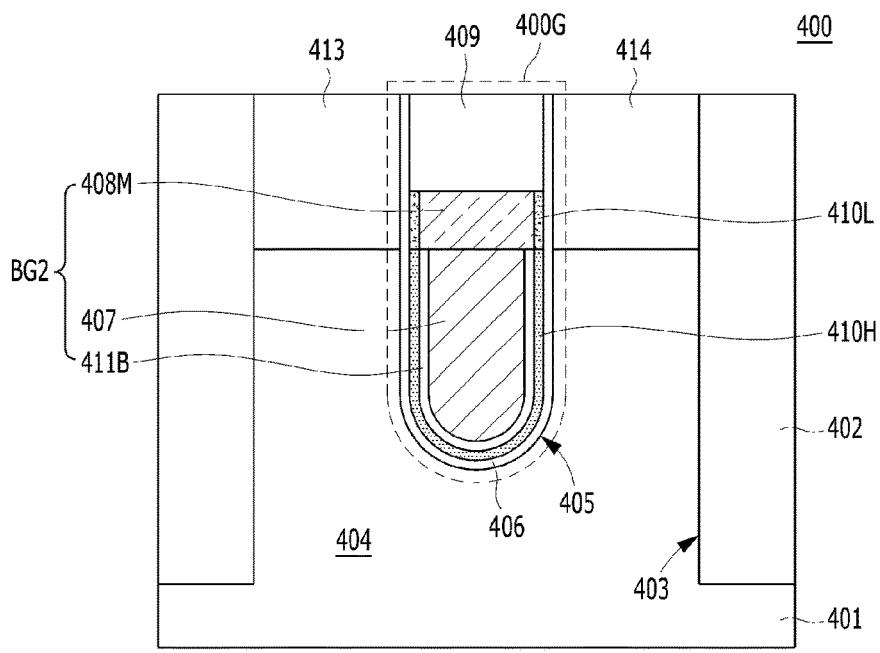
Figure 13C:
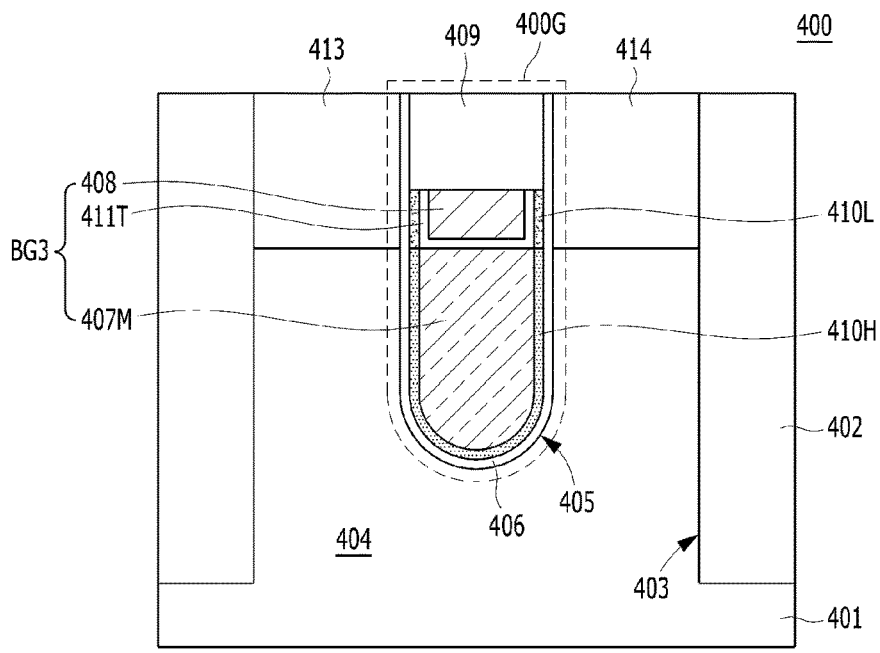

FIGS. 13A to 13C are cross-sectional views illustrating modifications of the fourth embodiment. Some components of the semiconductor device 400 in accordance with modifications of the fourth embodiment may be the same as those of the semiconductor device 400 in accordance with the fourth embodiment. The remaining components except for gate electrodes BG1, BG2 and BG3 may be the same as those of the fourth embodiment.

Referring to FIG. 13A, the gate structure 400G of the semiconductor device 400 in accordance with a first modification may include a gate dielectric layer 406, a first work function adjusting liner 410H, a gate electrode BG1, a second work function adjusting liner 410L and a capping layer 209. The gate electrode BG1 may include a lower buried portion 407M and an upper buried portion 408M.

The lower buried portion 407M and the upper buried portion 408M may include low resistivity metal in order to reduce the resistivity of the gate electrode BG1. The lower buried portion 407M and the upper buried portion 408M may be formed of a material which does not attack the gate dielectric layer 406. For example, the lower buried portion 407M and the upper buried portion 408M may be formed of a material which does not contain an impurity such as fluorine. Therefore, a lower barrier between the lower buried portion 407M and the gate dielectric layer 406 may be omitted. Moreover, an upper barrier between the upper buried portion 408M and the gate dielectric layer 406 may be omitted. The lower buried portion 407M and the upper buried portion 408M may include titanium nitride.

As such, since the lower buried portion 407M and the upper buried portion 408M are formed of a material which does not contain fluorine, the gate electrode BG1 may become a barrier-less gate electrode.

Referring to FIG. 13B, the gate structure 400G of the semiconductor device 400 in accordance with a second modification may include a gate dielectric layer 406, a first work function adjusting liner 410H, a gate electrode BG2, a second work function adjusting liner 410L and a capping layer 409. The gate electrode BG2 may include a lower buried portion 407 and an upper buried portion 408M.

The lower buried portion 407 and the upper buried portion 408M of the gate electrode BG2 may include a low resistivity metal in order to reduce the resistivity of the gate electrode BG2. The lower buried portion 407 may be formed of a fluorine-containing material, and the upper buried portion 408M may be formed of a fluorine-free material. The lower buried portion 407 may include tungsten, and the upper buried portion 408M may include titanium nitride. When the upper buried portion 408M is formed of titanium nitride, the second work function adjusting liner 410L and the gate dielectric layer 406 may not be attacked by fluorine. Therefore, an upper barrier between the upper buried portion 408M and the second work function adjusting liner 410L may be omitted. When the lower buried portion 407 includes tungsten, a lower barrier 411B may be needed to prevent a fluorine attack on the gate dielectric layer 406. The lower barrier 411B may include titanium nitride.

Referring to FIG. 13C, the gate structure 400G of the semiconductor device 400 in accordance with a third modification may include a gate dielectric layer 406, a first work function adjusting liner 410H, a gate electrode BG3, a second work function adjusting liner 410L and a capping layer 409. The gate electrode BG3 may include a lower buried portion 407M and an upper buried portion 408.

The lower buried portion 407M and the upper buried portion 408 of the gate electrode BG3 may include a low resistivity metal in order to reduce the resistivity of the gate electrode BG3. The lower buried portion 407M may be formed of a fluorine-free material and the upper buried portion 408 may be formed of a fluorine-containing material. The upper buried portion 408 may include tungsten, and the lower buried portion 407M may include titanium nitride.

When the upper buried portion 408 is formed of tungsten, the second work function adjusting liner 410L and the gate dielectric layer 406 may be attacked by the upper buried portion 408. Therefore, an upper barrier 411T may be formed between the upper buried portion 408 and the second work function adjusting liner 410L. When the lower buried portion 407M includes titanium nitride, the gate dielectric layer 406 and the first work function adjusting liner 410H may not be attacked by fluorine and thus a lower barrier may be omitted. The upper barrier 411T may include titanium nitride.

The modification described above may be applied to a buried gate type fin channel transistor.

A method for manufacturing the semiconductor devices in accordance with the fourth embodiment and the modifications thereof may be similar to that of the second embodiment.

Figure 14A:
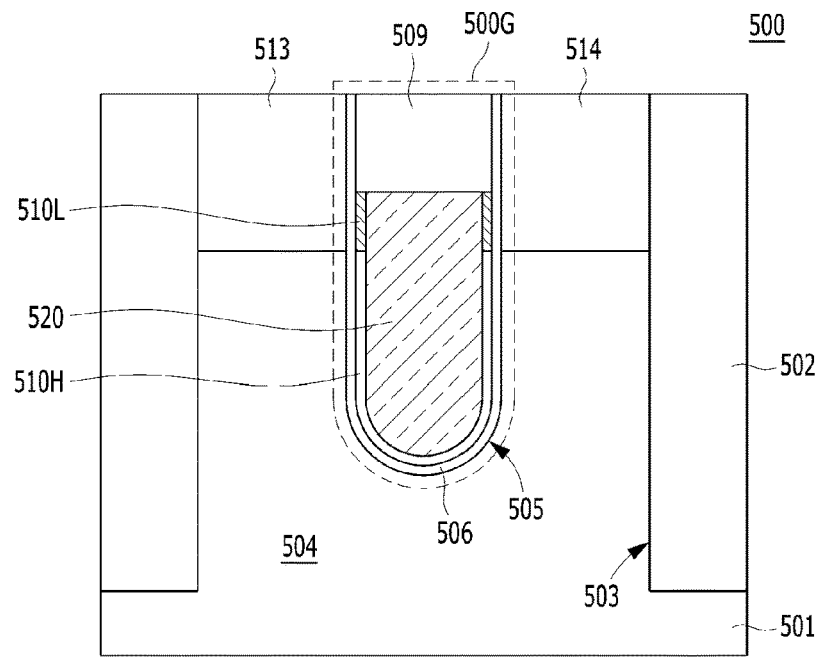
FIG. 14A is a cross-sectional view illustrating a semiconductor device in accordance with a fifth embodiment.

FIG. 14A is a cross-sectional view illustrating a semiconductor device in accordance with a fifth embodiment. Some components of a semiconductor device 500 except for a buried gate structure 500G may be the same as those of the semiconductor device in accordance with the embodiments described above.

The semiconductor device 500 may be formed in a substrate 501. The buried gate structure 500G of the semiconductor device 500 may be embedded in a gate trench 505. The buried gate structure 500G may be disposed in an active region 504 between a first impurity region 513 and a second impurity region 514, and extend in an isolation layer 502. The isolation layer 502 may be formed by filling an isolation trench 503 with a dielectric material.

The buried gate structure 500G may include a gate dielectric layer 506, a gate electrode 520, a work function adjusting liner 510H, a capping layer 509 and a work function liner 510L. The gate electrode 520 may be positioned at a level lower than the top surface of the active region 504. The gate electrode 520 may partially fill the gate trench 505. The capping layer 509 may be positioned on the gate electrode 520. The gate dielectric layer 506 may be formed on the bottom surface and the sidewalls of the gate trench 505.

As such, in the fifth embodiment, contrary to the above embodiments, the gate electrode 520 may have a single structure, which is formed by a single low resistivity layer. For example, in the single structure, a lower buried portion and an upper buried portion may remain continuous, and a single low resistivity metal material may partially fill the gate trench 505.

The gate electrode 520 may include a low resistivity metal. The gate electrode 520 may be formed of a fluorine-free material. The gate electrode 520 may be formed of titanium nitride.

A first interface and a second interface may be included between the gate electrode 520 and the gate dielectric layer 506. The second interface may be adjacent to the top portion of the gate trench 505, and the first interface may be at a level lower than the second interface and be adjacent to the lower portion and the bottom portion of the gate trench 505. The first interface may correspond to the interface between the lower buried portion and the gate dielectric layer in accordance with the embodiments described above, and the second interface may correspond to an interface between the upper buried portion or the work function liner and the gate dielectric layer in accordance with the embodiments described above.

The work function adjusting liner 510H may include a material that generates a dipole and induces a high work function due to an energy band change. The work function adjusting liner 510H may be formed of a high oxygen containing-metal oxide which has oxygen content per unit volume greater than that of the gate dielectric layer 506. The high oxygen containing-metal oxide may include one or more of aluminum oxide ($Al_2O_3$), titanium oxide ($TiO_2$), hafnium oxide ($HfO_2$), zirconium oxide ($ZrO_2$) and magnesium oxide (MgO).

The work function liner 510L may include a low work function. The work function liner 510L may include a silicon-containing material which contains an N-type dopant. In the embodiments, the work function liner 510L may include polysilicon which is doped with an N-type dopant (hereinafter, referred to as N-type doped polysilicon). The N-type doped polysilicon may have a low work function. The N-type dopant may include one or more of phosphorous (Ph) and arsenic (As). The work function liner 510L may overlap with the first impurity region 513 and the second impurity region 514.

Figure 14B:
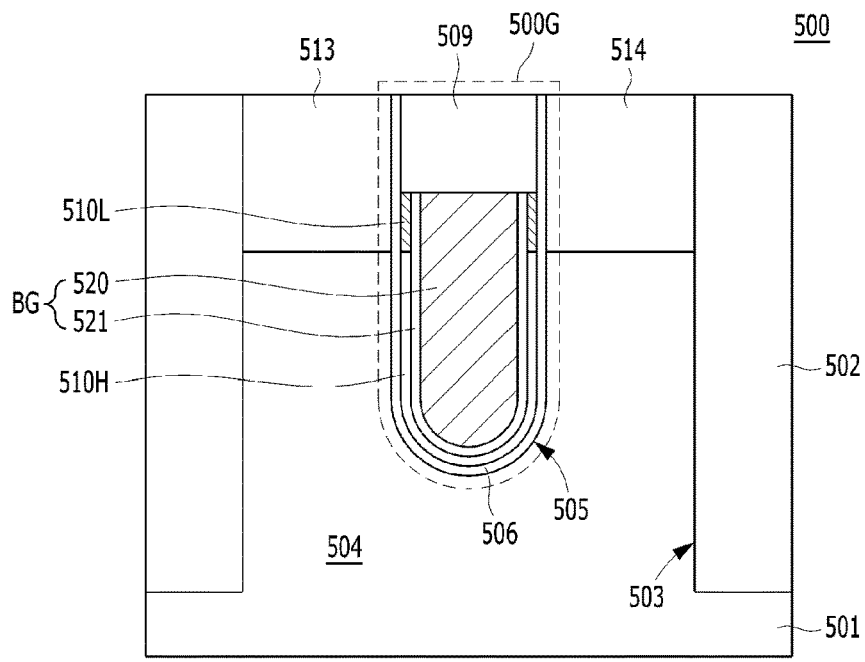
FIG. 14B is a cross-sectional view illustrating a semiconductor device in accordance with a modification of the fifth embodiment.

FIG. 14B is a cross-sectional view illustrating a semiconductor device in accordance with a modification of the fifth embodiment. Some components of the semiconductor device 500 except for a buried gate structure 500G may be the same as those of the semiconductor device 500 in accordance with the fifth embodiment.

The semiconductor device 500 may be formed in a substrate 501. The buried gate structure 500G of the semiconductor device 500 may be embedded in a gate trench 505. The buried gate structure 500G may be disposed in an active region 504 between a first impurity region 513 and a second impurity region 514, and extend in an isolation layer 502. The isolation layer 502 may be formed by filling an isolation trench 503 with a dielectric material.

The buried gate structure 500G may include a gate dielectric layer 506, a gate electrode BG, a work function adjusting liner 510H, a capping layer 509 and a work function liner 510L. The gate electrode BG may be at a level lower than the top surface of the active region 504. The gate electrode BG may partially fill the gate trench 505. The capping layer 509 may be positioned on the gate electrode BG. The gate dielectric layer 506 may be formed on the bottom surface and the sidewalls of the gate trench 505.

The gate electrode BG may include a single low resistivity electrode 520 and a barrier 521. The single low resistivity electrode 520 may be formed of a fluorine-containing material. The single low resistivity electrode 520 may be formed of tungsten. A barrier 521 may be formed in order to prevent the reaction of the single low resistivity electrode 520 with the work function liner 510L. The barrier 521 may include titanium nitride. A fluorine attack on the work function adjusting liner 510H and the gate dielectric layer 506 may be prevented by the barrier 521.

A first interface and a second interface may be included between the single low resistivity electrode 520 and the gate dielectric layer 506. The second interface may be adjacent to the top portion of the gate trench 505, and the first interface may be at a level lower than the second interface and be adjacent to the lower portion and the bottom portion of the gate trench 505. The first interface may correspond to the interface between the lower buried portion and the gate dielectric layer in accordance with the embodiments described above, and the second interface may correspond to the interface between the upper buried portion or the work function liner and the gate dielectric layer in accordance with the embodiments described above.

The work function adjusting liner 510H may include a material that generates a dipole and induces a high work function due to an energy band change. The work function adjusting liner 510H may be formed of a high oxygen containing-metal oxide which has oxygen content per unit volume greater than that of the gate dielectric layer 506.

The work function liner 510L may include a low work function material. The work function liner 510L may include a silicon-containing material which contains an N-type dopant. In the embodiments, the work function liner 510L may include polysilicon which is doped with an N-type dopant (hereinafter, referred to as N-type doped polysilicon). The N-type doped polysilicon may have a low work function. The N-type dopant may include one or more of phosphorous (Ph) and arsenic (As). The work function liner 510L may overlap with the first impurity region 513 and the second impurity region 514.

According to the fifth embodiment and the modifications thereof, a threshold voltage Vt may be adjusted by the work function adjusting liner 510H. For example, the threshold voltage may be shifted by the work function adjusting liner 510H. A dipole may be formed between the work function adjusting liner 510H and the gate dielectric layer 506 by the work function adjusting liner 510H. The dipole may induce a high work function of the single low resistivity electrode 520, and thus shift the threshold voltage. As a result, a channel dose may be decreased by the work function adjusting liner 510H.

Moreover, since the work function liner 510L has a low work function, gate induced drain leakage (GIDL) may be suppressed in the first impurity region 513 and the second impurity region 514.

Figure 15A:
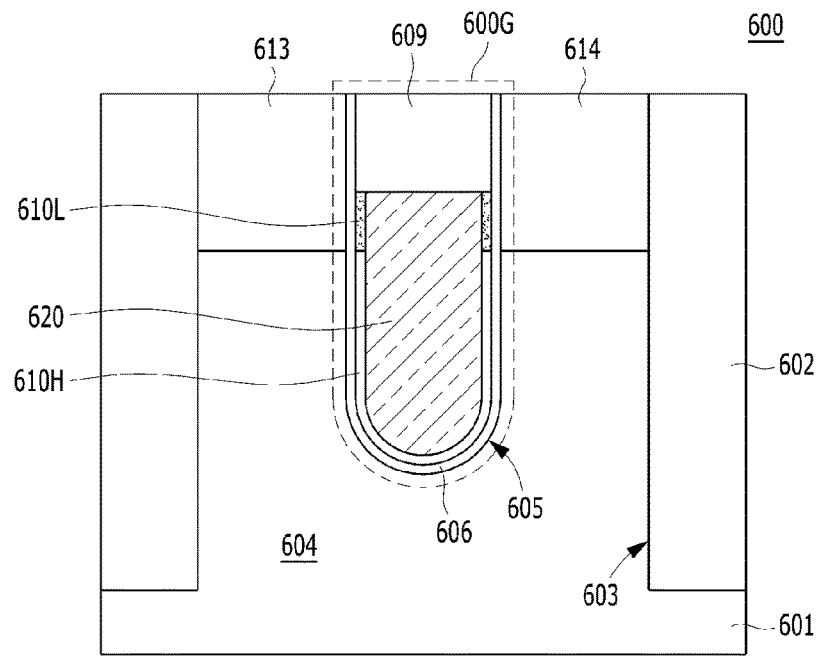
FIG. 15A is a cross-sectional view illustrating a semiconductor device in accordance with a sixth embodiment.

FIG. 15A is a cross-sectional view illustrating a semiconductor device in accordance with a sixth embodiment. Some components of a semiconductor device 600 except for a buried gate structure 600G may be the same as those of the semiconductor device 500 in accordance with the fifth embodiment.

The semiconductor device 600 may be formed in a substrate 601. The buried gate structure 600G of the semiconductor device 600 may be embedded in a gate trench 605. The buried gate structure 600G may be disposed in an active region 604 between a first impurity region 613 and a second impurity region 614, and extend in an isolation layer 602. The isolation layer 602 may be formed by filling an isolation trench 603 with a dielectric material.

The buried gate structure 600G may include a gate dielectric layer 606, a gate electrode 620, a first work function adjusting liner 610H, a capping layer 609 and a second work function adjusting liner 610L. The gate electrode 620 may be at a level lower than the top surface of the active region 604. The gate electrode 620 may partially fill the gate trench 605. The capping layer 609 may be positioned on the gate electrode 620. The gate dielectric layer 606 may be formed on the bottom surface and the sidewalls of the gate trench 605.

In the sixth embodiment, the gate electrode 620 may have the single structure.

The gate electrode 620 may include a low resistivity metal. The gate electrode 620 may be formed of a fluorine-free material. The gate electrode 620 may be formed of titanium nitride.

A first interface and a second interface may be included between the gate electrode 620 and the gate dielectric layer 606. The second interface may be adjacent to the top portion of the gate trench 605, and the first interface may be at a level lower than the second interface and be adjacent to the lower portion and the bottom portion of the gate trench 605. The first interface may correspond to the interface between the lower buried portion and the gate dielectric layer in accordance with the embodiments described above, and the second interface may correspond to the interface between the upper buried portion or the work function liner and the gate dielectric layer in accordance with the embodiments described above.

The first work function adjusting liner 610H may include a material that generates a first dipole and induces a high work function due to an energy band change. The first work function adjusting liner 610H may be formed of a high oxygen containing-metal oxide which has oxygen content per unit volume greater than that of the gate dielectric layer 606. The high oxygen containing-metal oxide may include one or more of aluminum oxide ($Al_2O_3$), titanium oxide ($TiO_2$), hafnium oxide ($HfO_2$), zirconium oxide ($ZrO_2$) and magnesium oxide (MgO).

The second work function adjusting liner 610L may include a material that generates a second dipole at an interface with the gate dielectric layer 406 and induces a low work function due to an energy band change. The second work function adjusting liner 610L may be formed of a low oxygen containing-metal oxide, which has oxygen content per unit volume lower than that of gate dielectric layer 606. The low oxygen containing-metal oxide may include one or more of yttrium oxide ($Y_2O_3$), lanthanum oxide ($La_2O_3$), germanium oxide ($GeO_2$), lutetium oxide ($Lu_2O_3$) and strontium oxide (SrO). The second work function adjusting liner 610L may overlap with the first impurity region 613 and the second impurity region 614. The second work function adjusting liner 610L may have a spacer shape. The second work function adjusting liner 610L may be electrically coupled to the first work function adjusting liner 610H. The thickness of the second work function adjusting liner 610L may be the same as or different from that of the first work function adjusting liner 610H.

Figure 15B:
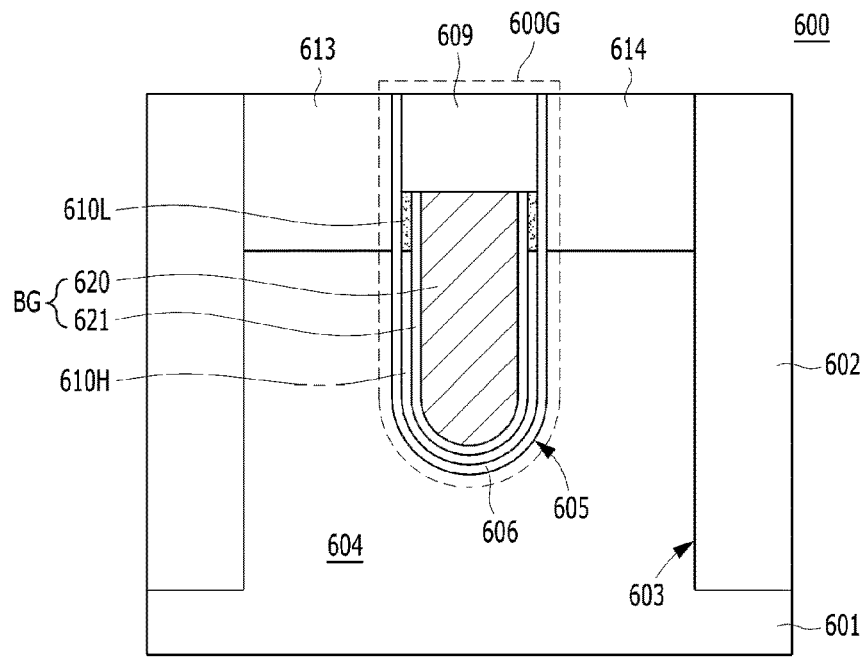
FIG. 15B is a cross-sectional view illustrating a semiconductor device in accordance with a modification of the sixth embodiment.

FIG. 15B is a cross-sectional view illustrating a semiconductor device in accordance with a modification of the sixth embodiment. Some components of the semiconductor device 600 except for a buried gate structure 600G may be the same as those in accordance with the six embodiment.

The semiconductor device 600 may be formed in a substrate 601. The buried gate structure 600G of the semiconductor device 600 may be embedded in a gate trench 605. The buried gate structure 600G may be disposed in an active region 604 between a first impurity region 613 and a second impurity region 614, and extend in an isolation layer 602. The isolation layer 602 may be formed by filling an isolation trench 603 with a dielectric material.

The buried gate structure 600G may include a gate dielectric layer 606, a gate electrode BG, a first work function adjusting liner 610H, a capping layer 609 and a second work function adjusting liner 610L. The gate electrode BG may be at a level lower than the top surface of the active region 604. The gate electrode BG may partially fill the gate trench 605. The capping layer 609 may be positioned on the gate electrode BG. The gate dielectric layer 606 may be formed on the bottom surface and the sidewalls the gate trench 605.

The gate electrode BG may include a single low resistivity electrode 620 and a barrier 621. The single low resistivity electrode 620 may be formed of a fluorine-containing material. The single low resistivity electrode 620 may be formed of tungsten. The barrier 621 may include titanium nitride. A fluorine attack on the first work function adjusting liner 610H, the second work function adjusting liner 610L and the gate dielectric layer 606 may be prevented by the barrier 621.

A first interface and a second interface may be included between the single low resistivity electrode 620 and the gate dielectric layer 606. The second interface may be positioned on the top portion of the gate trench 605, and the first interface may be at a level lower than the second interface and be adjacent to the lower portion and the bottom portion of the gate trench 605. The first interface may correspond to the interface between the lower buried portion and the gate dielectric layer in accordance with the embodiments described above, and the second interface may correspond to the interface between the upper buried portion or the work function liner and the gate dielectric layer in accordance with the embodiments described above.

The first work function adjusting liner 610H may include a material that generates a dipole and induces a high work function due to an energy band change. The first work function adjusting liner 610H may be formed of a high oxygen containing-metal oxide which has oxygen content per unit volume greater than that of the gate dielectric layer 606. The high oxygen containing-metal oxide may include one or more of aluminum oxide ($Al_2O_3$), titanium oxide ($TiO_2$), hafnium oxide ($HfO_2$), zirconium oxide ($ZrO_2$) and magnesium oxide (MgO).

The second work function adjusting liner 610L may include a material that generates a dipole and induces a low work function due to an energy band change. The second work function adjusting liner 610L may be formed of a low oxygen containing-metal oxide which has oxygen content per unit volume greater than that of the gate dielectric layer 606. The low oxygen containing-metal oxide may include one or more of yttrium oxide ($Y_2O_3$), lanthanum oxide ($La_2O_3$), germanium oxide ($GeO_2$), lutetium oxide ($Lu_2O_3$) and strontium oxide (SrO). The second work function adjusting liner 610L may overlap with the first impurity region 613 and the second impurity region 614.

According to the sixth embodiment and the modifications thereof, a threshold voltage Vt may be adjusted by the first work function adjusting liner 610H. For example, the threshold voltage may be shifted by the first work function adjusting liner 610H. A first dipole may be formed at an interface between the first work function adjusting liner 610H and the gate dielectric layer 606 by the first work function adjusting liner 610H. The first dipole may induce a high work function of the single low resistivity electrode 620, and thus shift the threshold voltage. As a result, a channel dose may be decreased by the first work function adjusting liner 610H.

Moreover, a second dipole may be formed at an interface between the second work function adjusting liner 610L and the gate dielectric layer 606 by the second work function adjusting liner 610L. The second dipole may induce a low work function of the single low resistivity electrode 620, and thus may suppress gate induced drain leakage (GIDL) in the first impurity region 613 and the second impurity region 614.

The semiconductor device in accordance with the embodiments may be integrated in a transistor circuit. Also, the semiconductor device according to the embodiments may be applied to an integrated circuit which includes transistors for various purposes. For example, the semiconductor device according to the embodiments may be applied to an integrated circuit including an insulated gate FET (IGFET), a high electron mobility transistor (HEMT), a power transistor, a thin film transistor (TFT), and so forth.

The semiconductor device, transistor and integrated circuit according to the embodiments may be embedded in an electronic device. The electronic device may include a memory and a non-memory. The memory includes an SRAM, a DRAM, a FLASH, an MRAM, a ReRAM, an STTRAM and an FeRAM. The non-memory includes a logic circuit. The logic circuit may include a sense amplifier, a decoder, an input/output circuit, etc. for controlling a memory device. Also, the logic circuit may include various integrated circuits (ICs) in addition to a memory. For example, the logic circuit includes a microprocessor, an application processor of a mobile device, etc. Moreover, the non-memory includes a logic gate such as a NAND gate, a driver IC for a display device, a power semiconductor device such as a power management IC (PMIC), etc. The electronic device may include a computing system, an image sensor, a camera, a mobile device, a display device, a sensor, a medical instrument, an optoelectronic device, a radio frequency identification (RFID), a solar cell, a semiconductor device for a vehicle, a semiconductor device for a railroad car, a semiconductor device for an aircraft, etc.

Figure 16:
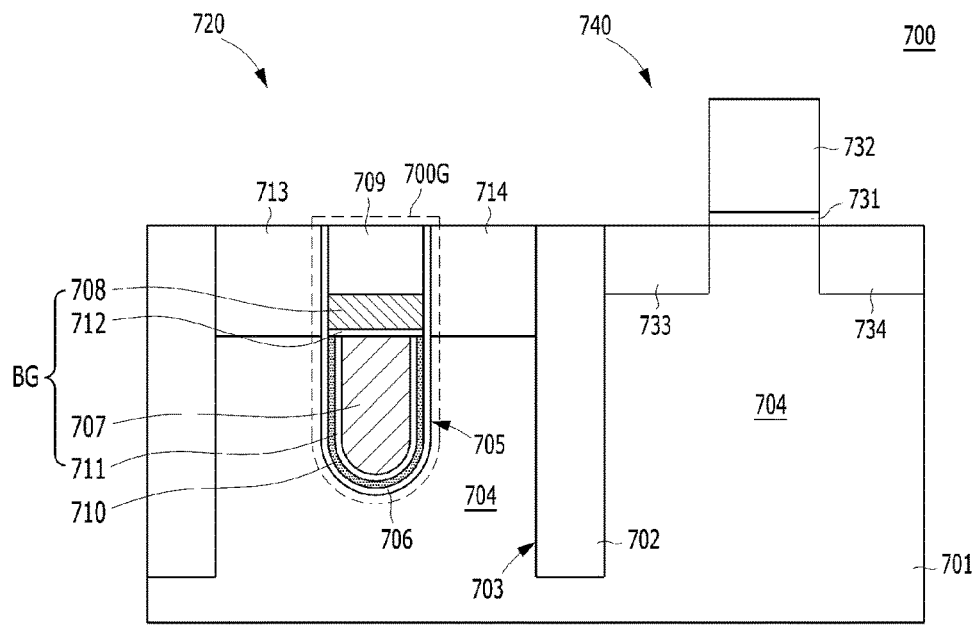
FIG. 16 is a cross-sectional view illustrating an example of a transistor circuit including the semiconductor device in accordance with the embodiments.

FIG. 16 is a cross-sectional view illustrating an example of a transistor circuit including the semiconductor device in accordance with the embodiments.

Referring to FIG. 16, a transistor circuit 700 may include a first transistor 720 and a second transistor 740. The first transistor 720 and the second transistor 740 may be formed in a substrate 701, and be isolated from each other by an isolation layer 702.

The first transistor 720 may include a buried gate structure 700G, a first source region 713 and a first drain region 714. The buried gate structure 700G may be formed in a gate trench 705. The gate trench 705 may cross the isolation layer 702 and an active region 704. The isolation layer 702 may be formed by filling an isolation trench 703 with a dielectric material.

The buried gate structure 700G may include a first gate dielectric layer 706, a buried gate electrode BG and a capping layer 709. The buried gate electrode BG may include a work function adjusting liner 710, a lower barrier 711, a lower buried portion 707, an intermediate barrier 712 and an upper buried portion 708. The work function adjusting liner 710 may include a high oxygen containing-metal oxide such as aluminum oxide ($Al_2O_3$), and the upper buried portion 708 may include N-type doped polysilicon.

The second transistor 740 may include a planar gate electrode 732, a second source region 733 and a second drain region 734. A second gate dielectric layer 731 may be formed under the planar gate electrode 732. The planar gate electrode 732 may include one or more of a polysilicon, a metal, a metal nitride, a metal compound and a combination thereof. The second gate dielectric layer 731 may include one or more selected from silicon oxide, silicon nitride, silicon oxynitride and a high-k material. The high-k material may include a hafnium-based material. In the second gate dielectric layer 731, an interfacial layer and a high-k material may be stacked. The interfacial layer may include silicon oxide, silicon nitride or silicon oxynitride.

As may be seen from the above descriptions, in the transistor circuit 700, the first transistor 720 having the buried gate electrode BG and the second transistor 740 having the planar gate electrode 732 may be integrated in the single substrate 701. After forming the first transistor 720, the second transistor 740 may be formed.

In the transistor circuit 700, both the first transistor 720 and the second transistor 740 may be NMOSFETs. Moreover, both the first transistor 720 and the second transistor 740 may be PMOSFETs.

The transistor circuit 700 may be a CMOSFET. For example, any one transistor of the first transistor 720 and the second transistor 740 may be an NMOSFET, and the other transistor may be a PMOSFET. In the planar gate electrode 732 of the second transistor 740, an appropriate work function material may be selected to adjust a threshold voltage. For example, for the planar gate electrode 732, a P-type work function material may be selected to have a work function appropriate for the PMOSFET.

The first transistor 720 may be a buried gate type transistor, and the second transistor 740 may be a planar gate type transistor.

In the transistor circuit 700, the first transistor 720 may be the transistor of a memory cell, and the second transistor 740 may be the transistor of a peripheral circuit.

In this way, since the buried gate structure 700G is formed to include the work function adjusting liner 710 and the upper buried portion 708 having a low work function, the performance of the transistor circuit 700 may be improved.

In addition to the first embodiment, the second to sixth embodiments and modifications may be applied to the buried gate structure 700G of the transistor circuit 700.

Figure 17:
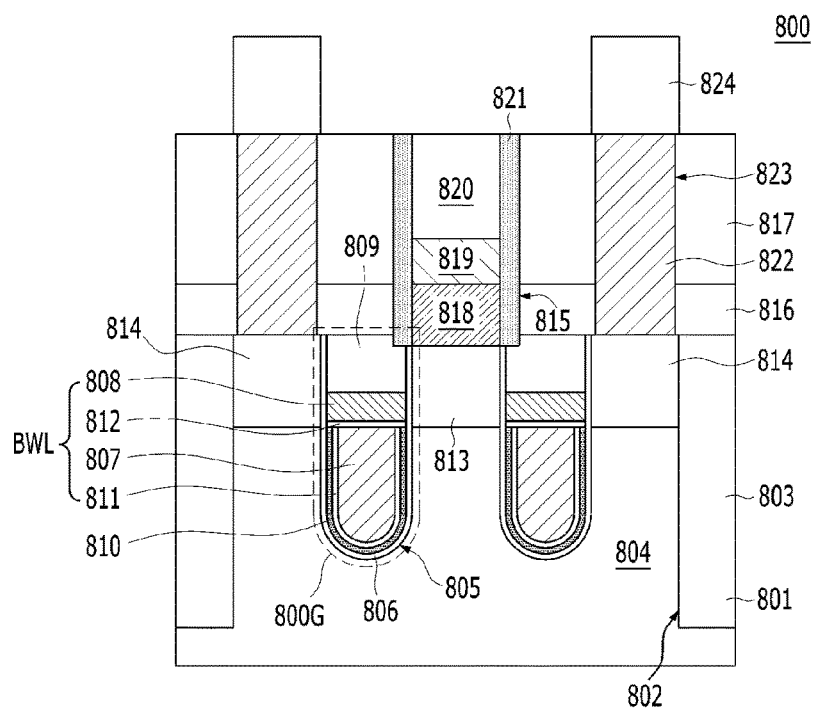
FIG. 17 is a cross-sectional view illustrating an example of a memory cell including the semiconductor device in accordance with the embodiments.

FIG. 17 is a cross-sectional view illustrating an example of a memory cell including the semiconductor device in accordance with the embodiments.

Referring to FIG. 17, a memory cell 800 may include a buried word line structure 800G, a bit line 819 and a memory element 824.

The memory cell 800 will be described in detail.

First, an isolation trench 802 may be formed in a substrate 801, and an isolation layer 803 may be formed in the isolation trench 802. A plurality of active regions 804 may be defined by the isolation layer 803. A gate trench 805 may be formed across the active region 804 and the isolation layer 803. A buried word line structure 800G may be embedded in the gate trench 805.

The buried word line structure 800G may include a first gate dielectric layer 806, a buried word line BWL and a capping layer 809. The buried word line BWL may include a work function adjusting liner 810, a lower barrier 811, a lower buried portion 807, an intermediate barrier 812 and an upper buried portion 808. The work function adjusting liner 810 may include a high oxygen containing-metal oxide such as aluminum oxide ($Al_2O_3$), and the upper buried portion 808 may include N-type doped polysilicon. The buried word line structure 800G may be the same as that of the buried gate structure 100G in accordance with the first embodiment. In addition to the first embodiment, the second to sixth embodiments and modifications may be applied to the buried gate structure 800G.

A first impurity region 813 and a second impurity region 814 may be formed in the substrate 801 on both sides of the buried word line structure 800G. The buried word line BWL, the first impurity region 813 and the second impurity region 814 may form a cell transistor.

A bit line structure which is electrically coupled to the first impurity region 813 may be formed. The bit line structure may include a bit line 819 and a bit line hard mask layer 820. The bit line structure may further include a first contact plug 818 between the bit line 819 and the first impurity region 813. Spacers 821 may be formed on the sidewalls of the bit line structure. First and second interlayer dielectric layers 816 and 817 may be formed on the substrate 801. The first contact plug 818 may be formed in a first contact hole 815. The first contact hole 815 may be formed in the first interlayer dielectric layer 816. The first contact plug 818 may be electrically coupled to the first impurity region 813. The line width of the first contact plug 818 may be the same as that of the bit line 819. Therefore, gaps may be provided between the first contact plug 818 and the sidewalls of the first contact hole 815, and portions of the spacers 821 may extend to fill the gaps. The top surface of the first impurity region 813 may be recessed. Thus, the contact area between the first contact plug 818 and the first impurity region 813 may be increased. The bit line 819 may cross a direction in which the buried word line BWL extends. The bit line 819 may include one or more selected from polysilicon, a metal silicide, a metal nitride and a metal. The bit line hard mask layer 820 may include one or more of silicon oxide and silicon nitride. The first contact plug 818 may include one or more selected from polysilicon, a metal silicide, a metal nitride and a metal.

The spacers 821 may include a dielectric material. The spacers 821 may include one or more of silicon oxide, silicon nitride and a combination of silicon oxide and silicon nitride. The spacers 821 may have a multi-spacer structure. For example, the spacers 821 may be a NON structure of silicon nitride/silicon oxide/silicon nitride. The spacers 821 may be an air gap-embedded multi-spacer structure.

A memory element 824 may be formed over the second impurity region 814. A second contact plug 822 may be formed between the memory element 824 and the second impurity region 814. A second contact hole 823 may be formed to pass through the first and second interlayer dielectric layers 816 and 817, and the second contact plug 822 may be formed in the second contact hole 823. The second contact plug 822 may be electrically coupled to the second impurity region 814. The second contact plug 822 may include one or more selected from polysilicon, a metal, a metal silicide and a metal nitride. For example, second contact plug 822 may include a plug structure in which polysilicon, a metal silicide and a metal are stacked.

Each of the first and second interlayer dielectric layers 816 and 817 may be a single-layered structure or a multi-layered structure. Each of the first and second interlayer dielectric layers 816 and 817 may include one or more selected from silicon oxide, silicon nitride and silicon oxynitride. The second interlayer dielectric layer 817 may serve to isolate adjacent second contact plugs 822. In another example, contact spacers (not shown) which surround the sidewalls of the second contact plug 822 may be further formed. The contact spacers may be an air gap-embedded multi-spacer structure.

In another example, a third contact plug (not shown) may be additionally formed on the second contact plug 822. The third contact plug may overlap with the bit line structure and the second contact plug 824. The third contact plug may include a metal material.

The memory element 824 may be formed on the second contact plug 822 to be electrically coupled to the second contact plug 822. The memory element 824 may be realized in a variety of ways.

The memory element 824 may be a capacitor. Therefore, the memory element 824 may include a storage node which contacts the second contact plug 822. The storage node may be a cylinder type or a pillar type. A capacitor dielectric layer may be formed on the surface of the storage node. The capacitor dielectric layer may include one or more selected from zirconium oxide, aluminum oxide and hafnium oxide. For example, the capacitor dielectric layer may be a ZAZ structure in which first zirconium oxide, aluminum oxide and second zirconium oxide are stacked. A plate node may be formed on the capacitor dielectric layer. The storage node and the plate node may include a metal-containing material.

In another example, the memory element 824 may include a variable resistor. The variable resistor may include a phase change material. The phase change material may include one or more selected between tellurium (Te) and selenium (Se) as chalcogenide elements. In another embodiment, the variable resistor may include a transition metal oxide. In still another embodiment, the variable resistor may be a magnetic tunnel junction (MTJ).

As described above, the memory cell 800 may include the buried word line structure BWL which includes the work function adjusting liner 810 and the upper buried portion 808. In accordance with exemplary embodiments of the present invention, junction leakage may be decreased by the work function adjusting liner 810, and gate induced drain leakage (GIDL) may be reduced by the upper buried portion 808. Therefore, if memory cell 800 is applied to DRAM, the refresh characteristics of the DRAM may be improved.

Figure 18:
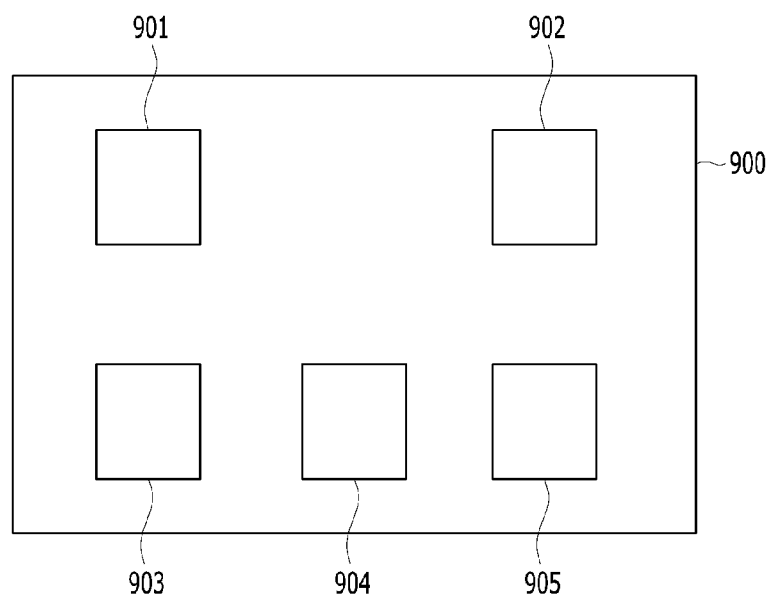
FIG. 18 is a diagram illustrating an example of an electronic device including the semiconductor device in accordance with the embodiments.

FIG. 18 is a diagram illustrating an example of an electronic device including the semiconductor device in accordance with the embodiments.

Referring to FIG. 18, an electronic device 900 may include a plurality of semiconductor devices 901, 902, 903, 904 and 905. For example, the electronic device 900 may include one or more among the semiconductor devices 100, 200, 300, 400, 500 and 600, the transistor circuit 700 and the memory cell 800 according to the above-described embodiments and modifications thereof.

One or more semiconductor devices among the semiconductor devices 901, 902, 903, 904 and 905 included in the electronic device 900 may include a buried gate electrode which is formed in a gate trench. The buried gate structure may include a dielectric work function adjusting liner and a conductive work function liner. Moreover, the buried gate structure may include a first dielectric work function adjusting liner and a second dielectric work function adjusting liner. The work function liner and the second work function adjusting liner may overlap with a source region and a drain region, thus may improve gate induced drain leakage (GIDL). Further, the work function adjusting liner or the first work function adjusting liner may decrease the channel dose. Therefore, the electronic device 900 may realize a high operation speed in correspondence to being scaled-down.

According to the embodiments, since a dipole inducing a high work function is formed at an interface between a gate dielectric layer and a buried gate electrode, the channel dose may be decreased to reduce junction leakage.

Moreover, according to the embodiments, since a low work function material or a dipole capable of lowering a work function is formed between a buried gate electrode and an impurity region, gate induced drain leakage (GIDL) may be decreased.

While the present invention has been described with respect to specific embodiments, it will be apparent to those skilled in the art that various changes and modifications may be made without departing from the spirit and scope of the invention as defined in the following claims.

What is claimed is:
1. A semiconductor device comprising:
a substrate comprising a trench;
a gate dielectric layer formed over a surface of the trench;
a first impurity region and a second impurity region formed in the substrate separated from each other by the trench;
a gate electrode positioned at a level lower than a top surface of the substrate, and including a lower buried portion embedded in a lower portion of the trench over the gate dielectric layer and an upper buried portion positioned over the lower buried portion;

a first dielectric work function adjusting liner positioned between the lower buried portion and the gate dielectric layer;

a second dielectric work function adjusting liner positioned between the upper buried portion and the gate dielectric layer;

a first dipole formed between the first dielectric work function adjusting liner and the gate dielectric layer; and a second dipole formed between the second dielectric work function adjusting liner and the gate dielectric layer, wherein the first dielectric work function adjusting liner is formed over the lower portion of the trench without overlapping with the first and the second impurity region, wherein the first dielectric work function adjusting liner comprises a high oxygen containing-metal oxide which has oxygen content per unit volume greater than the gate dielectric layer.

2. The semiconductor device according to claim 1, wherein the first dipole comprises a dipole in a direction in which a high work function is induced, and wherein the first dielectric work function adjusting liner has oxygen content different from that of the gate dielectric layer thereby forming the first dipole.

3. The semiconductor device according to claim 1, wherein the gate dielectric layer comprises silicon oxide (SiO2), and the first dielectric work function adjusting liner comprises one or more of aluminum oxide (Al2O3), titanium oxide (TiO2), hafnium oxide (HfO2), zirconium oxide (ZrO2) and magnesium oxide (MgO).

4. The semiconductor device according to claim 1, wherein the second dipole comprises a dipole in a direction in which a low work function is induced, and wherein the second dielectric work function adjusting liner has oxygen content different from that of the gate dielectric layer thereby forming the second dipole.

5. The semiconductor device according to claim 1, wherein the second dielectric work function adjusting liner comprises a low oxygen containing-metal oxide which has oxygen content per unit volume lower than that of the gate dielectric layer.

6. The semiconductor device according to claim 1, wherein the gate dielectric layer comprises silicon oxide (SiO2), and wherein the second dielectric work function adjusting liner comprises one or more of yttrium oxide (Y2O3), lanthanum oxide (La2O3), germanium oxide (GeO2), lutetium oxide (Lu2O3) and strontium oxide (SrO).

7. The semiconductor device according to claim 1,

Wherein the first impurity region and a second impurity region is formed in the substrate on both sides of the gate electrode, wherein the first impurity region and the second impurity region have a depth overlapping the second dielectric work function adjusting liner and the upper buried portion.

8. The semiconductor device according to claim 1, further comprising a fin formed in the substrate under the lower buried portion, with the gate dielectric layer interposed therebetween.

9. The semiconductor device according to claim 1, wherein the lower buried portion and the upper buried portion is the same material.

10. The semiconductor device according to claim 1, wherein the lower buried portion and the upper buried portion is formed of titanium nitride.

* * * * *